US012687666B2

(12) United States Patent
Sawayama et al.

(10) Patent No.: US 12,687,666 B2
(45) Date of Patent: Jul. 21, 2026

(54) REFLECTION PLATE, DISPLAY DEVICE, AND METHOD OF PRODUCING REFLECTION PLATE

(71) Applicant: Sharp Display Technology Corporation, Kameyama City (JP)

(72) Inventors: Yutaka Sawayama, Kameyama City (JP); Yoshimasa Chikama, Kameyama City (JP); Masamitsu Yamanaka, Kameyama City (JP); Hideki Kitagawa, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 612 days.

(21) Appl. No.: 18/121,990

(22) Filed: Mar. 15, 2023

(65) Prior Publication Data

US 2023/0305201 A1 Sep. 28, 2023

(30) Foreign Application Priority Data

Mar. 22, 2022 (JP) ................................. 2022-045019
Dec. 28, 2022 (JP) ................................. 2022-211331

(51) Int. Cl.
| *G02B 5/10* | (2006.01) |
| *G02F 1/1335* | (2006.01) |
| *G03F 7/00* | (2006.01) |
| *G02B 5/08* | (2006.01) |

(52) U.S. Cl.
CPC ......... *G02B 5/10* (2013.01); *G02F 1/133553* (2013.01); *G03F 7/0005* (2013.01); *G02B 5/0808* (2013.01); *G02F 2203/02* (2013.01)

(58) Field of Classification Search
CPC ... G02B 5/02; G02B 5/08; G02B 5/10; G02B 5/0808; G02B 5/0236; G02B 5/0278;

G02B 5/0257; G02B 5/0221; G02B 5/0263; G02B 5/0231; G02B 6/0001; G02B 6/0011; G02B 1/111; G02B 1/113; G02B 1/14; G02F 1/1335; G02F 1/133553; G02F 1/133555; G02F 1/133504; G02F 1/133514; G02F 1/133512; G02F 1/133562; G02F 2203/02; G03F 7/0005; G03F 7/00
USPC ....... 359/868, 863, 864, 838, 609, 242, 267, 359/275, 277; 349/67, 113, 114
See application file for complete search history.

(56) References Cited

U.S. PATENT DOCUMENTS

2011/0176096 A1* 7/2011 Naka ................. G02F 1/133555
359/838

FOREIGN PATENT DOCUMENTS

JP 2000-105370 A 4/2000

* cited by examiner

*Primary Examiner* — Jie Lei
(74) *Attorney, Agent, or Firm* — ScienBiziP, P.C.

(57) ABSTRACT

A reflection plate includes a substrate, an insulation film disposed on the substrate and including projection portions and recesses on an uneven surface, and a reflection film disposed on the uneven surface and having a surface that conforms to the uneven surface and reflecting light. The projection portions are arranged at intervals and are inclined with respect to a normal direction of a surface of the substrate. The recesses are between the projection portions that are adjacent to each other. The projection portions include a first projection portion, a second projection portion, and a third projection portion that are inclined in different directions.

14 Claims, 42 Drawing Sheets

10

11PX

12 iii

15 ii

26

18A

27 ii

19CH iii

REFLECTION PLATE, DISPLAY DEVICE, AND METHOD OF PRODUCING REFLECTION PLATE

CROSS REFERENCE TO RELATED APPLICATION

This application claims priority from Japanese Patent Application No. 2022-045019 filed on Mar. 22, 2022 and Japanese Patent Application No. 2022-211331 filed on Dec. 28, 2022. The entire contents of the priority applications are incorporated herein by reference.

TECHNICAL FIELD

The present technology described herein relates to a reflection plate, a display device, and a method of producing a reflection plate.

BACKGROUND

One example of a reflection type display component includes a reflection plate, an opposed substrate that is opposed to the reflection plate, and a liquid crystal layer that is held between the reflection plate and the opposed substrate. The reflection plate includes a photosensitive resin layer and a reflection film that is disposed on a glass substrate. The photosensitive resin layer includes a front surface portion having an uneven surface. The photosensitive resin layer includes protrusions and recesses on the uneven surface and the protrusions and the recesses are formed to be inclined with respect to one predefined direction.

One example of a method of producing a reflection type display component includes a resin layer forming process, an exposing process, an uneven portion forming process, a heat treatment process, and a reflection film forming process. In the resin layer forming process, a photosensitive resin layer is formed on a glass substrate of a reflection plate. In the exposing process, light is irradiated to the photosensitive resin layer obliquely with respect to the surface of the glass substrate via a mask that includes light transmissive portions of a predefined shape. Thus, the photosensitive resin layer is exposed to light. In the uneven portion forming process, by developing the exposed photosensitive resin layer, recessed portions and projection portions that are inclined with respect to one predefined direction and have an asymmetrical cross-sectional shape are formed on the photosensitive resin layer. In the heat treatment process, the photosensitive resin layer is heated to make the corners of the recessed portions and the projection portions to be curved surfaces. In the reflection film forming process, a reflection film having light reflectivity is formed on the photosensitive resin layer.

In the above-described reflection type display component, all the projection portions on the uneven surface of the photosensitive resin layer are inclined uniformly with respect to the one predefined direction. Therefore, the light that reflects off the reflection film travels in the same direction. When an observer observes the image at a specified position with respect to the reflection type display component, the observer can see the image with sufficient brightness. However, when the observer observes the image at a position different from the specified position, the image that the observer sees is extremely dark.

As to the above method of producing a reflection type display component, in the exposing process in which the photosensitive resin layer is exposed to light, ultraviolet rays need to be irradiated in a direction that is inclined by 30 degrees with respect to a normal line to the glass substrate. In another aspect of the above method, in the heat treatment process of heating the photosensitive resin layer, the glass substrate needs to be kept with being tilted. Therefore, a special exposing device and a special substrate support device need to be prepared.

SUMMARY

The technology described herein was made in view of the above circumstances. An object is to achieve dispersion of reflected light rays. Another object is to produce a reflection plate with using a general producing device.

A reflection plate according to one aspect of the technology described herein includes a substrate, an insulation film disposed on the substrate and having an uneven surface, and a reflection film disposed in an upper layer than the insulation film and having a surface that conforms to the uneven surface and reflecting light. The insulation film includes projection portions and recesses on the uneven surface. The recesses are between the projection portions that are adjacent to each other. The projection portions are arranged at intervals and are inclined with respect to a normal direction of a surface of the substrate. The projection portions include a first projection portion, a second projection portion that is adjacent to and away from the first projection portion, and a third projection portion that is adjacent to and away from the first projection portion. The first projection portion, the second projection portion, and the third projection portion are inclined in different directions.

A method of producing a reflection plate according to another aspect of the technology described herein includes forming an insulation film made of positive-type photosensitive resin material on a substrate, exposing the insulation film to light via a photomask, developing the insulation film after the exposing, heating the insulation film after the developing, and after the heating, disposing a reflection film that reflects light on the uneven surface of the insulation film. The photomask includes a light blocking section that blocks light, a peripheral semi-transmitting section that is adjacent to a portion of a periphery of the light blocking section and transmits the light and has light transmittance higher than that of the light blocking section, and a semi-transmitting section that surrounds the light blocking section and the peripheral semi-transmitting section and has light transmittance higher than that of the light blocking section and lower than that of the peripheral semi-transmitting section. In the developing, developing the insulation film such that a portion of the insulation film overlapping the light blocking section is deformed and configured as a pre-projection portion, a portion of the insulation film overlapping the peripheral semi-transmitting section is deformed and configured as a pre-peripheral recessed portion, and a portion of the insulation film overlapping the semi-transmitting section is deformed and configured as a pre-recessed portion that is shallower than the pre-peripheral recessed portion. In the heating, heating the insulation film and deforming the pre-projection portion to be inclined with respect to a normal direction of a surface of the substrate and move a top of the pre-projection portion closer to the pre-peripheral recessed portion and forming a projection portion, a peripheral recessed portion, and a recessed portion from the pre-projection portion, the pre-peripheral recessed portion, and the pre-recessed portion, respectively, and forming an uneven surface on the insulation film.

A method of producing a reflection plate according to another aspect of the technology described herein includes forming an insulation film made of negative-type photosensitive resin material on a substrate, exposing the insulation film to light via a photomask, developing the insulation film after the exposing, heating the insulation film after the developing, after the heating, disposing a reflection film that reflects light on the uneven surface of the insulation film. The photomask includes a transmitting section that transmits light, a peripheral semi-transmitting section that is adjacent to a portion of a periphery of the transmitting section and transmits the light and has light transmittance lower than that of the transmitting section, and a semi-transmitting section that surrounds the transmitting section and the peripheral semi-transmitting section and has light transmittance lower than that of the transmitting section and higher than that of the peripheral semi-transmitting section. In the developing, developing the insulation film such that a portion of the insulation film overlapping the transmitting section is deformed and configured as a pre-projection portion, a portion of the insulation film overlapping the peripheral semi-transmitting section is deformed and configured as a pre-peripheral recessed portion, and a portion of the insulation film overlapping the semi-transmitting section is deformed and configured as a pre-recessed portion that is shallower than the pre-peripheral recessed portion. In the heating, heating the insulation film and deforming the pre-projection portion to be inclined with respect to a normal direction of a surface of the substrate and move a top of the pre-projection portion closer to the pre-peripheral recessed portion and forming a projection portion, a peripheral recessed portion, and a recessed portion from the pre-projection portion, the pre-peripheral recessed portion, and the pre-recessed portion, respectively, and forming an uneven surface on the insulation film.

BRIEF DESCRIPTION OF THE DRAWINGS

FIG. 10 is a cross-sectional view of the first insulation film cut along the same line as that in FIG. 5 and illustrates the first insulation film that is subjected to the heat treatment through the heat treatment step.

FIG. 13 is a cross-sectional view taken along a surface same as that in FIG. 11 and illustrates the first insulation film that is deposited through the depositing step and exposed to light via a gray tone mask in the exposing step.

DETAILED DESCRIPTION

First Embodiment

Figure 1:
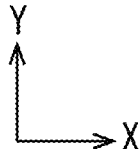
FIG. 1 is a plan view illustrating pixels included in a liquid crystal panel of a liquid crystal display device.

A first embodiment will be described with reference to FIGS. 1 to 10. A reflective type liquid crystal display device 10 (a display device) will be described. X-axes, Y-axes, and Z-axes may be present in the drawings. The axes in each drawing correspond to the respective axes in other drawings.

The reflective type liquid crystal display device 10 according to this embodiment is configured to display an image with using external light such as sun light and light from a room lamp. The liquid crystal display device 10 includes a liquid crystal panel 11 that reflects external light and controls the amount of reflected light rays. In the following, a brief configuration of the liquid crystal panel 11 will be described with reference to FIGS. 1 to 3.

Figure 2:
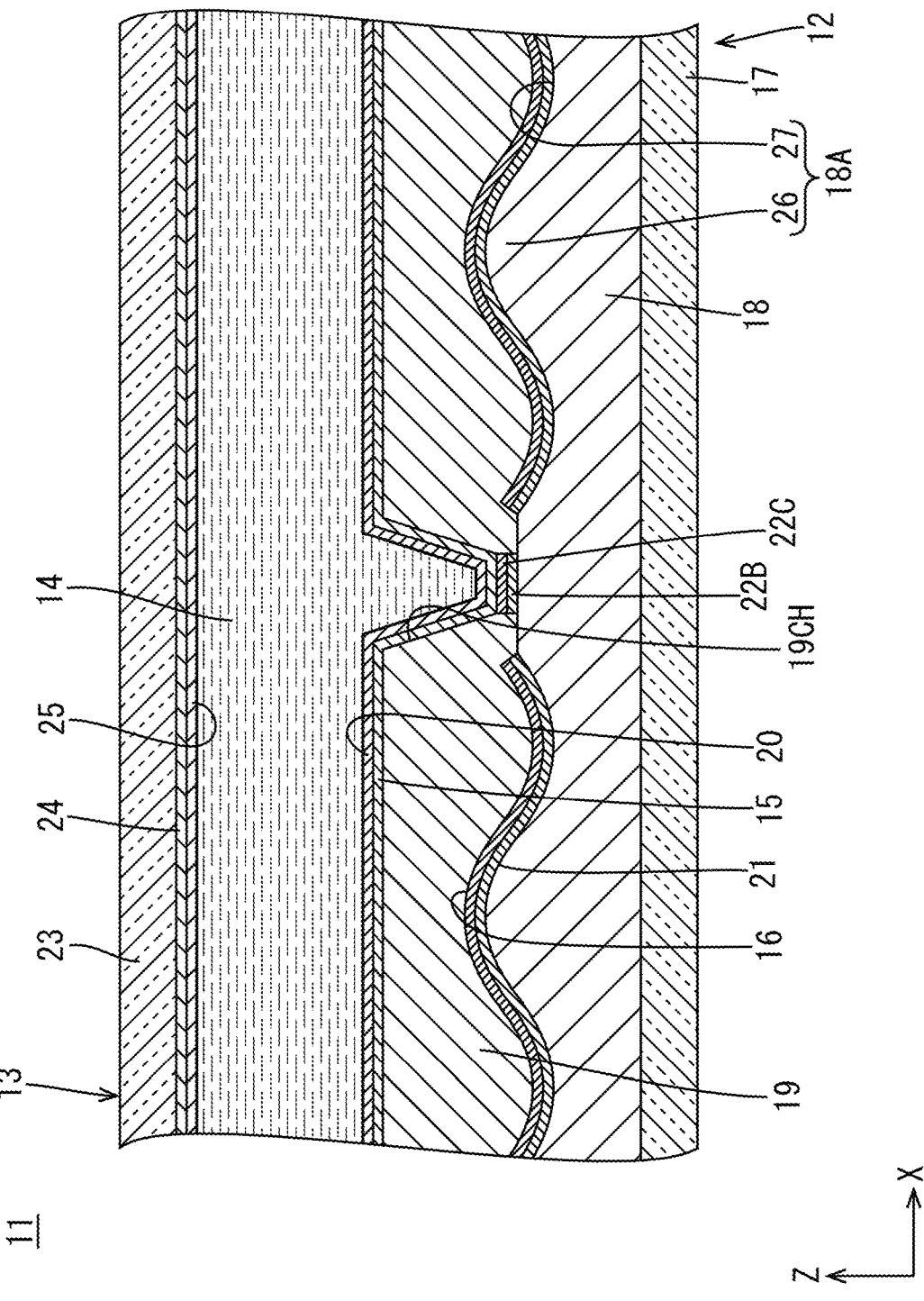
FIG. 2 is a cross-sectional view of the liquid crystal panel along line ii-ii in FIG. 1.
Figure 3:
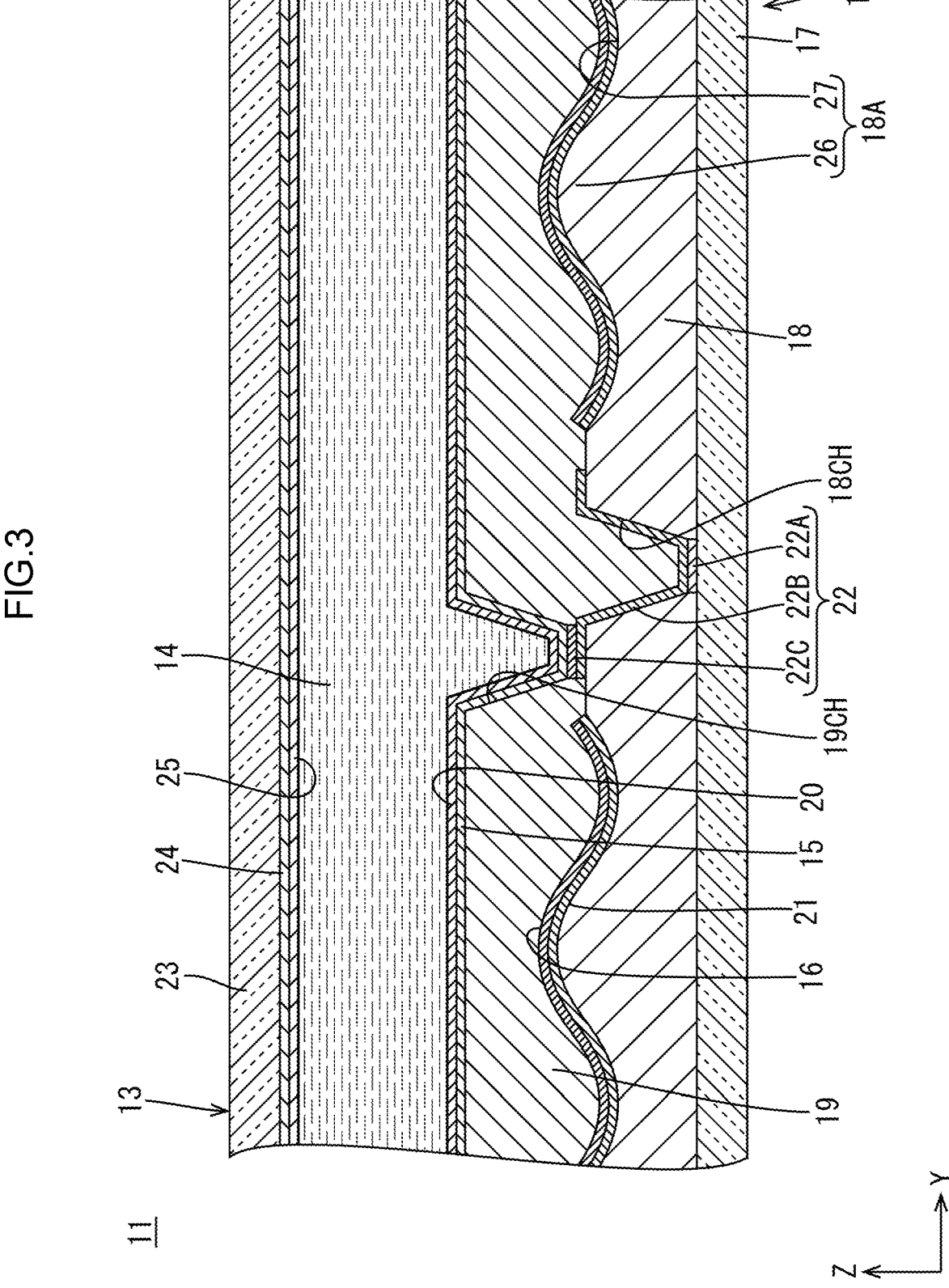
FIG. 3 is a cross-sectional view of the liquid crystal panel along line iii-iii in FIG. 1.

FIG. 1 is a plan view illustrating a pixel 11PX included in the liquid crystal panel 11. FIG. 2 is a cross-sectional view of the liquid crystal panel 11 taken along line ii-ii in FIG. 1. FIG. 3 is a cross-sectional view of the liquid crystal panel 11 taken along line iii-iii in FIG. 1. As illustrated in FIG. 1, the liquid crystal panel 11 includes a pixel 11PX that has a vertically long rectangular plan view shape. The pixels 11PX are arranged at intervals in a matrix within a surface area of the liquid crystal panel 11 along the X-axis direction and the Y-axis direction.

As illustrated in FIGS. 2 and 3, the liquid crystal panel 11 includes an array substrate 12 (a reflection plate), an opposed substrate 13 that is disposed opposite and away from the array substrate 12, and a liquid crystal layer 14 that is held between the array substrate 12 and the opposed substrate 13. The array substrate 12 at least includes pixel electrodes 15 that are included in the pixels 11PX and a reflection film 16 that is disposed on an opposite side from the liquid crystal layer 14 with respect to the pixel electrodes 15. The pixel electrodes 15 are arranged at intervals in a matrix within a surface area of the array substrate 12 along the X-axis direction and the Y-axis direction. The array substrate 12 includes a backplane circuit that drives the pixels 11PX. The backplane circuit at least includes TFTs (thin film transistors, switching components) that are connected to the pixel electrodes 15, gate lines for scanning TFTs, and source lines for supplying image signals to the TFTs. The TFTs are arranged in a matrix within a surface area of the array substrate 12 similar to the pixel electrodes 15. The pixel electrodes 15 are charged at a potential based on the image signals transferred via the source lines as the TFTs are driven by the scanning via the gate lines. The backplane circuit may include a memory circuit (such as a SRAM) that is connected to each of the pixels 11PX.

As illustrated in FIGS. 2 and 3, the array substrate includes a substrate 17, which is made of glass material or resin material, and various films formed in layers on the glass substrate 17. Metal films and semiconductive films that are included in the backplane circuit are formed on the substrate 17. Furthermore, a first insulating film 18 (an insulating film) that covers the backplane circuit from an upper layer side, an electrically conductive film that is disposed in an upper layer than the first insulating film 18, a metal film that is disposed in an upper layer than the electrically conductive film, a second insulating film 19 that is disposed in an upper layer than the metal film, a transparent electrode film that is disposed in an upper layer than the second insulating film 19, and an alignment film 20 that is disposed in an upper layer than the transparent electrode film are disposed on top of each other in this order from a lower layer side.

The first insulating film 18 is made of positive-type photosensitive resin material. The positive-type photosensitive resin material used for the first insulating film 18 improves the dissolution rate with developing solution according to the amount of light exposure. An example of the photosensitive resin material for the first insulating film 18 includes acrylic resin material which is one example of organic resin material (for example, polymethylmethacrylate resin (PMMA)). The first insulating film 18 is thicker than an insulating film that is made of inorganic resin material and is about several μm, for example. As illustrated in FIGS. 2 and 3, the first insulating film 18 has an uneven surface 18A. Therefore, an electrically conductive layer 21 and the reflection film 16 that are disposed in an upper layer than the first insulating film 18 have surfaces that extend along and follow the uneven surface 18A of the first insulating film 18. Namely, the electrically conductive layer 21 and the reflection film 16 include recessed portions and projection portions on the surfaces thereof corresponding to the recessed portions and projection portions on the uneven surface 18A of the first insulating film 18. The first insulating film 18 includes first contact holes 18CH at the positions overlapping middle sections of the pixel electrodes 15. The first contact holes 18CH are arranged in a matrix corresponding to the pixel electrodes 15, respectively, within a surface area of the array substrate 12. The electrically conductive film is made of metal material or transparent electrode film material. A portion of the electrically conductive film is configured as the electrically conductive layer 21 that is disposed in a lower layer than the reflection film 16.

The metal film is made of metal material having good light reflectivity (for example, silver alloy, aluminum, aluminum alloy). A portion of the metal film is configured as the reflection film 16. As illustrated in FIGS. 2 and 3, the reflection film 16 has an uneven surface having projection portions and recessed portions corresponding to the uneven surface 18A of the first insulating film 18. Therefore, light is diffused (scattered) by the uneven surface of the reflection film 16 and this contributes to paper white display. The second insulating film 19 is made of resin material. With using organic resin material for the second insulating film 19, a surface of the second insulating film 19, which is a base for the transparent electrode film, can be preferably planarized. The second insulating film 19 includes second contact holes 19CH at the positions that overlap the middle sections of the pixel electrodes 15, respectively. The second contact holes 19CH are arranged in a matrix corresponding to the pixel electrodes 15, respectively, within the surface area of the array substrate 12. The transparent electrode film is made of a transparent electrode material such as indium tin oxide (ITO) and indium zinc oxide (IZO). Portions of the transparent electrode film are configured as the pixel electrodes 15. The alignment film 20 is made of resin material such as polyimide. The surface of the alignment film 20 is subjected to rubbing or an optical alignment process.

As illustrated in FIGS. 2 and 3, the array substrate 12 includes contact portions 22 that connect the pixel electrodes 15 and the TFTs included in the backplane circuit. The contact portion 22 overlaps the first contact hole 18CH in the first insulating film 18 and the second contact hole 19CH in the second insulating film 19. The contact portion 22 includes a first contact electrode 22A, a second contact electrode 22B, and a third contact electrode 22C. The first contact electrode 22A is disposed in a lower layer than the first insulating film 18 and is disposed to overlap the first contact hole 18C. The first contact electrode 22A is connected to the backplane circuit. The second contact electrode 22B is disposed in an upper layer than the first insulating film 18 and disposed in an area in which the first contact hole 18CH and the second contact hole 19CH overlap. The second contact electrode 22B is connected to the first contact electrode 22A via the first contact hole 18CH. The second contact electrodes 22B are portions of the electrically conductive film a portion of which is configured as the electrically conductive layer 21. The third contact electrode 22C is disposed in an upper layer than the second contact electrode 22B and in a lower layer than the second insulating film 19. The third contact electrode 22C is disposed to overlap the second contact hole 19CH. The third contact electrode 22C is connected to the second contact electrode 22B, which is in the lower layer, and is connected to the pixel electrode 15, which is in the upper layer, via the second contact hole 19CH. The third contact electrodes 22C are portions of the metal film a portion of which is configured as the reflection film 16.

As illustrated in FIG. 1, the opposed substrate 13 includes a substrate 23, which is made of glass material or resin material, and various films formed in layers on the glass substrate 23. With using glass material as the material for the substrate 23, the refractive index of the substrate 23 is about 1.53, for example. In addition to color filters and spacers, an opposed electrode 24 and an alignment film 25 are disposed on the substrate 23. The color filters are disposed to overlap the pixel electrodes 15 and the color filters and the pixel electrodes 15 are configured as the pixels 11PX. The spacers project toward the liquid crystal layer 14 and projecting end surfaces of the spacers are contacted with an inner surface of the array substrate 12. The spacers keep the distance between the substrates 12, 13 or a cell gap, which is a thickness of the liquid crystal layer 14. The opposed electrode 24 is made of the same transparent electrode material as that of the pixel electrodes 15. The opposed electrode 24 is supplied with a common potential. Therefore, an electric field is created between the opposed electrode 24 and the pixel electrode 15 that is charged with the TFT. With the electric field, orientations of the liquid crystal molecules included in the liquid crystal layer 14 can be controlled. With the reflection film 16 being supplied with the common potential to have the same potential as the opposed electrode 24, auxiliary capacitance can be created between the reflection film 16 and the pixel electrode 15. The alignment film 25 is made of resin material such as polyimide similar to the alignment film 20 of the array substrate 12. The surface of the alignment film 25 is subjected to rubbing or an optical alignment process.

The uneven surface 18A of the first insulating film 18 will be described in detail. As illustrated in FIGS. 1 to 3, the first insulating film 18 includes projection portions 26 and recessed portions 27 (recesses). The projection portions 26 are disposed at intervals and the recessed portion 27 is disposed between the adjacent projection portions 26. The uneven surface 18A includes surfaces of the projection portions 26 and the recessed portions 27. Each of the projection portions 26 has a circular plan view shape. The outline of the plan view shape of the projection portion 26 has a diameter of about 6 µm. The projection portions 26 are arranged at random within a surface area of the substrate 17 of the array substrate 12. Specifically, every two projection portions 26 that are adjacent to each other with sandwiching the recessed portion 27 are arranged in various directions with an irregular pattern. The distance between every two adjacent projection portions 26 that sandwich the recessed portion 27 is not constant. The projection portions 26 overlap the pixel electrode 15 in a plan view. Portions of the surface of the substrate 17 including no projection portions 26 and no first contact holes 18CH include the recessed portions 27.

Figure 4:
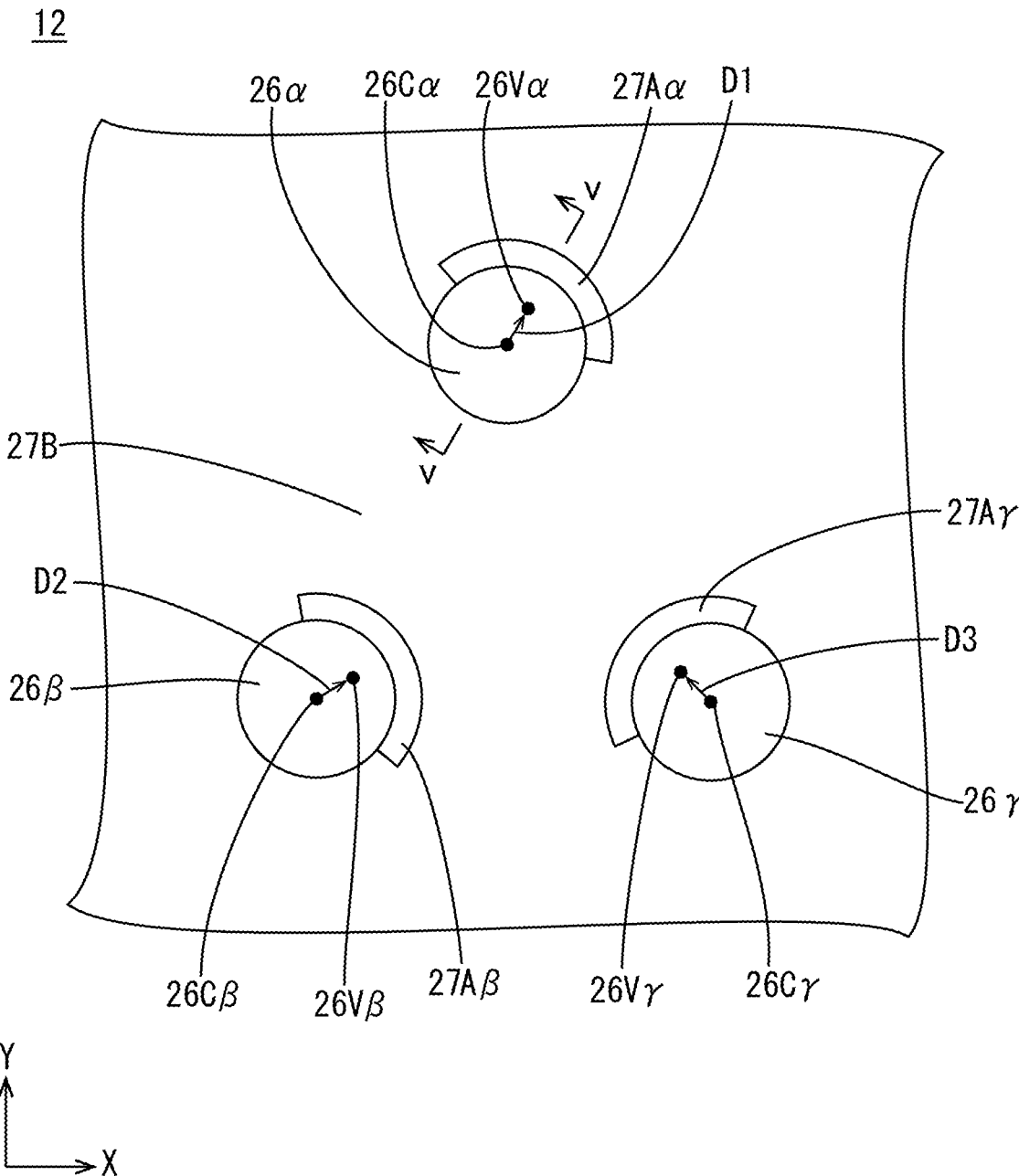
FIG. 4 is a plan view illustrating projection portions according to a first embodiment.
Figure 5:
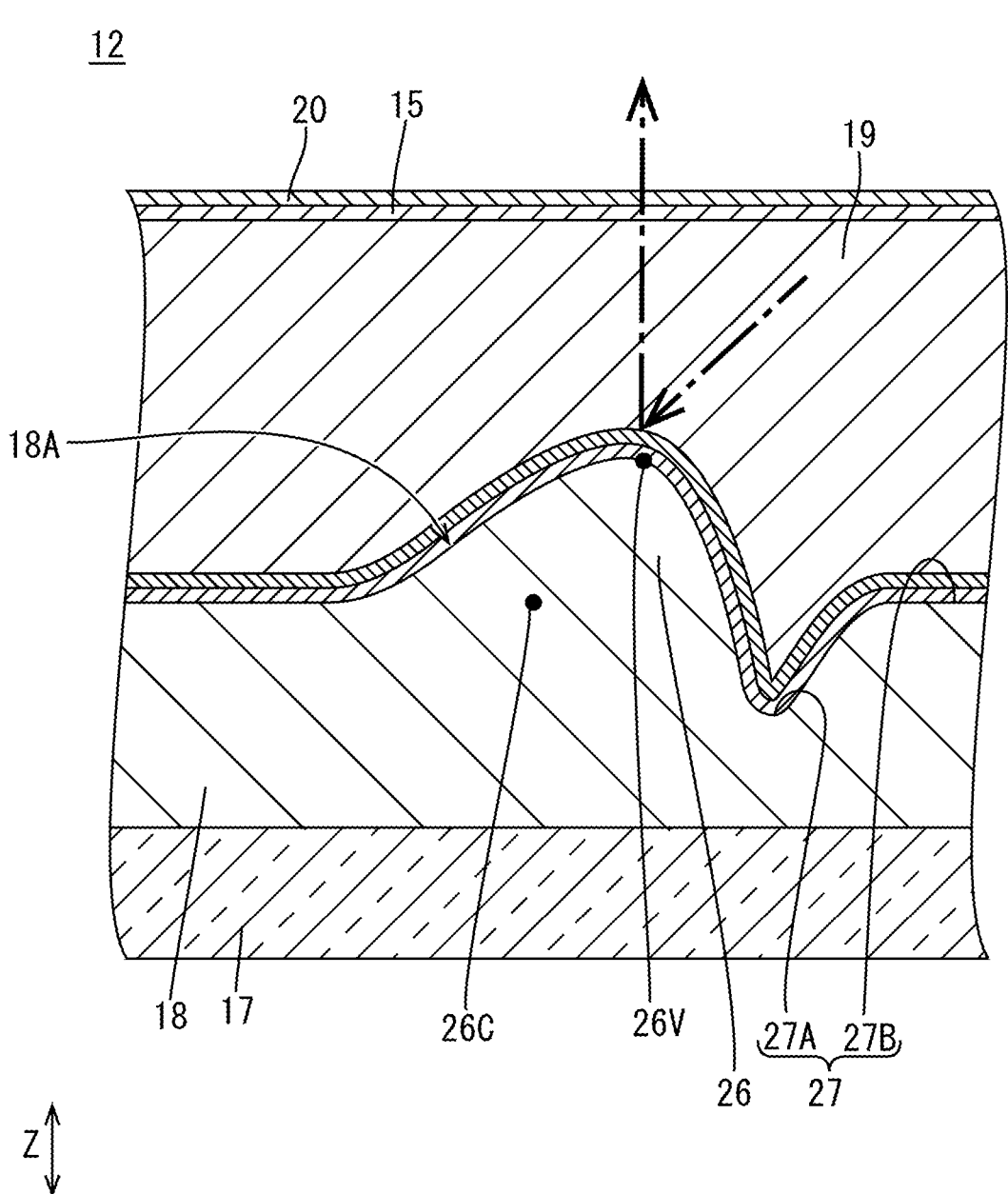
FIG. 5 is a cross-sectional view of an array substrate along line v-v in FIG. 4.

Three projection portions 26 among the projection portions 26 will be described in detail with reference to FIG. 4. FIG. 4 is a plan view illustrating the three projection portions 26. The plan view outline shape of the projection portion 26 is a circular shape in FIG. 4. FIG. 5 is a cross-sectional view of the array substrate 12 taken along v-v line in FIG. 4. As illustrated in FIG. 4, the projection portions 26 at least include a first projection portion 26α, a second projection portion 26β, and a third projection portion 26γ. The second projection portion 26β and the third projection portion 26γ are adjacent to and spaced from the first projection portion 26α. In the following description, to specify each of the configurations of the first to third projections, "α", "β", and "γ" are added to the reference signs of the configurations of the first projection portion, the second projection portion, and the third projection portion, respectively. No additional symbol is added to the reference signs when generally describing the projection portions 26.

As illustrated in FIGS. 4 and 5, the projection portions 26 are inclined with respect to the Z-axis direction that is a normal direction of the surface of the substrate 17. The projection portion 26 has a center of gravity 26C with respect to the plan view outline thereof and a top 26V that is a projecting end portion (a highest portion). The center of gravity 26C and the top 26V are not at the same position with respect to the Z-axis direction. The center of gravity is a position corresponding to an arithmetic mean that is obtained from all the points included in the plan view outline of the projection portion 26. The center of gravity is a geometrical center. Therefore, the projection portion 26 is configured such that a line connecting the center of gravity 26C and the top 26V is inclined with respect to the normal direction of the surface of the substrate 17. In this embodiment, since the plan view outline of the projection portion 26 is a circle, the center of gravity 26C coincides with the center of the plan view outline of the projection portion 26. An angle between the line connecting the center of gravity 26C and the top 26V of the projection portion 26 and the normal direction of the surface of the substrate 17 (an inclination angle of the projection portion 26) is smaller than about 20 degrees, for example. A cross-sectional shape of the projection portion 26 taken along a surface including the center of gravity 26C and the top 26V and extending along the Z-axis direction is asymmetrical. The projection portion 26 has a round mountain shape that narrows from a basal portion toward the top 26V. An outline of the cross section of the projection portion 26 mostly includes curved lines. In FIGS. 1 to 3, illustration of the projection portions 26 and the recessed portions 27 is simplified and the center of gravity 26C and the top 26V are not illustrated.

With the projection portions 26 being inclined with respect to the normal direction of the surface of the substrate 17, the light that reflects off the portions of the reflection film 16 that overlap the projection portions 26 travels in a direction that is different from a regular reflection direction. Accordingly, the reflected light that is reflected by the reflection film 16 travels in a first traveling direction. The reflected light that is regularly reflected by the interface between the substrate 23 of the opposed substrate 13 and the polarizing plate travels in a second traveling direction. Namely, the light related to the reflection travels in the second traveling direction. Because the first traveling direction differs from the second traveling direction, the observer can see the image easily. Furthermore, by adjusting the inclination of the projection portions 26, that is, by adjusting the position of the top 26V with respect to the center of gravity 26 in a plan view or the height of the projection portions 26, the light can be reflected by the reflection film 16 at the angle such that the reflected light can travel in a direction close to the normal direction of the surface of the substrate 17 as illustrated by an arrow in FIG. 5. With the reflected light traveling as described above, a great amount of light rays can be supplied to the observer when the liquid crystal display device 10 is installed in the display portion of a signage or smart lighting that are used outside. Accordingly, the observer can see a bright image. Specifically, most of external light rays tend to enter the display portion of the signage or the smart lighting, which are used outside, at an angle of incident of about 80 degrees. The light rays entering the display portion at the angle of incident of 80 degrees enters the substrate 23 of the opposed substrate 13 and are refracted. The light rays refracted by the substrate 23 enter the reflection film 16 at an angle of incident of about 40 degrees. With setting the inclination angle of the projection portions 26 to 20 degrees or smaller, the light rays entering the reflection film 16 at the angle of incident of 40 degrees travel in the traveling direction close to the normal direction of the surface of the substrate 17. However, if the inclination angle of the projection portions 26 is too large, the light may be irregularly reflected by the interfaces of the color filters included in the opposed substrate 13 and stray light may easily be created. This may deteriorate contrast properties. With setting the inclination angle of the projection portions 26 to 17.5 degrees or smaller, the stray light is less likely to be created and good contrast properties can be obtained.

Figure 6:
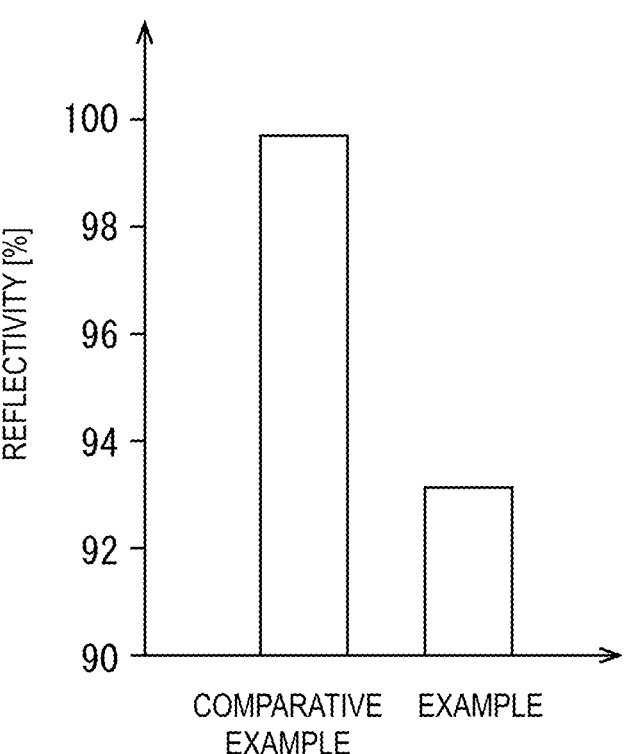
FIG. 6 illustrates graphs representing reflectivity of reflected light that reflects off a reflection film and travels in a regular reflecting direction.

Comparative Experiment is performed to verify how the configuration of the projection portions 26 influences the reflected light that is reflected by the reflection film 16. In Comparative Experiment, the liquid crystal panel 11 including the projection portions 26 configured as described in the previous paragraphs is used in Example and a liquid crystal panel including projection portions configured such that the center of gravity coincides with the top is used in Comparative Example. The liquid crystal panel according to Comparative Example has a configuration similar to that of the liquid crystal panel 11 of Example except for the configuration of the projection portions. The liquid crystal panel 11 of Example and the liquid crystal panel of Comparative Example are irradiated with external light and the amount of reflected light rays that travel in the regular reflecting direction is measured. Experimental results are illustrated in FIG. 6. FIG. 6 illustrates graphs representing reflectivity of the reflected light that reflects off the reflection film 16 and travels in the regular reflecting direction. The vertical axis in FIG. 6 represents the reflectivity (the unit is %). The reflectivity in FIG. 6 is a ratio of the amount of the reflected light rays that reflect off the reflection film 16 and travel in the regular reflecting direction to the amount of the light rays that enter the reflection film 16 (100%). According to the experimental result in FIG. 6, the reflectivity of the reflected light rays traveling in the regular reflecting direction is lower in the liquid crystal panel 11 of Example than that in the liquid crystal panel of Comparative Example because of the following reasons. With the projection portions 26 being inclined with respect to the normal direction of the surface of the substrate 17, the light rays are less likely to be reflected by the reflection film 16 in the regular reflecting direction.

As illustrated in FIG. 4, the first projection portion 26α, the second projection portion 26β, and the third projection portion 26γ are inclined in different directions. Specifically, the first projection portion 26α is inclined such that a first top 26Vα is positioned at an upper right side with respect to a first center of gravity 26Cα in FIG. 4. The second projection portion 26β is inclined such that a second top 26Vβ is positioned at a right side with respect to a second center of gravity 26Cβ in FIG. 4. The third projection portion 26γ is inclined such that a third top 26Vγ is positioned at an upper left side with respect to a third center of gravity 26Cγ in FIG. 4. The traveling direction in which the reflected light rays that are reflected by the reflection film 16 varies according to the direction in which the projection portions 26 are inclined. In this embodiment, the inclination of the projection portions 26, that is, the position of the top 26V with respect to the center of gravity 26 in a plan view or the height of the projection portions 26 is adjusted such that the light rays can be reflected by the reflection film 16 and travel in a direction close to the normal direction of the surface of the substrate 17. Therefore, the light rays that are reflected by the portion of the reflection film 16 overlapping the first projection portion 26α, the portion of the reflection film 16 overlapping the second projection portion 26β, and the portion of the reflection film 16 overlapping the third projection portion 26γ travel in the directions that are close to the normal direction of the surface of the substrate 17 but different from each other according to the inclinations of the first projection portion 26α, the second projection portion 26β, and the third projection portion 26γ. According to such a configuration, the traveling direction in which the reflected light rays that are reflected by the reflection film 16 and travel can be varied and the reflected light rays that are reflected by the reflection film 16 are less likely to travel in the same direction. The projection portions 26 illustrated in FIG. 1 include the first projection portion 26α, the second projection portion 26β, and the third projection portion 26γ illustrated in FIG. 4. The projection portions 26 that are adjacent to each other at intervals are inclined in different directions. Namely, all the projection portions 26 that are adjacent to each other at intervals are inclined in different directions at random within the surface area of the array substrate 12.

More in detail, as illustrated in FIG. 4, in the first projection portion 26α, the line connecting the first center of gravity 26Cα of the outline in the plan view and the first top 26Vα extends in a first direction D1. In the second projection portion 26β, the line connecting the second center of gravity 26Cβ and the second top 26Vβ extends in a second direction D2 in FIG. 4. In the third projection portion 26γ, the line connecting the third center of gravity 26Cγ and the third top 26Vγ extends in a third direction D3 in FIG. 4. The first projection portion 26α, the second projection portion 26β, and the third projection portion 26γ are configured such that the first top 26Vα, the second top 26Vβ, and the third top 26Vγ are positioned on different sides with respect to the respective centers of gravity 26C. Namely, the first projection portion 26α, the second projection portion 26β, and the third projection portion 26γ are arranged such that the first direction D1, in which the line connecting the first center of gravity 26Cα and the first top 26Vα extends, the second direction D2, in which the line connecting the second center of gravity 26Cβ and the second top 26Vβ extends, and the third direction D3, in which the line connecting the third center of gravity 26Cγ and the third top 26Vγ extends, cross each other. According to such a configuration, the traveling direction in which the reflected light rays reflecting off the reflection film 16 travel can be effectively varied.

Next, the recessed portions 27 will be described. As illustrated in FIGS. 4 and 5, the recessed portion 27 (recess) includes a first recessed portion 27A (a peripheral recessed portion) and a second recessed portion 27B (a recessed portion). The first recessed portion 27A is adjacent to a portion of the plan view outline (outer periphery) of the projection portion 26. The second recessed portion 27B extends around the projection portion 26 and the first recessed portion 27A. The first recessed portion 27A is adjacent to a portion of the basal portion of the projection portion 26, which is a portion of the plan view outline of the projection portion 26. The first recessed portion 27A extends along the portion of the plan view outline of the projection portion 26 and has an arched plan view shape having a predefined width. The first recessed portion 27A extends along a circumferential direction of the projection portion 26 and in an area of a half of the outer periphery of the projection portion 26 or smaller. The first recessed portion 27A is disposed at a portion of the periphery of the projection portion 26 closer to the top 26V than the center of gravity 26C of the projection portion 26. The line connecting the center of gravity 26C and the top 26V of the projection portion 26 extends to cross a middle position of the first recessed portion 27A with respect to the circumferential direction of the projection portion 26. Namely, the first recessed portion 27A extends in an area along the outer periphery of the projection portion 26 formed at an angle of 180 degrees or smaller about the top 26V. The first recessed portions 27A are deeper than the second recessed portions 27B. The depth of the first recessed portions 27A is about 3 μm. A bottom of the first recessed portion 27A is lower than a bottom of the second recessed portion 27B. A level difference between the bottoms of the first recessed portion 27A and the second recessed portion 27B is about 2 μm. The second recessed portions 27B are provided on portions of the surface of the substrate 17 where the projection portions 26, the first contact holes 18CH, and the first recessed portions 27A are not provided. The second recessed portions 27B are shallower than the first recessed portions 27A. The depth of the second recessed portions 27B is about 1 μm. The bottom of the second recessed portion 27B is higher than the bottom of the first recessed portion 27A.

The three first recessed portions 27A that are adjacent to the first projection portion 26α, the second projection portion 26β, and the third projection portion 26γ, respectively, will be described with reference to FIG. 4. As illustrated in FIG. 4, the three first recessed portions 27A (the peripheral recessed portion) include a third recessed portion 27Aα (a first peripheral recessed portion), a fourth recessed portion 27Aβ (a second peripheral recessed portion), and a fifth recessed portion 27Aγ (a third peripheral recessed portion). The third recessed portion 27Aα is adjacent to a portion of the plan view outline of the first projection portion 26α. The fourth recessed portion 27Aβ is adjacent to a portion of the plan view outline of the second projection portion 26β. The fifth recessed portion 27Aγ is adjacent to a portion of the plan view outline of the third projection portion 26γ. The third recessed portion 27Aα is disposed locally at a portion of the periphery of the first projection portion 26α closer to the first top 26Vα than the first center of gravity 26Cα of the first projection portion 26α. The third recessed portion 27Aα is disposed on an upper right portion of the periphery of the first projection portion 26α in FIG. 4. The fourth recessed portion 27Aβ is disposed locally at a portion of the periphery of the second projection portion 26β closer to the second top 26Vβ than the second center of gravity 26Cβ of the second projection portion 26β. The fourth recessed portion 27Aβ is disposed on a right portion of the periphery of the second projection portion 26β in FIG. 4. The fifth recessed portion 27Aγ is disposed locally at a portion of the periphery of the third projection portion 26γ closer to the third top 26Vγ than the third center of gravity 26Cγ of the third projection portion 26γ. The fifth recessed portion 27Aγ is disposed on an upper left portion of the periphery of the third projection portion 26γ in FIG. 4. The third recessed portion 27Aα, the fourth recessed portion 27Aβ, and the fifth recessed portion 27Aγ are disposed on different sides with respect to the first center of gravity 26Cα of the first projection portion 26α, the second center of gravity 26Cβ of the second projection portion 26β, and the third center of gravity 26Cγ of the third projection portion 26γ, respectively.

The present embodiment has the above-described configuration. Next, a method of producing the array substrate 12 will be described. The method of producing the array substrate 12 according to this embodiment includes a first step of forming a backplane circuit on the substrate 17, a second step of depositing the first insulation film 18 with patterning, a third step of depositing an electrically conductive film with patterning, a fourth step of depositing a metal film with patterning, a fifth step of depositing the second insulation film 19 with patterning, a sixth step of depositing the transparent electrode film with patterning, and a seventh step of depositing the alignment film 20 to perform an alignment process. By performing the first step, the backplane circuit and the first contact electrodes 22A are formed. By performing the second step, the uneven surface 18A is formed on the surface of the first insulation film 18 and the first contact holes 18CH are formed in the first insulation film 18. By performing the third step, the electrically conductive layer 21 and the second contact electrodes 22B are formed. By performing the fourth step, the reflection film 16 and the third contact electrodes 22C are formed. By performing the fifth step, the second contact holes 19CH are formed in the second insulation film 19. By performing the sixth step, the pixel electrodes 15 are formed. By performing the seventh step, the alignment film 20 that is subjected to the alignment is formed. In the following, the second step will be described with reference to FIGS. 7 to 10.

Figure 7:
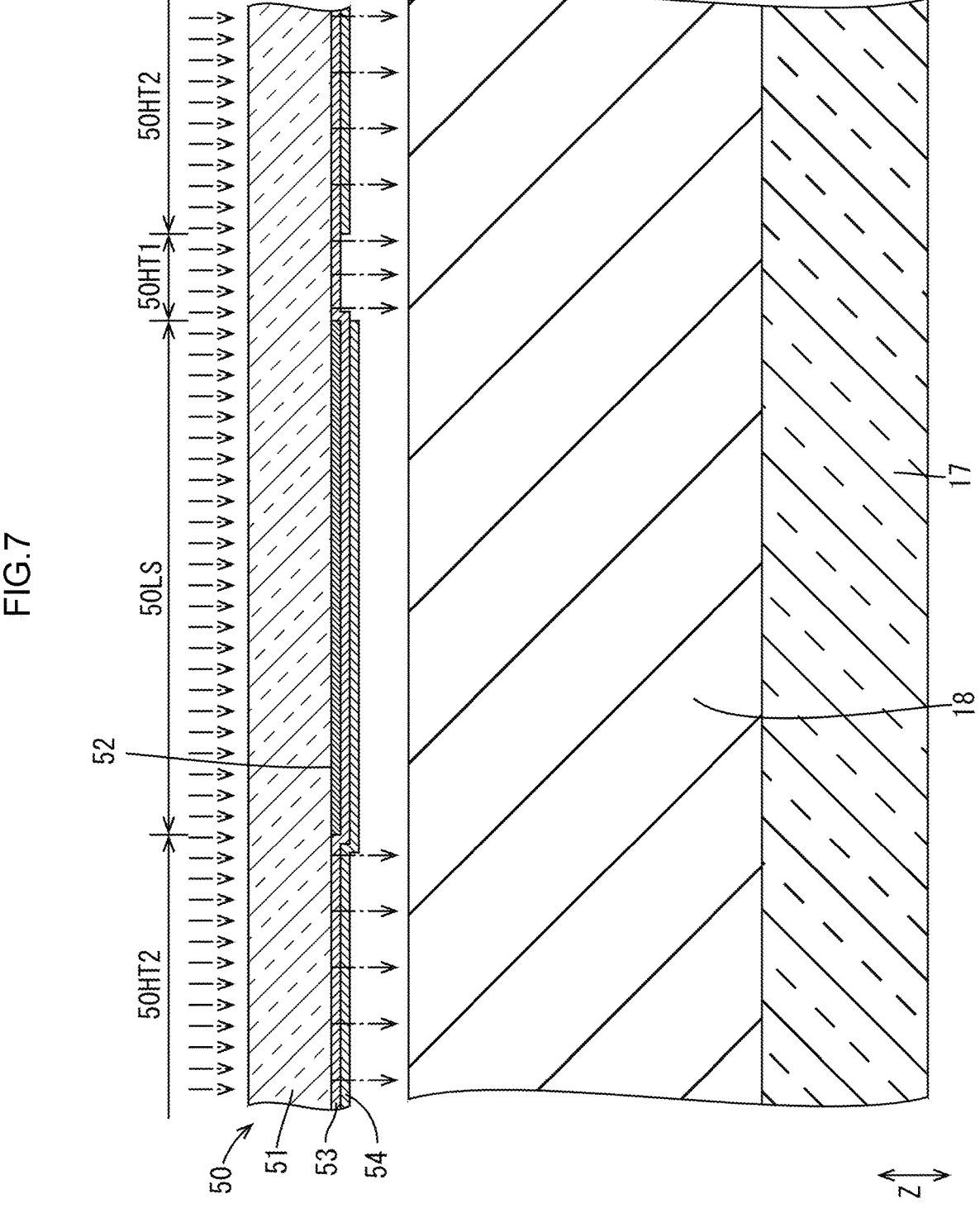
FIG. 7 is a cross-sectional view of a first insulation film cut along the same line as that in FIG. 5 and illustrates the first insulation film that is exposed to light via a first photomask in the exposing step.
Figure 8:
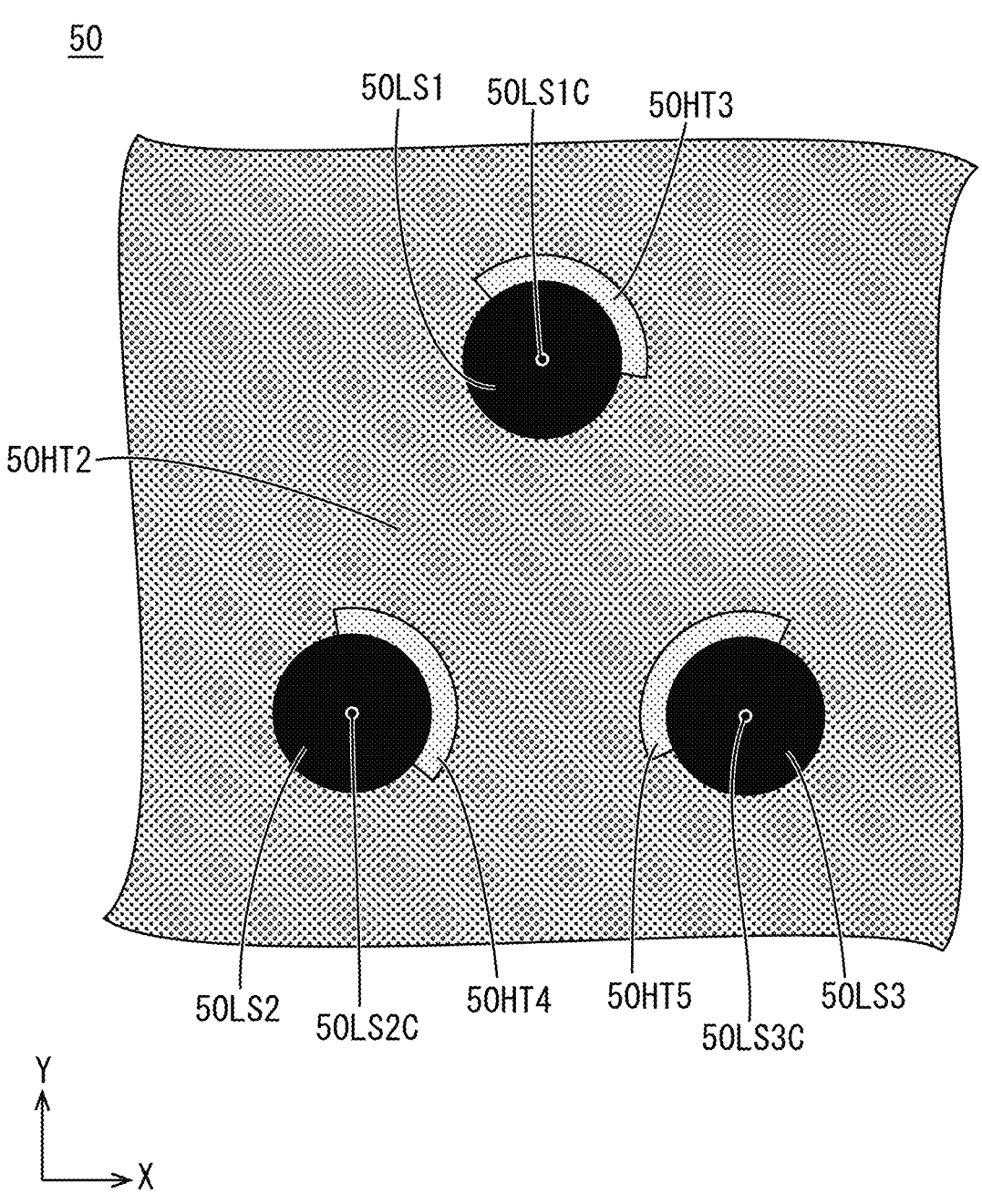
FIG. 8 is a plan view of the first photomask that is used in the exposing step.
Figure 9:
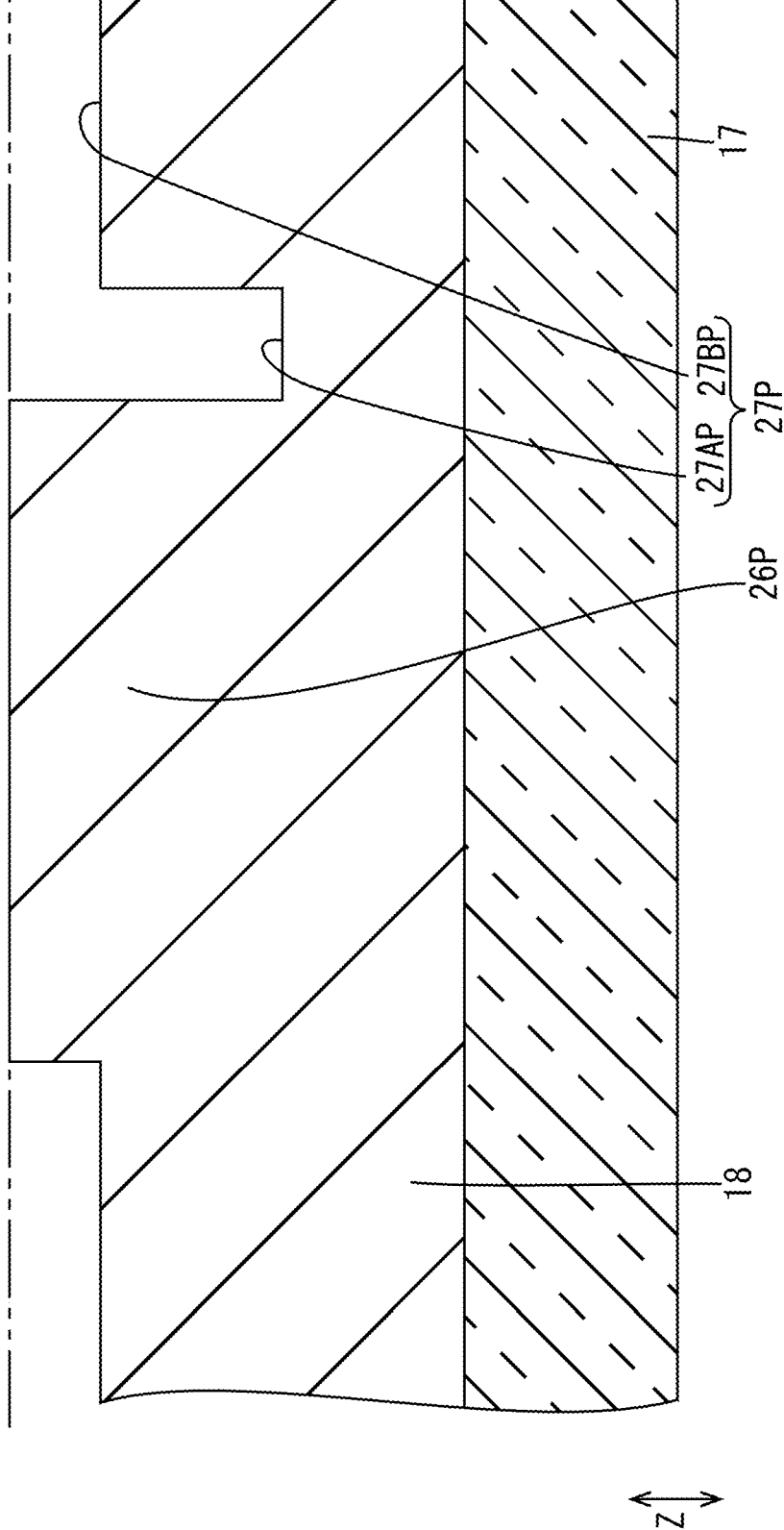
FIG. 9 is a cross-sectional view of the first insulation film cut along the same line as that in FIG. 5 and illustrates the first insulation film that is developed through the developing step.
Figure 10:
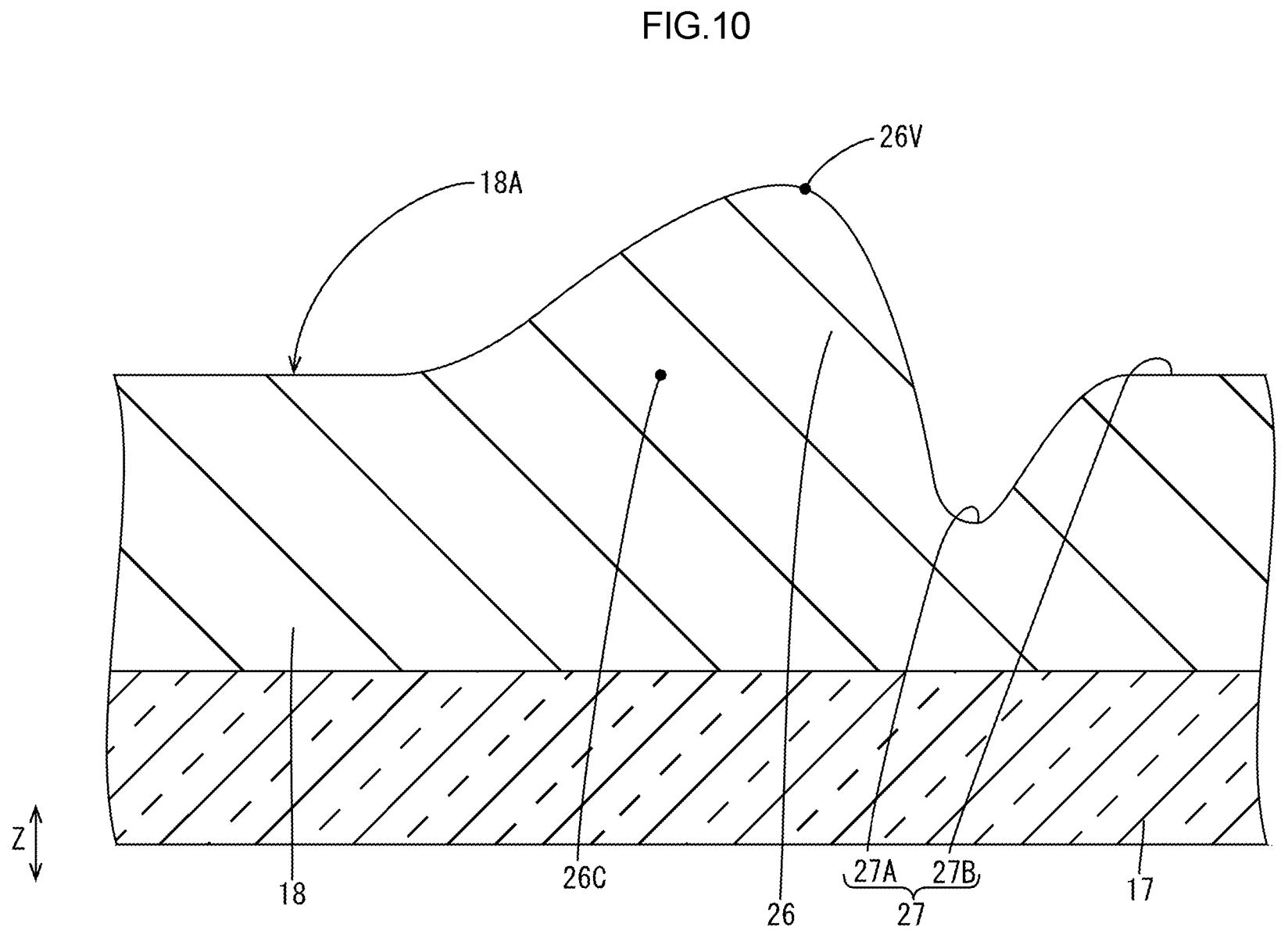

The second step includes a depositing step of depositing the first insulation film 18 on the substrate 17, an exposing step of exposing the first insulation film 18 to light, a developing step of developing the first insulation film 18 that is exposed to light through the exposing step, and a heat treatment step of performing heat treatment to the first insulation film 18 that is developed through the developing step. FIG. 7 illustrates the first insulation film 18 that is formed through the depositing step and is exposed to light via a first photomask 50 in the exposing step. FIG. 7 is a cross-sectional view of the first insulation film 18 cut along the same line as that in FIG. 5. FIG. 8 is a plan view of the first photomask 50 that is used in the exposing step. FIG. 9 illustrates the first insulation film 18 that is developed through the developing step and is a cross-sectional view of the first insulation film 18 cut along the same line as that in FIG. 5. FIG. 10 illustrates the first insulation film 18 that is subjected to the heat treatment through the heat treatment step and is a cross-sectional view of the first insulation film 18 cut along the same line as that in FIG. 5.

In the depositing step, the first insulation film 18 that is made of positive-type photosensitive resin material is formed on the substrate 17 to cover the backplane circuit. In the exposing step, the first insulation film 18 formed on the substrate 17 is exposed to light with using an exposing device and the first photomask 50. The first photomask 50 will be described. The first photomask 50 is a halftone mask. As illustrated in FIG. 7, the first photomask 50 includes a base 51, a light blocking film 52, a first semi-transmitting film 53, and a second semi-transmitting film 54. The base 51 is transparent and has highly light transmitting properties. The light blocking film 52 is formed on a surface of the base 51. The first semi-transmitting film 53 is formed on the surface of the base 51 and a portion of the first semi-transmitting film 53 is disposed on the light blocking film 52. The second semi-transmitting film 54 is disposed on the first semi-transmitting film 53. The light blocking film 52 blocks exposure light that is emitted by a light source of the exposing device and the light transmittance with respect to the exposure light is almost 0%. The first semi-transmitting film 53 and the second semi-transmitting film 54 transmit the exposure light, which is emitted by the light source of the exposing device, at certain light transmittance. The light transmittance of the first semi-transmitting film 53 and the second semi-transmitting film 54 with respect to the exposure light is higher than the light transmittance of the light blocking film 52 with respect to the exposure light and is about 10% to 70%. The exposure light that is supplied to the first insulation film 18 is described with downwards arrows in FIG. 7.

The light blocking film 52, the first semi-transmitting film 53, and the second semi-transmitting film 54 are disposed with a predefined distribution pattern within the surface area of the base 51. The light blocking film 52 is selectively disposed to overlap portions of the first insulation film 18 where the projection portions 26 are to be formed and are not disposed on portions of the base 51 that overlap the portions of the first insulation film 18 where the recessed portions 27 and the first contact holes 18CH are to be formed. The light blocking film 52 has a circular plan view shape and the light blocking films 52 are disposed at intervals and at random within the surface area of the base 51. The first semi-transmitting films 53 are selectively disposed on portions of the base 51 that overlap portions of the first insulation film 18 where the projection portions 26 and the recessed portions 27 are to be formed and are not disposed on portions of the base 51 that overlap portions of the first insulation film 18 where the first contact holes 18CH are to be formed. The second semi-transmitting films 54 are selectively disposed on portions of the base 51 that overlap portions of the first insulation film 18 where the projection portions 26 and the second recessed portions 27B are to be formed and are not disposed on portions of the base 51 that overlap portions of the first insulation film 18 where the first recessed portions 27A and the first contact holes 18CH are to be formed.

According to the patterns of the light blocking film 52, the first semi-transmitting film 53, and the second semi-transmitting film 54, the first photomask 50 includes light blocking sections 50LS that blocks the exposure light, transmitting sections that transmit the exposure light, first semi-transmitting sections 50HT1 (peripheral semi-transmitting sections) that transmit some of the exposure light rays, and second semi-transmitting sections 50HT2 (semi-transmitting sections) that transmit some of the exposure light rays at transmittance lower than that of the first semi-transmitting sections 50HT1. An area of the light blocking section 50LS corresponds to an area of the light blocking film 52. Areas of the transmitting sections correspond to areas of the portions of the base 51 where the light blocking films 52, the first semi-transmitting films 53, and the second semi-transmitting films 54 are not formed. The transmitting sections overlap the portions of the first insulating film 18 where the first contact holes 18CH are to be formed. The first semi-transmitting sections 50HT1 are adjacent to portions of outer peripheries of the light blocking sections 50LS, respectively. An area of the first semi-transmitting section 50HT1 corresponds to an area of the portion of the base 51 where the light blocking film 52 and the second semi-transmitting film 54 are not formed and the first semi-transmitting film 53 is formed. An area of the second semi-transmitting section 50HT2 corresponds to an area of the portion of the base 51 where the light blocking film 52 is not formed and the first semi-transmitting film 53 and the second semi-transmitting film 54 are formed.

The light blocking sections 50LS and the first semi-transmitting sections 50HT1 of the first photomask 50 will be described in detail with reference to FIG. 8. FIG. 8 is a plan view illustrating a portion of the first photomask 50 corresponding to the portion of the array substrate 12 illustrated in FIG. 4. The light blocking section 50LS, the first semi-transmitting section 50HT1 (50HT3, 50HT4, 50HT5), and the second semi-transmitting section 50HT2 are illustrated with different types of shading in FIG. 8.

As illustrated in FIG. 8, the light blocking sections 50LS include a first light blocking section 50LS1, a second light blocking section 50LS2 that is disposed away from the first light blocking section 50LS1, and a third light blocking section 50LS3 that is disposed away from the first light blocking section 50LS1. The first light blocking section 50LS1 is disposed to overlap the portion of the first insulation film 18 where the first projection portion 26α is to be formed. The second light blocking section 50LS2 is disposed to overlap the portion of the first insulation film 18 where the second projection portion 26β is to be formed. The third light blocking section 50LS3 is disposed to overlap the portion of the first insulation film 18 where the third projection portion 26γ is to be formed.

The first semi-transmitting sections 50HT1 include a fifth semi-transmitting section 50HT3 (a first peripheral semi-transmitting section), a sixth semi-transmitting section 50HT4 (a second peripheral semi-transmitting section), and a seventh semi-transmitting section 50HT5 (a third peripheral semi-transmitting section). The fifth semi-transmitting section 50HT3 is adjacent to a portion of a periphery of the first light blocking section 50LS1. The sixth semi-transmitting section 50HT4 is adjacent to a portion of a periphery of the second light blocking section 50LS2. The seventh semi-transmitting section 50HT5 is adjacent to a portion of a periphery of the third light blocking section 50LS3. The fifth semi-transmitting section 50HT3 (the first peripheral semi-transmitting section) is disposed to overlap the portion of the first insulation film 18 where the third recessed portion 27Aα(the first peripheral recessed portion) is to be formed. The sixth semi-transmitting section 50HT4 (the second peripheral semi-transmitting section) is disposed to overlap the portion of the first insulation film 18 where the fourth recessed portion 27Aβ (the second peripheral recessed portion) is to be formed. The seventh semi-transmitting section 50HT5 (the third peripheral semi-transmitting section) is disposed to overlap the portion of the first insulation film 18 where the fifth recessed portion 27Aγ (the third peripheral recessed portion) is to be formed.

The direction in which the line extends from the center of gravity 50LS1C toward a middle position of the fifth semi-transmitting section 50HT3 with respect to the circumferential direction, the direction in which the line extends from the center of gravity 50LS2C toward a middle position of the sixth semi-transmitting section 50HT4 with respect to the circumferential direction, and the direction in which the line extends from the center of gravity 50LS3C toward a middle position of the seventh semi-transmitting section 50HT5 with respect to the circumferential direction cross each other.

In the exposing step, as illustrated in FIG. 7, the exposure light emitted by the light source of the exposing device is supplied to the first insulation film 18 through the first photomask 50 having the above configuration. Accordingly, the first insulation film 18 is selectively exposed to light. Specifically, the portions of the first insulation film 18 that overlap the light blocking sections 50LS of the first photomask 50 are not exposed to light. The portions of the first insulation film 18 that overlap the first semi-transmitting sections 50HT1 are exposed to light with the exposure light amount smaller than that of the exposure light supplied to the portions of the first insulation film 18 overlapping the transmitting sections but greater than that of the exposure light supplied to the portions of the first insulation film 18 overlapping the second semi-transmitting sections 50HT2. The portions of the first insulation film 18 overlapping the second semi-transmitting sections 50HT2 are exposed to light with the exposure light amount greater than that of the exposure light supplied to the portions of the first insulation film 18 overlapping the light blocking sections 50LS but smaller than that of the exposure light supplied to the portions of the first insulation film 18 overlapping the first semi-transmitting sections 50HT1. The portions of the first insulation film 18 overlapping the transmitting sections of the first photomask 50 are exposed to light through an entire depth.

In the developing step, the first insulation film 18 that is selectively exposed to light in the exposing step is developed with developing solution. As illustrated in FIG. 9, the portions of the first insulation film 18 are removed with a greater depth as the amount of exposure light increases. The portions of the first insulation film 18 that are not exposed to light are not removed and remain. Specifically, the portions of the first insulation film 18 overlapping the light blocking sections 50LS of the first photomask 50 remain with the entire thickness and are configured as pre-projection portions 26P that are to be the projection portions 26.

Upper portions of the portions of the first insulation film 18 overlapping the first semi-transmitting sections 50HT1 and the second semi-transmitting sections 50HT2 are removed and lower portions thereof remain. The upper portions of the portions of the first insulation film 18 overlapping the first semi-transmitting sections 50HT1 are removed with a greater depth than those of the portions of the first insulation film 18 overlapping the second semi-transmitting sections 50HT2. Accordingly, pre-first recessed portions 27AP (pre-peripheral recessed portions) that are to be the first recessed portions 27A (peripheral recessed portions) are formed.

The upper portions of the portions of the first insulation film 18 overlapping the second semi-transmitting sections 50HT2 are removed with a smaller depth than those of the portions of the first insulation film 18 overlapping the first semi-transmitting sections 50HT1. Accordingly, pre-second recessed portions 27BP (pre-recessed portion) that are to be the second recessed portions 27B (recessed portions) are formed. As illustrated in FIG. 9, the pre-first recessed portions 27AP are deeper than the pre-second recessed portions 27BP. The portions of the first insulation film 18 overlapping the transmitting sections of the first photomask 50 are removed with the entire thickness and the first contact holes 18CH are formed (refer to FIG. 3).

More in detail, the portion of the first insulation film 18 overlapping the first light blocking section 50LS1 is to be configured as a pre-first projection portion, which is to be the first projection portion 26α (refer to FIGS. 4 and 8). The portion of the first insulation film 18 overlapping the second light blocking section 50LS2 is to be configured as a pre-second projection portion, which is to be the second projection portion 26β. The portion of the first insulation film 18 overlapping the third light blocking section 50LS3 is to be configured as a pre-third projection portion, which is to be the third projection portion 26γ.

The portion of the first insulation film 18 overlapping the fifth semi-transmitting section 50HT3 is to be configured as a pre-third recessed portion (a pre-first peripheral recessed portion), which is to be the third recessed portion 27Aα. The portion of the first insulation film 18 overlapping the sixth semi-transmitting section 50HT4 is to be configured as a pre-fourth recessed portion (a pre-second peripheral recessed portion), which is to be the fourth recessed portion 27Aβ. The portion of the first insulation film 18 overlapping the seventh semi-transmitting section 50HT5 is to be configured as a pre-fifth recessed portion (a pre-third recessed portion), which is to be the fifth recessed portion 27Aγ. Before the heat treatment step, the direction in which the line extends from the center of gravity of the outline of the pre-first projection portion toward a middle position of the pre-third recessed portion with respect to the circumferential direction, the direction in which the line extends from the center of gravity of the outline of the pre-second projection portion toward a middle position of the pre-fourth recessed portion with respect to the circumferential direction, and the direction in which the line extends from the center of gravity of the outline of the pre-third projection portion toward a middle position of the pre-fifth recessed portion with respect to the circumferential direction cross each other.

As illustrated in FIG. 9, after the developing step, the portions of the first insulation film 18 that are the pre-projection portions 26P and to be configured as the projection portions 26 have a circular columnar shape having a constant diameter in a height direction. The portions of the first insulation film 18 that are the pre-projection portions 26P and to be configured as the projection portions 26 have flat top surfaces and peripheral surfaces (side surfaces) that extend in the Z-axis direction. The portions of the first insulation film 18 that are pre-recessed portions 27P (pre-recesses) and to be configured as the recessed portions 27 have flat bottom surfaces and side surfaces that extend in the Z-axis direction.

In the heat treatment step, the heat treatment is performed to the substrate 17 on which the first insulation film 18 developed through the developing step is disposed. In the heat treatment step, the first insulation film 18 is heated to the temperature of the melting point of the photosensitive resin material of the first insulation film 18 (180° C., for example) or higher. Then, the first insulation film 18 is deformed and heat sagging occurs in the first insulation film 18. The portions (the pre-projection portions 26P) of the first insulation film 18 that are to be configured as the projection portions 26 are deformed such that the top surfaces and the side surfaces of the portions (the pre-projection portions 26P) have round shapes. Thus, the mountain shaped projection portions 26 are obtained as illustrated in FIG. 10. Similarly, the portions (the pre-recessed portions 27P) of the first insulation film 18 that are to be configured as the recessed portions 27 are deformed such that the bottom surfaces and the side surfaces of the portions (the pre-recessed portions 27P) have round shapes. Thus, the recessed portions 27 are obtained as illustrated in FIG. 10.

As illustrated in FIG. 9, before the heat treatment step, the pre-first recessed portion 27AP that is adjacent to the portion of the periphery of the pre-projection portion 26P is deeper than the pre-second recessed portion 27BP that surrounds the pre-projection portion 26P and the pre-first recessed portion 27AP. Therefore, after the heat treatment step is performed, the pre-projection portion 26P is deformed to be inclined with respect to the normal direction of the surface of the substrate 17 such that the top 26V is positioned closer to the pre-first recessed portion 27AP. More in detail, after the heat treatment step, the first projection portion 26α is formed such that the first top 26Vα is closer to the third recessed portion 27Aα than the first center of gravity 26Cα of the first projection portion 26α is. The second projection portion 26β is formed such that the second top 26Vβ is closer to the fourth recessed portion 27Aβ than the second center of gravity 26Cβ of the second projection portion 26β is. The third projection portion 26γ is formed such that the third top 26Vγ is closer to the fifth recessed portion 27Aγ than the third center of gravity 26Cγ of the third projection portion 26γ is. Accordingly, the first projection portion 26α, the second projection portion 26β, and the third projection portion 26γ are configured such that the first direction D1, the second direction D2, and the third direction D3 cross each other and the first projection portion 26α, the second projection portion 26β, and the third projection portion 26γ are inclined in different directions. Thus, the uneven surface 18A of the first insulation film 18 is formed.

After the second step is performed, the third step is performed and the electrically conductive film is formed with patterning and the electrically conductive layer 21 and the second contact electrodes 22B are formed. Thereafter, the fourth step is performed and the metal film is formed with patterning and the reflection film 16 and the third contact electrodes 22C are formed. The reflection film 16 disposed on the first insulation film 18 has an uneven surface that follows the uneven surface 18A of the first insulation film 18. Since the first projection portion 26α, the second projection portion 26β, and the third projection portion 26γ that are inclined in the different directions are included on the uneven surface 18A, the light rays reflecting off the reflection film 16 can travel effectively in various directions.

As described before, the array substrate 12 (the reflection plate) according to this embodiment includes the substrate 17, the first insulation film 18 (the insulation film), and the reflection film 16. The first insulation film 18 is disposed on the substrate 17 and has the uneven surface 18A. The reflection film 16 is disposed in an upper layer than the first insulation film 18 and has a surface that conforms to the uneven surface 18A. The reflection film 16 reflects light. The first insulation film 18 includes the projection portions 26 that are arranged at intervals and the recessed portions 27 that are disposed between the adjacent projection portions 26. The first insulation film 18 includes the projection portions 26 and the recessed portions 27 on the uneven surface 18A. The projection portions 26 are inclined with respect to the normal direction of the surface of the substrate 17. The projection portions 26 include the first projection portion 26α, the second projection portion 26β that is adjacent to and away from the first projection portion 26α, and the third projection portion 26γ that is adjacent to and away from the first projection portion 26α. The first projection portion 26α, the second projection portion 26β, and the third projection portion 26γ are inclined in the different directions.

According to such a configuration, the light reflection occurs at the surface of the reflection film 16 that conforms to the uneven surface 18A of the first insulation film 18 since the reflection film 16 is disposed in an upper layer than the first insulation film 18. Since the projection portions 26 of the uneven surface 18A are inclined with respect to the normal direction of the surface of the substrate 17, the light rays reflecting off the reflection film 16 travel in the directions that are different from the regular reflecting direction. Since the projection portions 26 include the first projection portion 26α, the second projection portion 26β, and the third projection portion 26γ that are inclined in the different directions, the light rays reflecting off the reflection film 16 travel in the different directions. According to this embodiment, diffusion in the reflected light rays can be achieved.

The first projection portion 26α is configured such that the first center of gravity 26Cα of the plan view outline and the first top 26Vα do not correspond to each other in a plan view. The second projection portion 26β is configured such that the second center of gravity 26Cβ of the plan view outline and the second top 26Vβ do not correspond to each other in a plan view. The third projection portion 26γ is configured such that the third center of gravity 26Cγ of the plan view outline and the third top 26Vγ do not correspond to each other in a plan view. The first projection portion 26α, the second projection portion 26β, and the third projection portion 26γ are configured such that the direction in which the line connecting the first center of gravity 26Cγ and the first top 26Vγ extends, the direction in which the line connecting the second center of gravity 26Cβ and the second top 26Vβ extends, and the direction in which the line connecting the third center of gravity 26Cγ and the third top 26Vγ extends cross each other. According to such a configuration, the first projection portion 26α, the second projection portion 26β, and the third projection portion 26γ are configured such that the center of gravity 26C of the plan view outline and the top 26V do not correspond to each other in a plan view and the top 26V is not at the same position as the center of gravity 26C in a plan view. Therefore, the first projection portion 26α, the second projection portion 26β, and the third projection portion 26γ are inclined with respect to the normal direction of the surface of the substrate 17.

In the first projection portion 26α, the second projection portion 26β, and the third projection portion 26γ, the first top 26Vα, the second top 26Vβ, and the third top 26Vγ are on the different sides with respect to the centers of gravity 26Cα, 26Cβ, 26Cγ in a plan view such that the direction in which the line connecting the first center of gravity 26Cα and the first top 26Vα extends, the direction in which the line connecting the second center of gravity 26Cβ and the second top 26Vβ extends, and the direction in which the line connecting the third center of gravity 26Cγ and the third top 26Vγ extends cross each other. According to such a configuration, the traveling direction in which the reflected light rays reflecting off the reflection film 16 travel can be effectively varied.

All the projection portions 26 that are adjacent to each other at intervals are inclined different directions. According to such a configuration, the traveling direction in which the reflected light rays reflecting off the reflection film 16 travel can be further effectively varied.

The liquid crystal display device 10 (the display device) according to this embodiment includes the array substrate 12 described above and the opposed substrate 13 that is disposed to opposite the array substrate 12. According to such a liquid crystal display device 10, the traveling direction in which the reflected light rays reflecting off the reflection film 16 travel can be varied. Therefore, the observer can see the image effectively from various positions with respect to the liquid crystal display device 10.

In the method of producing the array substrate 12 according to this embodiment, the first insulation film 18 made of positive-type photosensitive resin material is deposited on the substrate 17 and exposed to light via the first photomask 50 and developed. The developed first insulation film 18 is subjected to the heat treatment and the reflection film 16 is deposited on the first insulation film 18. The photomask 50 includes the light blocking sections 50LS that blocks light, first semi-transmitting sections 50HT1 that are adjacent to portions of peripheries of the light blocking sections 50LS, respectively, and transmit the light and have light transmittance higher than that of the light blocking sections 50LS, and the second semi-transmitting sections 50HT2 that surround the light blocking sections 50LS and the first semi-transmitting sections 50HT1, respectively, and have light transmittance higher than that of the light blocking sections 50LS and lower than that of the first semi-transmitting sections 50HT1.

By developing the first insulation film 18, the portions of the first insulation film 18 overlapping the light blocking sections 50LS are deformed and configured as the pre-projection portions 26P, the portions of the first insulation film 18 overlapping the first semi-transmitting sections 50HT1 are deformed and configured as the pre-first recessed portions 27AP (pre-peripheral recessed portion), and the portions of the first insulation film 18 overlapping the second semi-transmitting sections 50HT2 are deformed and configured as the pre-second recessed portions 27BP (pre-recessed portion) that are shallower than the pre-first recessed portions 27AP and thus, the uneven surface is formed on the surface of the first insulation film 18.

By performing the heat treatment to the first insulation film 18, the pre-projection portions 26P are deformed to be inclined with respect to the normal direction of the surface of the substrate 17 and the tops 26V of the inclined pre-projection portions 26P are moved closer to the pre-first recessed portions 27AP. Thus, the projection portions 26, the first recessed portions 27A, and the second recessed portions 27B are formed and the uneven surface 18A is formed. The reflection film 16 that reflects light is disposed in an upper layer than the first insulation film 18.

After forming the first insulation film 18, which is made of positive-type photosensitive insulating material, on the substrate 17, the first insulation film 18 is exposed to light via the first photomask 50. With the first insulation film 18 made of positive-type photosensitive insulating material being exposed to light via the first photomask 50, the portions of the first insulation film 18 that overlap the first semi-transmitting sections 50HT1 are exposed to light with the light amount greater than that of the exposure light supplied to the portions of the first insulation film 18 overlapping the second semi-transmitting sections 50HT2, and the portions of the first insulation film 18 overlapping the light blocking sections 50LS are not exposed to light.

With the first insulation film 18 being developed, the uneven surface is formed on the surface of the first insulation film 18. The portions of the first insulation film 18 overlapping the light blocking sections 50LA are configured as the pre-projection portions 26P on the uneven surface. The portions of the first insulation film 18 overlapping the first semi-transmitting sections 50HT1 are configured as the pre-first recessed portions 27AP on the uneven surface. The pre-first recessed portion 27AP is adjacent to a portion of the periphery of the pre-projection portion 26P. The portions of the first insulation film 18 overlapping the second semi-transmitting sections 50HT2 are configured as the pre-second recessed portions 27BP on the uneven surface. The pre-second recessed portion 27BP surrounds the pre-projection portion 26P and the pre-first recessed portion 27AP.

With the developed first insulation film 18 being subjected to the heat treatment, the first insulation film 18 is deformed and heat sagging occurs in the first insulation film 18. The pre-first recessed portion 27AP that is adjacent to the portion of the periphery of the pre-projection portion 26P is deeper than the pre-second recessed portion 27BP that surrounds the pre-projection portion 26P and the pre-first recessed portion 27AP. Therefore, according to the performance of the heat treatment, the pre-projection portion 26P is deformed to be inclined with respect to the normal direction of the surface of the substrate 17 such that the top 26V is positioned closer to the pre-first recessed portion 27AP. The reflection film 16 is disposed in an upper layer than the first insulation film 18 that is subjected to the heat treatment. The light reflection occurs at the surface of the reflection film 16 that conforms to the uneven surface 18A of the first insulation film 18. With the projection portions 26, which is inclined as described above, being included on the uneven surface 18A after the heat treatment, the light rays reflecting off the reflection film 16 travel in the directions that are different from the regular reflecting direction.

As described before, with using the first photomask 50 in exposing the first insulation film 18 to light, the projection portions 26 that are inclined as described above are formed on the first insulation film 18. Therefore, a special exposing device and a special substrate support device need not be prepared. The array substrate 12 can be produced with using a generally used producing device in the exposing step and the heat treatment step. Furthermore, the inclination of the projection portions 26 can be freely determined based on the pattern design of the first photomask 50. This increases variation in the design of the projection portions 26. According to this embodiment, the array substrate 12 can be produced with using a generally used producing device.

The first insulation film 18 is exposed to light via the first photomask 50. The photomask 50 includes the light blocking sections 50LS including the first light blocking section 50LS1, the second light blocking section 50LS2 and the third light blocking section 50LS3 that are adjacent to and away from the first light blocking section 50LS1, and the first semi-transmitting sections 50HT1 including the fifth semi-transmitting section 50HT3 that is adjacent to a portion of the periphery of the first light blocking section 50LS1, the sixth semi-transmitting sections 50HT4 that is adjacent to a portion of the periphery of the second light blocking section 50LS2, and the seventh semi-transmitting section 50HT5 that is adjacent to a portion of the periphery of the third light blocking section 50LS3. In the first photomask 50, the direction in which the line extends from the center of gravity 50LS1C of the outline of the first light blocking section 50LS1 toward a middle position of the fifth semi-transmitting section 50HT3 with respect to the circumferential direction extends, the direction in which the line extends from the center of gravity 50LS2C of the outline of the second light blocking section 50LS2 toward a middle position of the sixth semi-transmitting section 50HT4 with respect to the circumferential direction extends, and the direction in which the line extends from the center of gravity 50LS3C of the outline of the third light blocking section 50LS3 toward a middle position of the seventh semi-transmitting section 50HT5 with respect to the circumferential direction cross each other.

By developing the first insulation film 18, the uneven surface is formed on the surface of the first insulation film 18. Through the developing of the first insulation film 18, the portion of the first insulation film 18 overlapping the first light blocking section 50LS1 is configured as the pre-first projection portion to be the first projection portion 26α, the portion of the first insulation film 18 overlapping the second light blocking section 50LS2 is configured as the pre-second projection portion that to be the second projection portion 26β that is adjacent to and away from the first projection portion 26α, the portion of the first insulation film 18 overlapping the third light blocking section 50LS3 is configured as the pre-third projection portion to be the third projection portion 26γ that is adjacent to and away from the first projection portion 26α, the portion of the first insulation film 18 overlapping the fifth semi-transmitting section 50HT3 is configured as the pre-third recessed portion (pre-first peripheral recessed portion) to be the third recessed portion 27Aα, the portion of the first insulation film 18 overlapping the sixth semi-transmitting section 50HT4 is configured as the pre-fourth recessed portion (a pre-second peripheral recessed portion) to be the fourth recessed portion 27Aβ, the portion of the first insulation film 18 overlapping the seventh semi-transmitting section 50HT5 is configured as the pre-fifth recessed portion (a pre-third peripheral recessed portion) to be the fifth recessed portion 27Aγ, and the portion of the first insulation film 18 overlapping the second semi-transmitting sections 50HT2 is configured as the pre-second recessed portion (pre-recessed portion) that is shallower than the pre-third recessed portion, the pre-fourth recessed portion, and the pre-fifth recessed portion.

By performing the heat treatment to the first insulation film 18 that is through the developing step, the pre-first projection portion is deformed to be inclined with respect to the normal direction of the surface of the substrate 17 and the first top of the inclined pre-first projection portion is positioned closer to the pre-third recessed portion, the pre-second projection portion is deformed to be inclined with respect to the normal direction of the substrate 17 and the second top of the inclined pre-second projection portion is positioned closer to the pre-fourth recessed portion, and the pre-third projection portion is deformed to be inclined with respect to the normal direction of the substrate 17 and the third top of the inclined pre-third projection portion is positioned closer to the pre-fifth recessed portion.

With the first insulation film 18 that is made of the positive-type photosensitive insulating material being exposed to light via the first photomask 50, the portions of the first insulation film 18 that overlap the fifth semi-transmitting section 50HT3, the sixth semi-transmitting section 50HT4, and the seventh semi-transmitting sections 50HT5, which are included in the first semi-transmitting sections 50HT1, are exposed to light with the exposure light amount greater than that of the exposure light supplied to the portions of the first insulation film 18 overlapping the second semi-transmitting sections 50HT2. The portions of the first insulation film 18 that overlap the first light blocking section 50LS1, the second light blocking section 50LS2, and the third light blocking sections 50LS3, which are included in the light blocking sections 50LS, are not exposed to light.

With the first insulation film 18 being developed, the portion of the first insulation film 18 overlapping the first light blocking section 50LS1 is configured as the pre-first projection portion to be the first projection portion 26α, the portion of the first insulation film 18 overlapping the second light blocking section 50LS2 is configured as the pre-second projection portion to be the second projection portion 26β, and the portion of the first insulation film 18 overlapping the third light blocking section 50LS3 is configured as the pre-third projection portion to be the third projection portion 26γ. The pre-second projection portion and the pre-third projection portion are away from the pre-first projection portion. The portion of the first insulation film 18 overlapping the fifth semi-transmitting section 50HT3 is configured as the pre-third recessed portion to be the third recessed portion 27Aα, the portion of the first insulation film 18 overlapping the sixth semi-transmitting section 50HT4 is configured as the pre-fourth recessed portion to be the fourth recessed portion 27Aβ, and the portion of the first insulation film 18 overlapping the seventh semi-transmitting section 50HT5 is configured as the pre-fifth recessed portion to be the fifth recessed portion 27Aγ.

After the developing step, the direction in which the line extends from the center of gravity of the outline of the pre-first projection portion toward a middle position of the pre-third recessed portion with respect to the circumferential direction, the direction in which the line extends from the center of gravity of the outline of the pre-second projection portion toward a middle position of the pre-fourth recessed portion with respect to the circumferential direction, and the direction in which the line extends from the center of gravity of the outline of the pre-third projection portion toward a middle position of the pre-fifth recessed portion with respect to the circumferential direction cross each other.

With the heat treatment being performed to the first insulation film 18 that is developed, the pre-first projection portion, the pre-second projection, and the pre-third projection are deformed to be inclined with respect to the normal direction of the surface of the substrate 17. The tops of the inclined pre-first projection portion to be the first projection portion 26α, the inclined pre-second projection portion to be the second projection portion 26β, and the inclined pre-third projection portion to be the third projection portion 26γ are positioned closer to the pre-third recessed portion to be the third recessed portion 27Aα, the pre-fourth recessed portion to be the fourth recessed portion 27Aβ, and the pre-fifth recessed portion to be the fifth recessed portion 27Aγ, respectively. Accordingly, the first projection portion 26α, the second projection portion 26β, and the third projection portion 26γ that are inclined in different directions are obtained.

The reflection film 16 disposed on the first insulation film 18 has an uneven surface that follows the uneven surface 18A of the first insulation film 18. The light reflection occurs at the uneven surface of the reflection film 16. Since the first projection portion 26α, the second projection portion 26β, and the third projection portion 26γ that are inclined in the different directions are included on the uneven surface 18A, the light rays reflecting off the reflection film 16 can travel effectively in various directions.

The first photomask 50 includes the light blocking sections 50LS that have a circular plan view shape and the first semi-transmitting sections 50HT1 that are adjacent to the light blocking sections 50LS, respectively. The first semi-transmitting section 50HT1 extends in an area corresponding to a half or less of the periphery of the light blocking section 50LS. The first insulation film 18 is exposed to light via such a first photomask 50. After the exposing, with the first insulation film 18 being developed, the pre-projection portions 26P, the pre-first recessed portions 27AP each of which extends adjacent to the pre-projection portion 26P and extends in an area corresponding to a half or less of the periphery of the pre-projection portion 26P, and the pre-second recessed portions 27BP that surround the pre-projection portions 26P and the pre-first recessed portions 27AP are formed.

With the developed first insulation film 18 being subjected to the heat treatment, the first recessed portions 27A that are deeper than the second recessed portions 27B are formed adjacent to the projection portions 26, respectively, to extend in an area corresponding to a half or less of the periphery of the projection portion 26. Therefore, the projection portions 26 are inclined with respect to the normal direction of the surface of the substrate 17 with high reliability such that the tops 26V are positioned closer to the first recessed portions 27A, respectively. The inclination direction of the projection portions 26 can be easily controlled.

Second Embodiment

A second embodiment will be described with reference to FIGS. 11 to 16. In the second embodiment, a configuration of first recessed portions 127A differs from that of the first embodiment and a gray tone mask 60 is used in the second step. Configuration, functions, and effects similar to those of the first embodiment may not be described.

Figure 11:
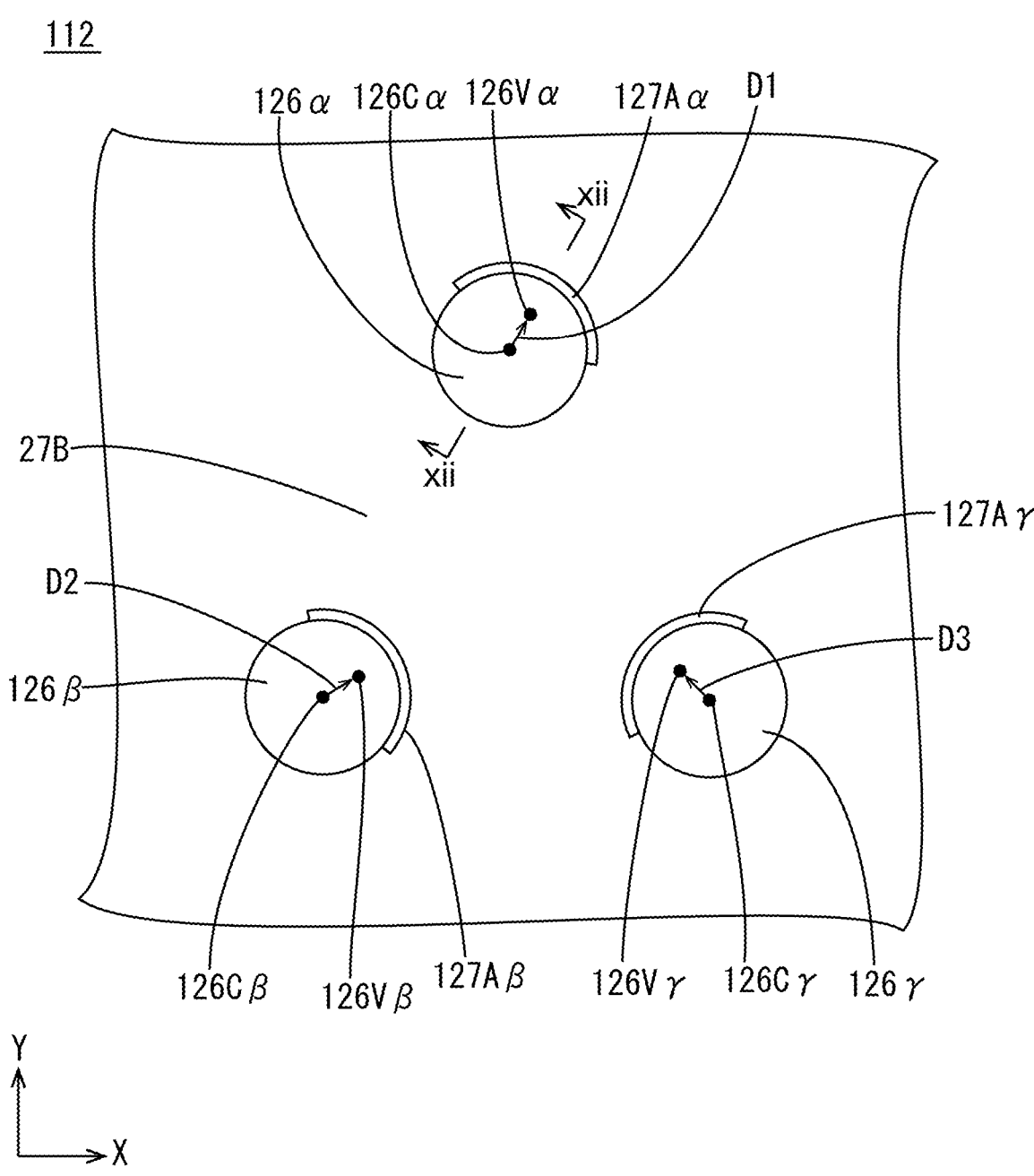
FIG. 11 is a plan view illustrating protrusion portions according to a second embodiment.
Figure 12:
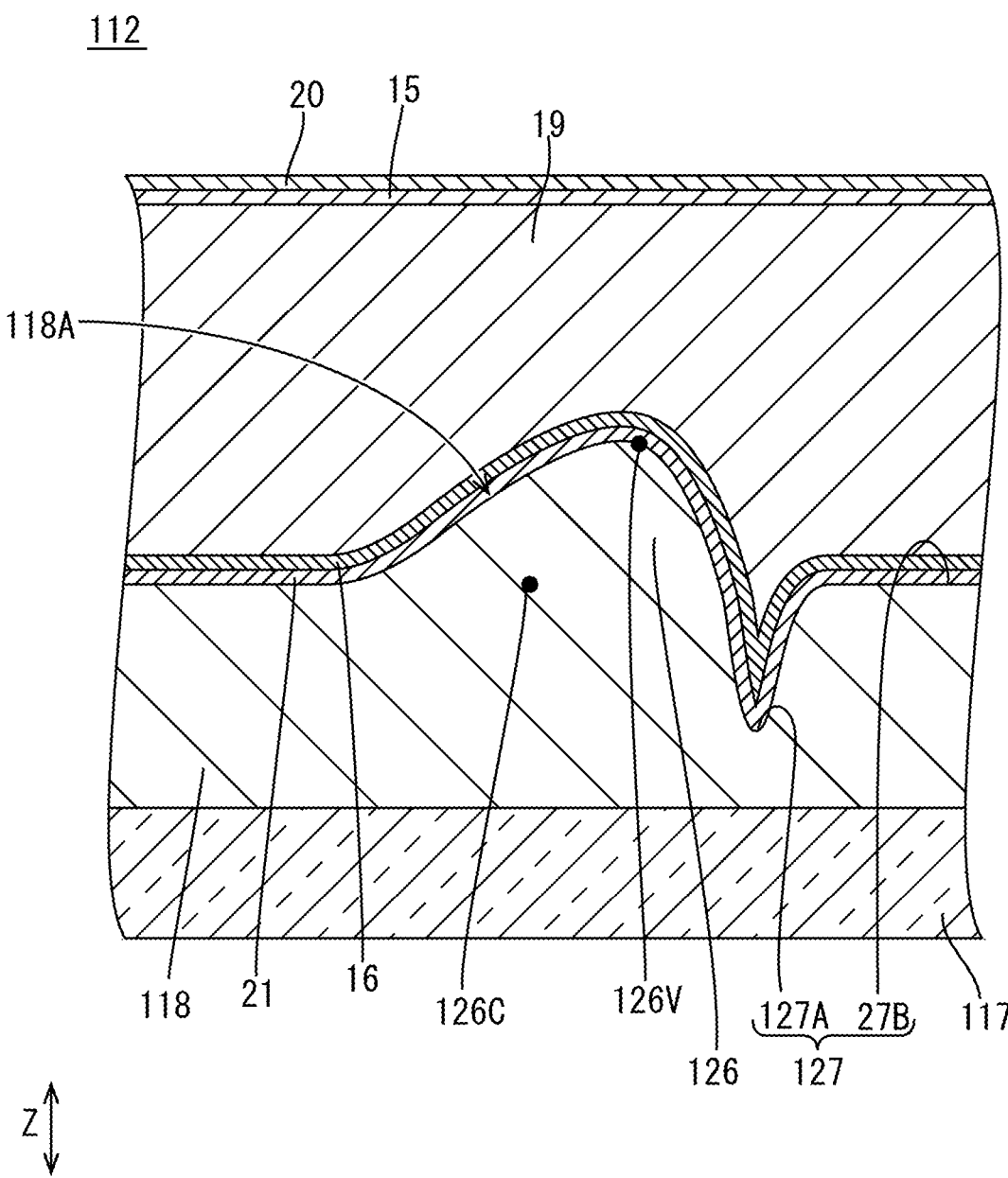
FIG. 12 is a cross-sectional view of an array substrate along line xii-xii in FIG. 11.

FIG. 11 is a plan view illustrating three projection portions 126. FIG. 12 is a cross-sectional view of an array substrate 112 taken along line xii-xii in FIG. 11. The array substrate 112 of this embodiment includes a first insulation film 118. As illustrated in FIGS. 11 and 12, the first insulation film 118 includes the first recessed portion 127A that has a width narrower than that of the first embodiment. The first recessed portion 127A is deeper than the first recessed portion 27A of the first embodiment. The area in which the first recessed portions 127A extend with respect to the circumferential direction of projection portions 126 is similar to that of the first embodiment. The projection portions 126 are inclined with respect to the normal direction of the surface of a substrate 117 such that tops 126V are positioned closer to the first recessed portions 127A, respectively.

Figure 13:
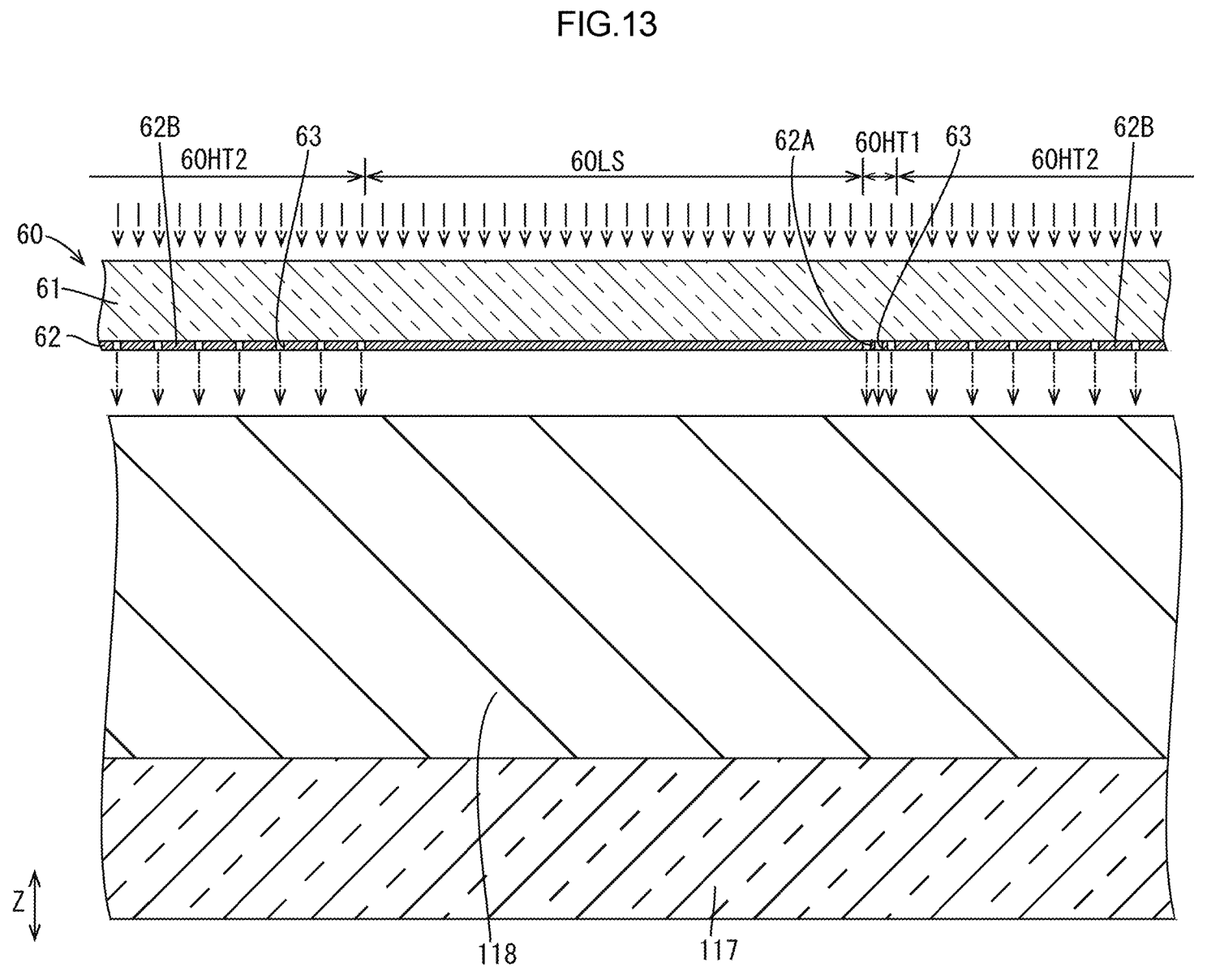
Figure 14:
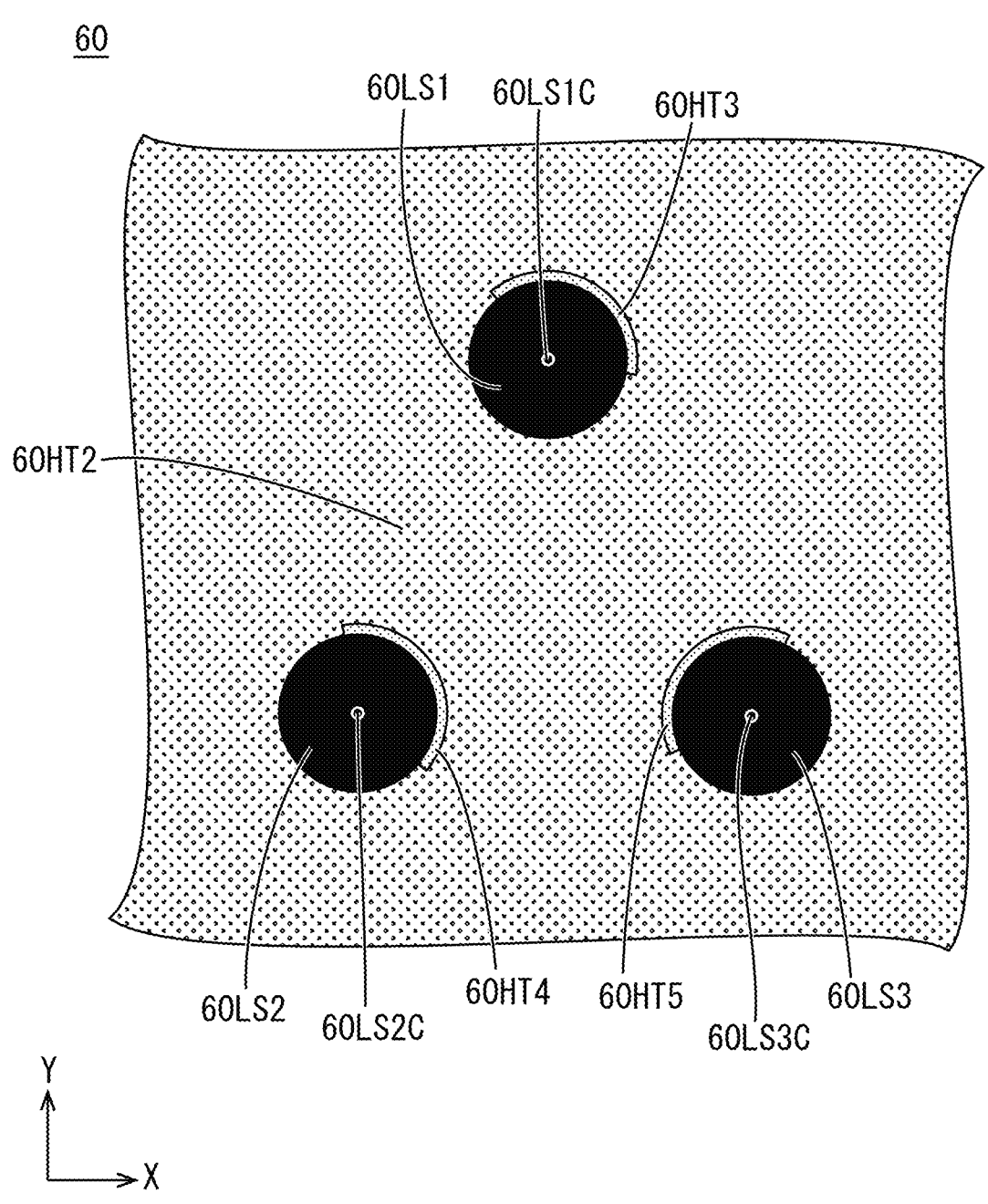
FIG. 14 is a plan view of the gray tone mask that is used in the exposing process.

The second step included in the method of producing the array substrate 112 will be described. In the exposing step included in the second step, the gray tone mask 60 (the first photomask) is used. The gray tone mask 60 will be described in detail with reference to FIGS. 13 and 14. FIG. 13 illustrates the first insulation film 118 that is deposited through the depositing step and exposed to light via the gray tone mask 60 in the exposing step. FIG. 13 is a cross-sectional view taken along a surface same as that in FIG. 11. FIG. 14 is a plan view of the gray tone mask 60 that is used in the exposing step.

As illustrated in FIG. 13, the gray tone mask 60 includes a base 61 and a light blocking film 62. The base 61 is transparent and has highly light transmitting properties. The light blocking film 62 is formed on a surface of the base 61. The light blocking film 62 blocks exposure light that is emitted by a light source of an exposing device and the light transmittance with respect to the exposure light is almost 0%. The light blocking film 62 includes slits 63 in portions thereof. The slits 63 are arranged at a density lower than the resolution of the exposing device. The portion of the light blocking film 62 including the slits 63 has light transmittance with respect to the exposure light that is higher than the light transmittance of the light blocking film 62 with respect to the exposure light. The light transmittance of the portion of the light blocking film 62 including the slits 63 is about 10% to 70%. The light transmittance of the portion of the light blocking film 62 including the slits 63 with respect to the exposure light varies according to the distribution density of the slits 63. The light transmittance with respect to the exposure light increases as the distribution density of the slits 63 increases. The light blocking film 62 includes a hole that has a size higher than the resolution of the exposing device. The light transmittance of the light blocking film 62 in the hole with respect to the exposure light is about 100%. The exposure light that is supplied to the first insulation film 118 is described with downwards arrows in FIG. 13.

The distribution pattern of the slits 63 in the light blocking film 62 will be described in detail. The portions of the light blocking film 62 that do not include the slits 63 or the holes correspond to and overlap the portions of the first insulation film 118 where the projection portions 126 are to be formed. The portions of the light blocking film 62 that include the slits 63 correspond to and overlap the portions of the first insulation film 118 where recessed portions 127 (recesses) are to be formed. The portions of the light blocking film 62 including the slits 63 include first portions 62A and second portions 62B. The distribution density of the slits 63 is higher in the first portions 62A than in the second portions 62B. The first portions 62A correspond to and overlap the portions of the first insulation film 118 where the first recessed portions 127A are to be formed. The second portions 62B correspond to and overlap the portions of the first insulation film 118 where the second recessed portions 127B are to be formed. The holes in the light blocking film 62 correspond to and overlap the portions of the first insulation film 118 where the first contact holes are to be formed.

According to the distribution pattern in the light blocking film 62, the gray tone mask 60 includes light blocking sections 60LS that blocks the exposure light, transmitting sections that transmit the exposure light, first semi-transmitting sections 60HT1 (peripheral semi-transmitting sections) that transmit some of the exposure light rays, and second semi-transmitting sections 60HT2 (semi-transmitting sections) that transmit some of the exposure light rays at transmittance lower than that of the first semi-transmitting sections 60HT1. The light blocking sections 60LS correspond to the portions of the light blocking film 62 where the slits 63 or the holes are not formed. The transmitting sections correspond to the holes in the light blocking films 62. The first semi-transmitting sections 60HT1 are adjacent to portions of outer peripheries of the light blocking sections 60LS, respectively. The first semi-transmitting sections 60HT1 correspond to the first portions 62A that are the portions of the light blocking film 62 including the slits 63. The first semi-transmitting sections 60HT1 of this embodiment are narrower than the first semi-transmitting sections 50HT1 of the first embodiment. The light transmittance of the first semi-transmitting sections 60HT1 is slightly higher than that of the first semi-transmitting sections 60HT1. The second semi-transmitting sections 60HT2 correspond to the second portions 62B that are the portions of the light blocking film 62 including the slits 63.

The light blocking section 60LS, the first semi-transmitting section 60HT1, and the second semi-transmitting section 60HT2 are illustrated with different types of shading in FIG. 14. As illustrated in FIG. 14, the light blocking sections 60LS include a first light blocking section 60LS1, a second light blocking section 60LS2, and a third light blocking section 60LS3. The first light blocking section 60LS1 is disposed to overlap the portion of the first insulation film 118 where the first projection portion 126α is to be formed. The second light blocking section 60LS2 is disposed to overlap the portion of the first insulation film 118 where the second projection portion 1261 is to be formed. The third light blocking section 60LS3 is disposed to overlap the portion of the first insulation film 118 where the third projection portion 126γ is to be formed.

The first semi-transmitting sections 60HT1 (peripheral semi-transmitting sections) include a fifth semi-transmitting section 60HT3 (first peripheral semi-transmitting sections), a sixth semi-transmitting section 60HT4 (second peripheral semi-transmitting sections), and a seventh semi-transmitting section 60HT5 (third peripheral semi-transmitting sections). The fifth semi-transmitting section 60HT3 is disposed to overlap the portion of the first insulation film 118 where the third recessed portion 127Aα(peripheral recessed portion) is to be formed. The sixth semi-transmitting section 60HT4 is disposed to overlap the portion of the first insulation film 118 where the fourth recessed portion 127Aβ (second peripheral recessed portion) is to be formed. The seventh semi-transmitting section 60HT5 is disposed to overlap the portion of the first insulation film 118 where the fifth recessed portion 127Aγ (third peripheral recessed portion) is to be formed. The direction in which the line extends from the center of gravity 60LS1C of the outline of the first light blocking section 60LS1 toward a middle position of the fifth semi-transmitting section 60HT3 with respect to the circumferential direction, the direction in which the line extends from the center of gravity 60LS2C toward a middle position of the sixth semi-transmitting section 60HT4 with respect to the circumferential direction, and the direction in which the line extends from the center of gravity 60LS3C toward a middle position of the seventh semi-transmitting section 60HT5 with respect to the circumferential direction cross each other.

In the exposing step, as illustrated in FIG. 13, the exposure light emitted by the light source of the exposing device is supplied to the first insulation film 118 through the gray tone mask 60 having the above configuration. Accordingly, the first insulation film 118 is selectively exposed to light. The exposure pattern of the first insulation film 118 via the gray tone mask 60 is similar to that of the first embodiment.

Figure 15:
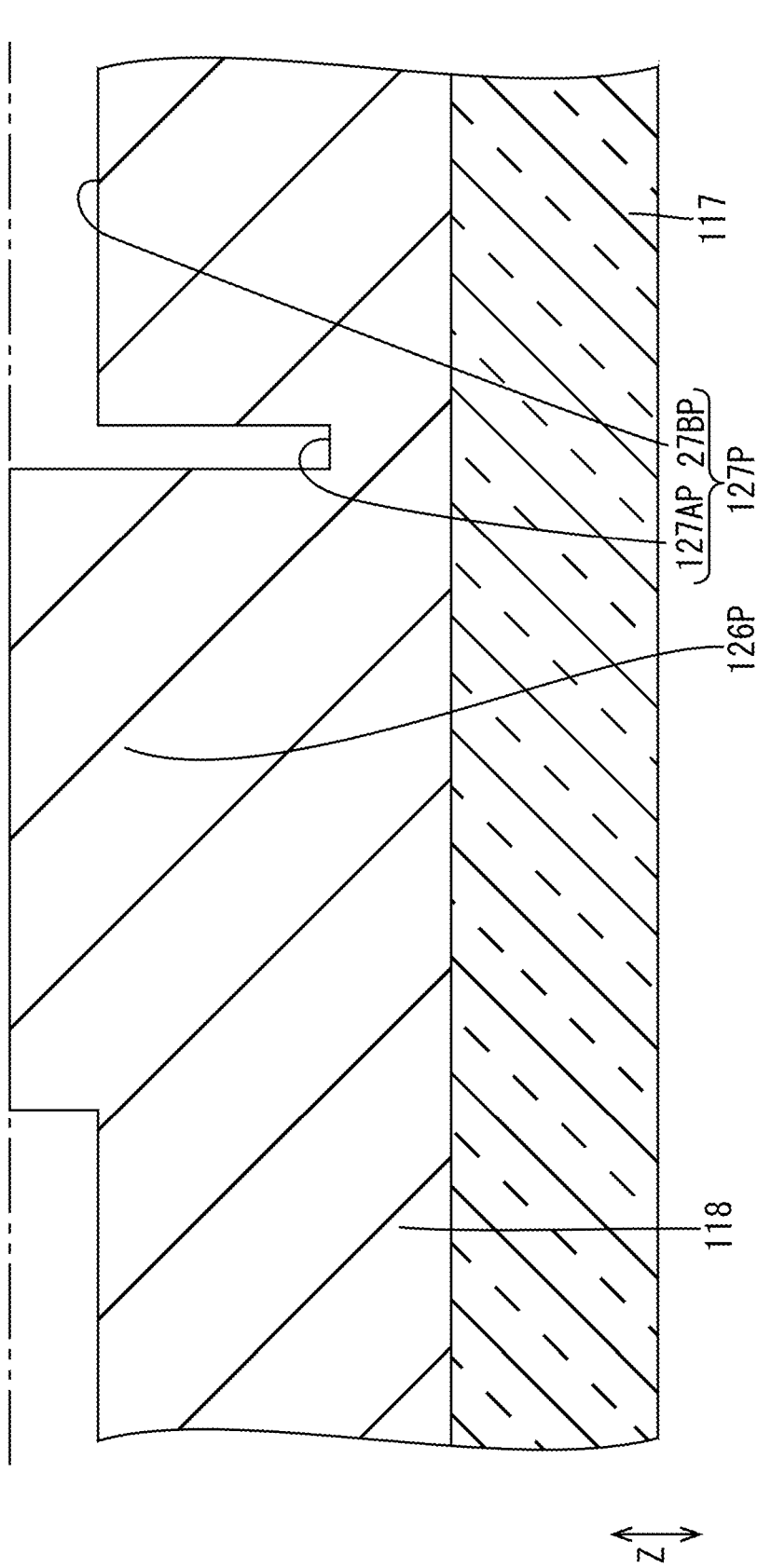
FIG. 15 is a cross-sectional view of the first insulation film 118 cut along the same line as that in FIG. 12 and illustrates the first insulation film that is developed through the developing step.

With the developing step being performed after the exposing step, as illustrated in FIG. 15, the portions of the first insulation film 118 that are exposed to light are removed according to the amount of exposure light. FIG. 15 illustrates the first insulation film 118 that is developed through the developing step and is a cross-sectional view of the first insulation film 118 cut along the same line as that in FIG. 12. The first insulation film 118 that is developed through the developing step has a same configuration as that of the first embodiment.

By developing the first insulation film 118, an uneven surface is formed on the surface of the first insulation film 118. As illustrated in FIGS. 13 to 15, through the developing of the first insulation film 118, the portions of the first insulation film 118 overlapping the light blocking sections 60LS, which include the first, second, and third light blocking section 60LS1, 60LS2, 60LS3, are configured as pre-projection portions 126P to be the projection portions 126, which include a first projection portion 126α, a second projection portion 126β, and a third projection portion 126γ, respectively. The portions of the first insulation film 118 overlapping the first semi-transmitting sections, which include the fifth, sixth, and seventh semi-transmitting sections 60HT3, 60HT4, 60HT5, are configured as pre-first recessed portions 127AP (pre-peripheral recessed portion) to be the first recessed portions 127A, which include the third recessed portion 127Aα(first peripheral recessed portion), the fourth recessed portion 127Aβ (second peripheral recessed portion), and the fifth recessed portion 127Aγ (third peripheral recessed portion), respectively.

Figure 16:
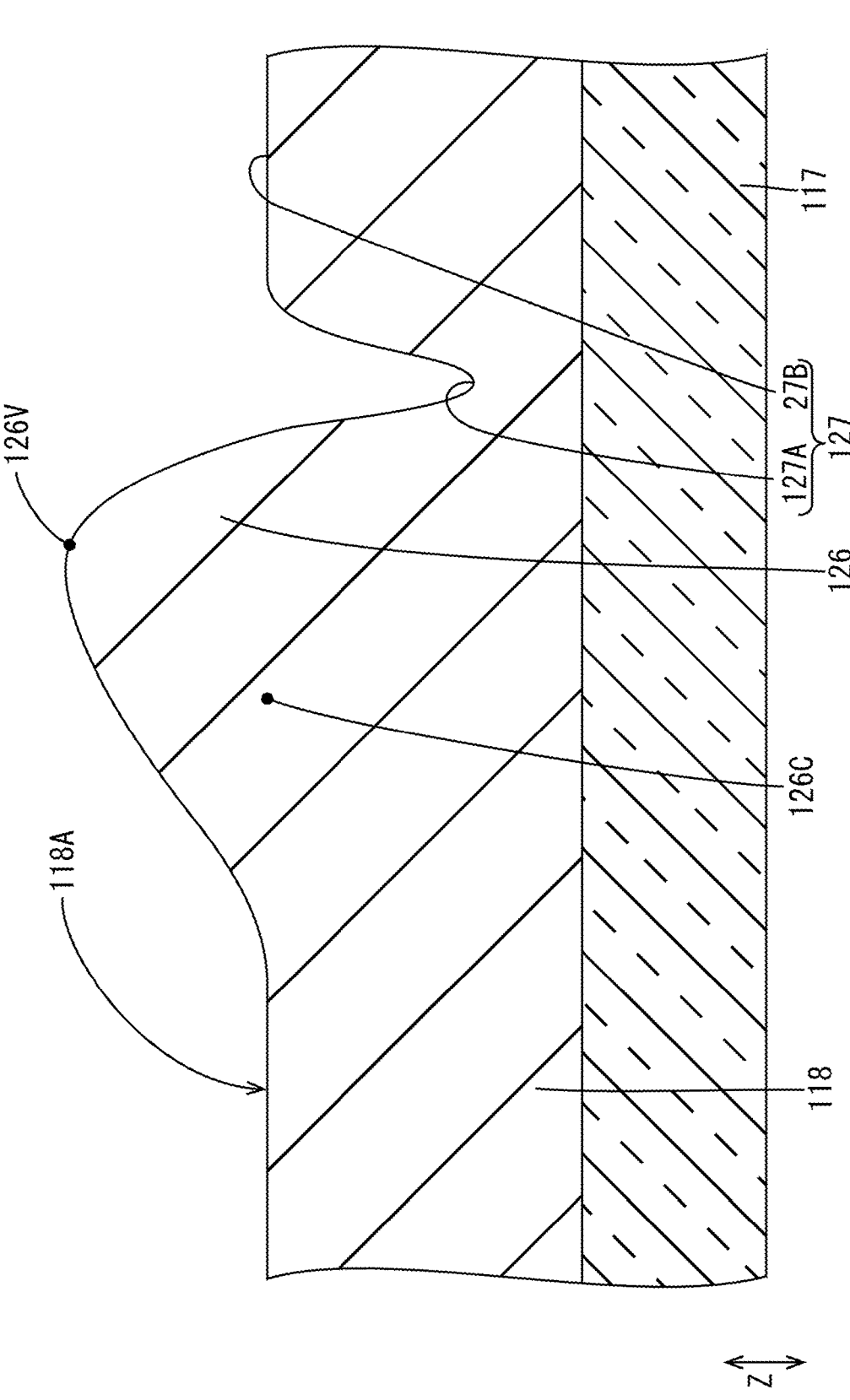
FIG. 16 is a cross-sectional view of the first insulation film cut along the same line as that in FIG. 12 and illustrates the first insulation film that is subjected to the heat treatment step.

With the heat treatment being performed after the developing step, as illustrated in FIG. 16, the first insulation film 118 is deformed and heat sagging occurs in the first insulation film 118. FIG. 16 illustrates the first insulation film 118 that is subjected to the heat treatment step and is a cross-sectional view of the first insulation film 118 cut along the same line as that in FIG. 12. The first insulation film 118 that is subjected to the heat treatment has a configuration similar to that of the first embodiment.

By performing the heat treatment to the first insulation film 118 that is through the developing step, the pre-first projection portions 126P are deformed to be inclined with respect to the normal direction of the surface of a substrate 117, as illustrated in FIG. 16. As illustrated in FIGS. 11 and 16, the projection portions 126, which include the first projection portion 126α, the second projection portion 126β, and the third projection portion 126γ, are configured such that the center of gravity 126C (126Cα, 126Cβ, 126Cγ) of the plan view outline and the top 126V (126Vα, 126Vβ, 126Vγ) do not correspond to each other in a plan view and the top 26V (126Vα, 126Vβ, 126Vγ) is not at the same position as the center of gravity 26C (126Cα, 126Cβ, 126Cγ) in a plan view. Therefore, the first projection portion 126α, the second projection portion 126β, and the third projection portion 126γ are inclined with respect to the normal direction of the surface of the substrate 117.

According to the second embodiment, since the first projection portion 126α, the second projection portion 126β, and the third projection portion 126γ that are inclined in the different directions are included on the uneven surface 118A of the first insulation film 118, the light rays reflecting off the reflection film 16 can travel effectively in various directions.

Third Embodiment

A third embodiment will be described with reference to FIGS. 17 to 19. The third embodiment includes projection portions 226 that have a configuration different from that of the second embodiment. Configurations, functions, and effects similar to those of the second embodiment may not be described.

Figure 17:
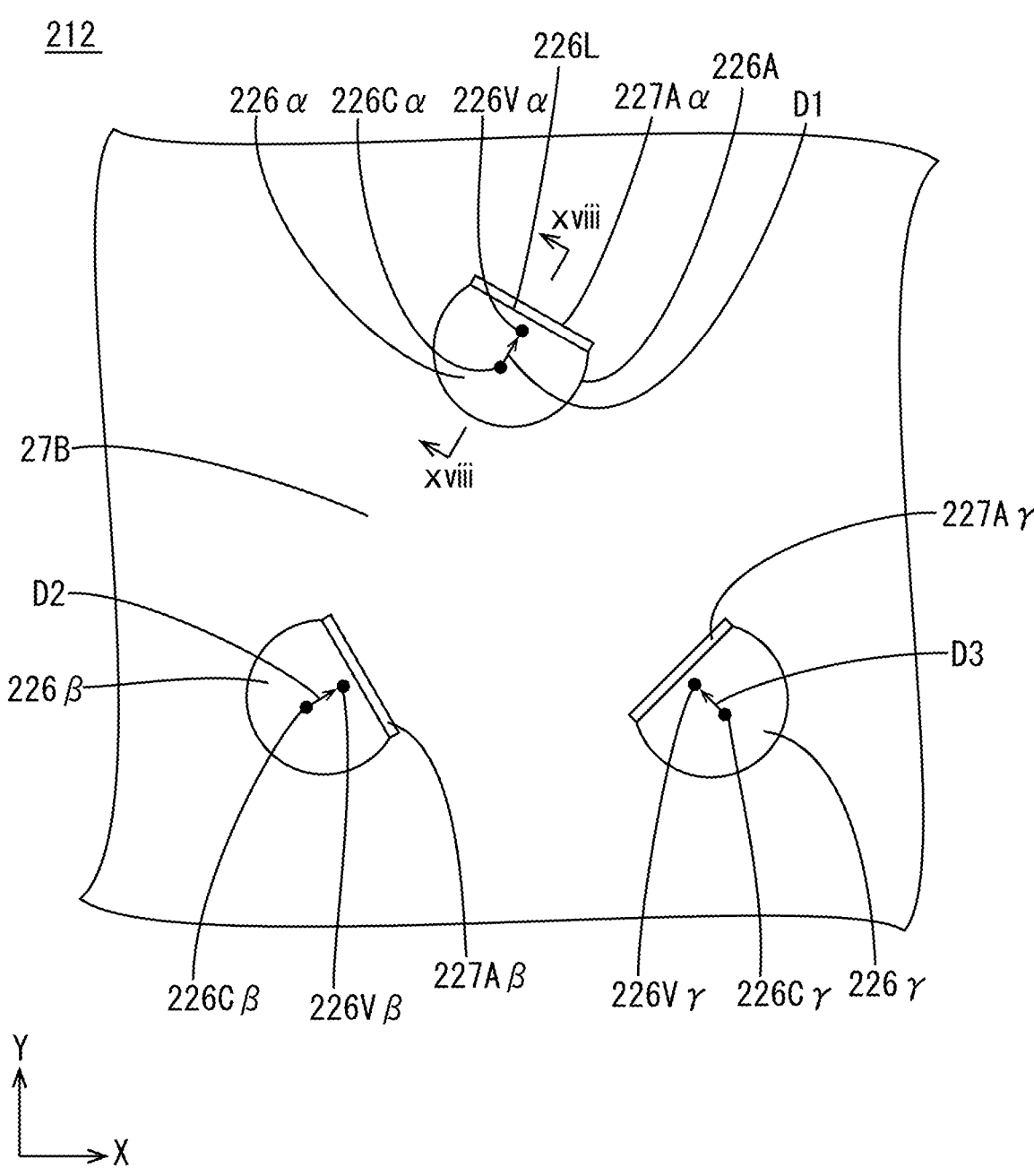
FIG. 17 is a plan view illustrating protrusion portions according to a third embodiment.
Figure 18:
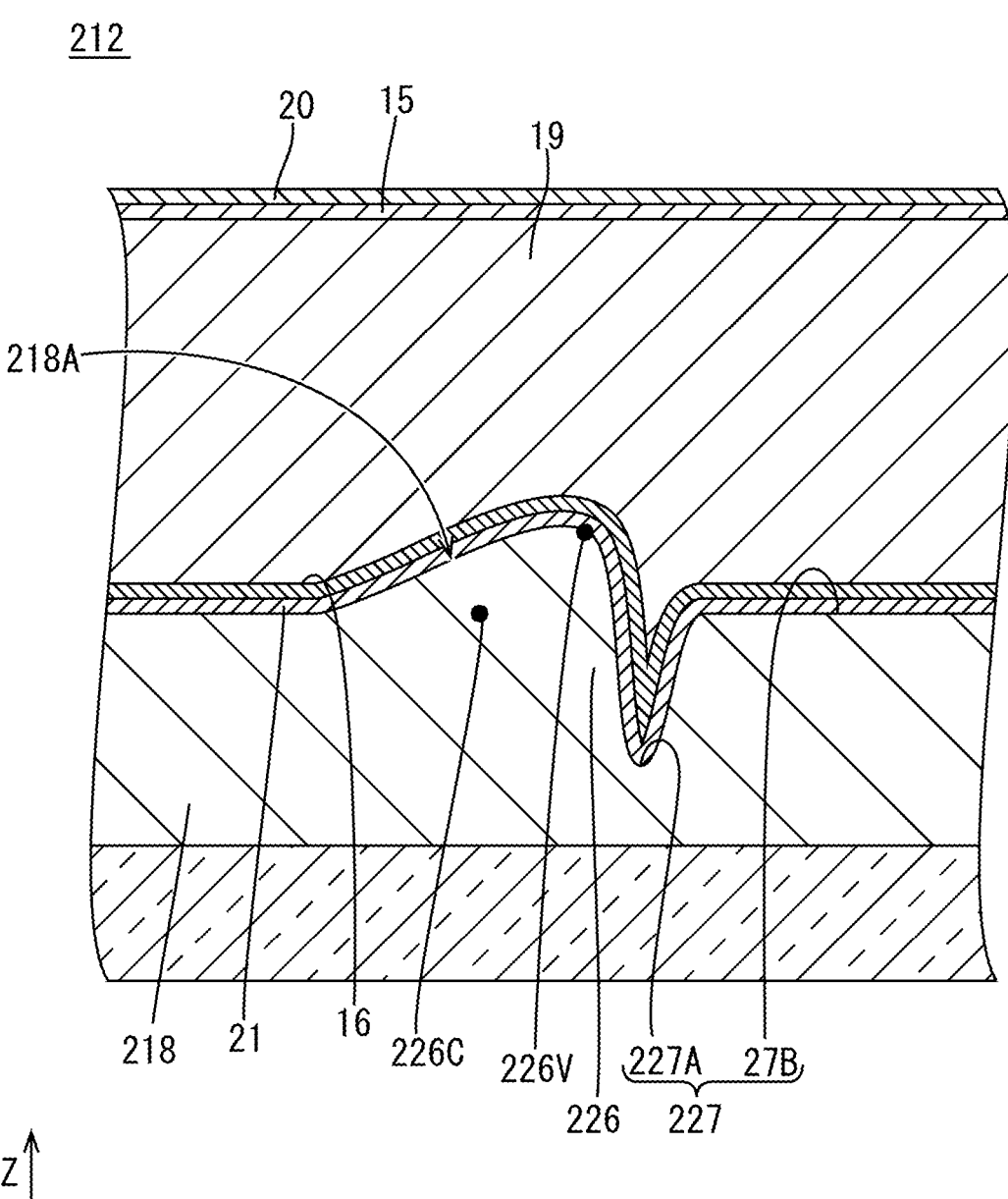
FIG. 18 is a cross-sectional view of an array substrate along line xviii-xviii in FIG. 17.

FIG. 17 is a plan view illustrating three projection portions 226. FIG. 18 is a cross-sectional view of an array substrate 212 taken along line xviii-xviii in FIG. 17. The projection portions 226 of a first insulation film 218 included in the array substrate 212 according to this embodiment have about a semi-circular plan view shape as illustrated in FIG. 17. The plan view outline shape of the projection portions 226 is defined by an arched portion 226A and a straight portion 226L. The arched portion 226A has a center angle of 180° or more. The straight portion 226L extends between the two ends of the arched portion 226A. The straight portion 226L that is a part of the outline of the projection portion 226 has a curvature radius that is infinite and greater than that of the arched portion 226A. The projection portion 226 includes the straight portion 226L, which has a large curvature radius, in a portion of the outline thereof. Therefore, as illustrated in FIGS. 17 and 18, the center of gravity 226C of the outline is farther away from the straight portion 226L toward the center of the arched portion 226A. As illustrated in FIGS. 17 and 18, the first recessed portions 227A (peripheral recessed portion) of the recessed portions 227 (recess) in the first insulation film 218 are adjacent to the respective straight portions 226L that are portions of the outlines of the projection portions 226. The first recessed portions 227A extend along the straight portions 226L and have a belt-like plan view shape having a predefined width.

A gray tone mask 260 that is used in the exposing step included in the second step of the method of producing an array substrate 212 will be described in with reference to FIG. 19. The configuration of the gray tone mask 260 is similar to that of the second embodiment. The configuration of the gray tone mask 260 that differs from that of the second embodiment will be described. FIG. 19 is a plan view of the gray tone mask 260 that is used in the exposing step. As illustrated in FIG. 19, the gray tone mask 260 includes light blocking sections 60LS that blocks the exposure light, transmitting sections that transmit the exposure light, first semi-transmitting sections 260HT1 (peripheral semi-transmitting section) that transmit some of the exposure light rays, and second semi-transmitting sections 260HT2 (semi-transmitting section) that transmit some of the exposure light rays at transmittance lower than that of the first semi-transmitting sections 260HT1. The light blocking section 260LS, the first semi-transmitting section 260HT1, and the second semi-transmitting section 260HT2 are illustrated with different types of shading in FIG. 19. The light blocking sections 260LS have a semi-circular shape that is same as the plan view shape of the projection portions 226. The first semi-transmitting sections 260HT1 are adjacent to portions of outer peripheries of the light blocking sections 260LS, respectively. The first semi-transmitting sections 260HT1 have a belt-like plan view shape that has a predefined width and corresponds to the plan view shape of the first recessed portions 227A.

Figure 19:
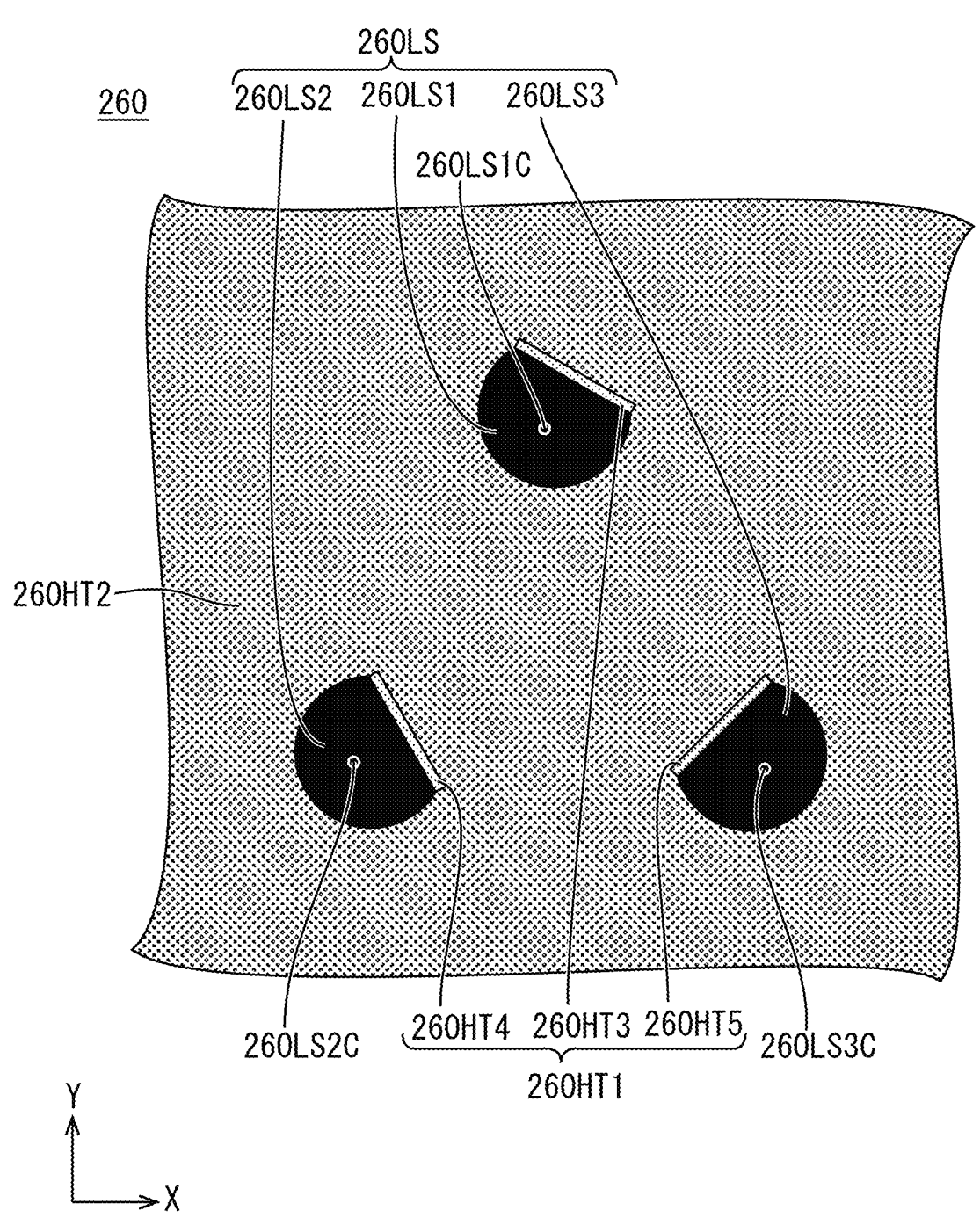
FIG. 19 is a plan view illustrating a gray tone mask that is used in the exposing process.

As illustrated in FIG. 19, the light blocking sections 260LS include a first light blocking section 260LS1, a second light blocking section 260LS2, and a third light blocking section 260LS3. The first light blocking section 260LS1 is disposed to overlap the portion of the first insulation film 218 where a first projection portion 226α is to be formed. The second light blocking section 260LS2 is disposed to overlap the portion of the first insulation film 218 where a second projection portion 226β is to be formed. The third light blocking section 260LS3 is disposed to overlap the portion of the first insulation film 218 where the third projection portion 226γ is to be formed.

The first semi-transmitting sections 260HT1 include a fifth semi-transmitting section 260HT3 (first peripheral semi-transmitting section), a sixth semi-transmitting section 260HT4 (second peripheral semi-transmitting section), and a seventh semi-transmitting section 260HT5 (third peripheral semi-transmitting section). The fifth semi-transmitting section 260HT3 is disposed to overlap the portion of the first insulation film 218 where a third recessed portion 227Aα (first peripheral recessed portion) is to be formed. The sixth semi-transmitting section 260HT4 is disposed to overlap the portion of the first insulation film 218 where a fourth recessed portion 227Aβ (second peripheral recessed portion) is to be formed. The seventh semi-transmitting section 260HT5 is disposed to overlap the portion of the first insulation film 218 where a fifth recessed portion 227Aγ (third peripheral recessed portion) is to be formed. The direction in which the line extends from the center of gravity 260LS1C of the outline of the first light blocking section 260LS1 toward a middle position of the fifth semi-transmitting section 260HT3 with respect to the circumferential direction, the direction in which the line extends from the center of gravity 260LS2C toward a middle position of the sixth semi-transmitting section 260HT4 with respect to circumferential direction, and the direction in which the line extends from the center of gravity 260LS3C toward a middle position of the seventh semi-transmitting section 260HT5 with respect to the circumferential direction cross each other.

Fourth Embodiment

A fourth embodiment will be described with reference to FIGS. 20 to 23. In the fourth embodiment, the material of a first insulation film 318 differs from that of the first embodiment. Configurations, functions, and effects similar to those of the first embodiment may not be described. The material of the first insulation film 318 included in an array substrate 312 differs from that of the first insulation film 18 of the first embodiment; however, the projection portions and the recessed portions included in the surface of the first insulation film 318 have configurations similar to those of the projection portions 26 and the recessed portions 27 of the first embodiment.

Figure 20:
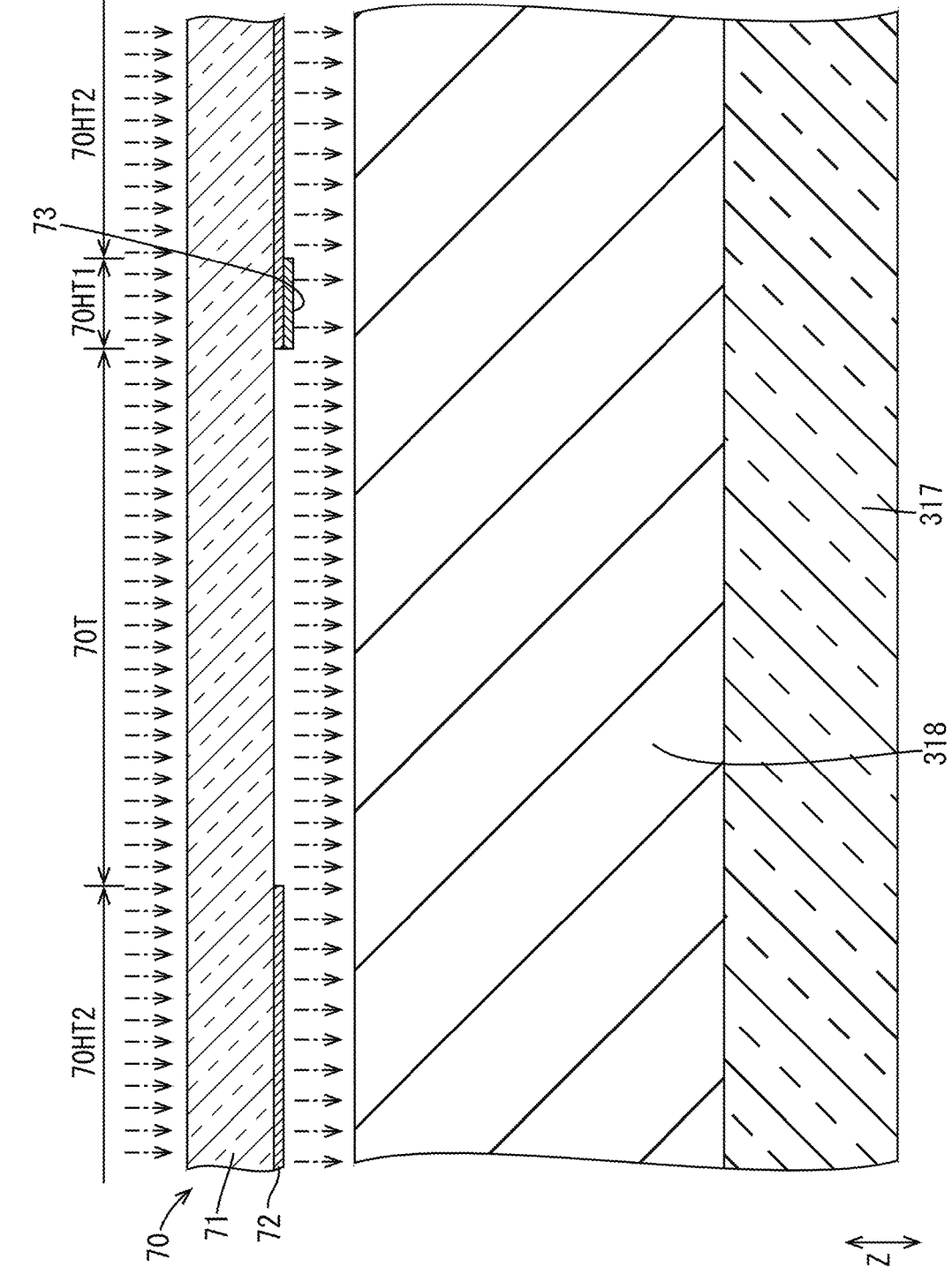
FIG. 20 is a cross-sectional view of the first insulation film cut along the same line as that in FIG. 5 and illustrates the first insulation film that is deposited through the depositing step is exposed to light via a second photomask in the exposing step.
Figure 21:
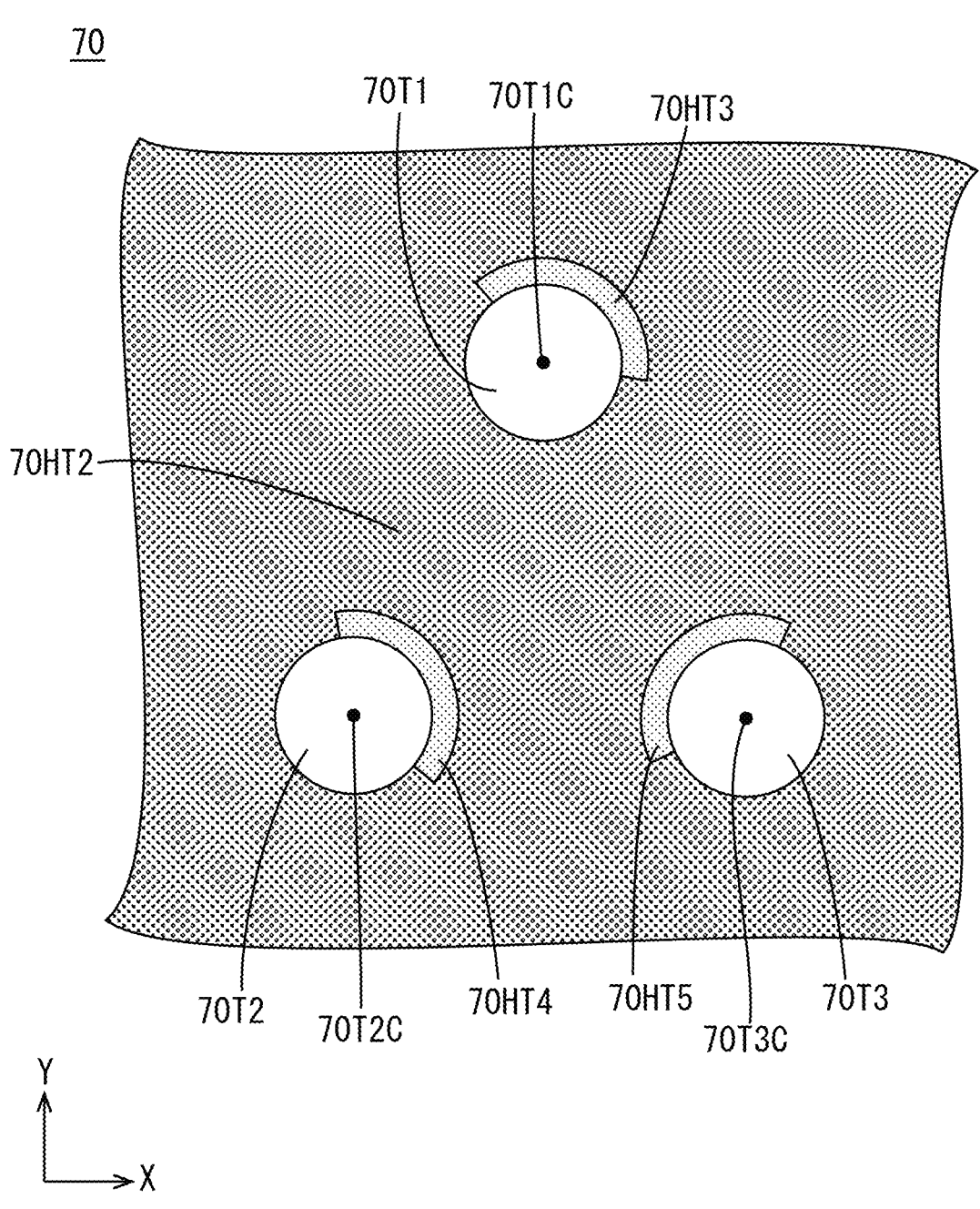
FIG. 21 is a plan view of a second photomask that is used in the exposing process.

FIG. 20 illustrates the first insulation film 318 that is deposited through the depositing step and exposed to light via a second photomask 70 in the exposing step and is a cross-sectional view of the first insulation film 318 cut along the same line as that in FIG. 5. FIG. 21 is a plan view of the second photomask 70 that is used in the exposing step. The first insulation film 318 included in the array substrate 312 of this embodiment is made of negative-type photosensitive resin material. The negative-type photosensitive resin material that is used for the first insulation film 318 decreases the dissolution rate with developing solution according to the amount of light exposure.

In the exposing step of the second step included in the method of producing the array substrate 312 that includes the first insulation film 318 made of negative-type photosensitive resin material, a second photomask 70 is used. The second photomask 70 will be described with reference to FIGS. 20 and 21. The second photomask 70 is a halftone mask similar to the first photomask 50 of the first embodiment. The second photomask 70 includes a base 71, a light blocking film, a first semi-transmitting film 72, and a second semi-transmitting film 73. The functions and transmittance of the films will not be described.

The second photomask 70 includes the light blocking film, the first semi-transmitting film 72, and the second semi-transmitting film 73 that are formed with patterning at the predefined distribution pattern within the surface area of the base 71. The light blocking film is provided to overlap and correspond to the portions of the first insulation film 318 where the first contact holes are to be formed. No light blocking film is provided in the portions of the second photomask 70 that overlap the portions of the first insulation film 318 where the projection portions and the recessed portions are to be formed.

The first semi-transmitting film 72 is provided in the portions of the second photomask 70 that overlap the portions of the first insulation film 318 where the recessed portions (327Aα, 327Aβ, 327Aγ, 327B) are to be formed and is not provided in the portions of the second photomask 70 that overlap the portions of the first insulation film 318 where the projection portions (326α, 326β, 326γ) are to be formed. The second semi-transmitting film 73 is provided in the portions of the second photomask 70 that overlap the portions of the first insulation film 318 where the first recessed portions (327Aα, 327Aβ, 327Aγ) are to be formed and is not provided in the portions of the second photomask 70 that overlap the portions of the first insulation film 318 where the projection portions and the second recessed portions (327B) are to be formed.

The light blocking film, the first semi-transmitting film 72, and the second semi-transmitting film 73 are not provided in the portions of the second photomask 70 that overlap the portions of the first insulation film 318 where the projection portions are to be formed. The portions of the second photomask 70 that do not include the light blocking film, the first semi-transmitting film 72, and the second semi-transmitting film 73 have a plan view circular shape and are arranged at intervals at random within the surface area of the base 71.

According to the pattern of the light blocking film, the first semi-transmitting film 72, and the second semi-transmitting film 73, the second photomask 70 includes transmitting sections 70T that transmit the exposure light, light blocking sections that blocks the exposure light, third semi-transmitting sections 70HT1 (peripheral semi-transmitting section) that transmit some of the exposure light rays, and fourth semi-transmitting sections 70HT2 (semi-transmitting section) that transmit some of the exposure light rays at transmittance higher than that of the first semi-transmitting sections 70HT1. An area of the transmitting sections 70LS corresponds to an area where the light blocking film, the first semi-transmitting films 72, and the second semi-transmitting films 73 are not formed. The light blocking section corresponds to an area where the light blocking film is formed. The third semi-transmitting sections 70HT1 are adjacent to portions of outer peripheries of the transmitting sections 70T, respectively. An area of the third semi-transmitting section 70HT1 corresponds to an area of the portions of the base 71 where the second semi-transmitting film 73 is formed. An area of the fourth semi-transmitting section 70HT2 corresponds to an area of the portions of the base 71 where the first semi-transmitting film 72 is formed and the second semi-transmitting film 73 is not formed.

Figure 22:
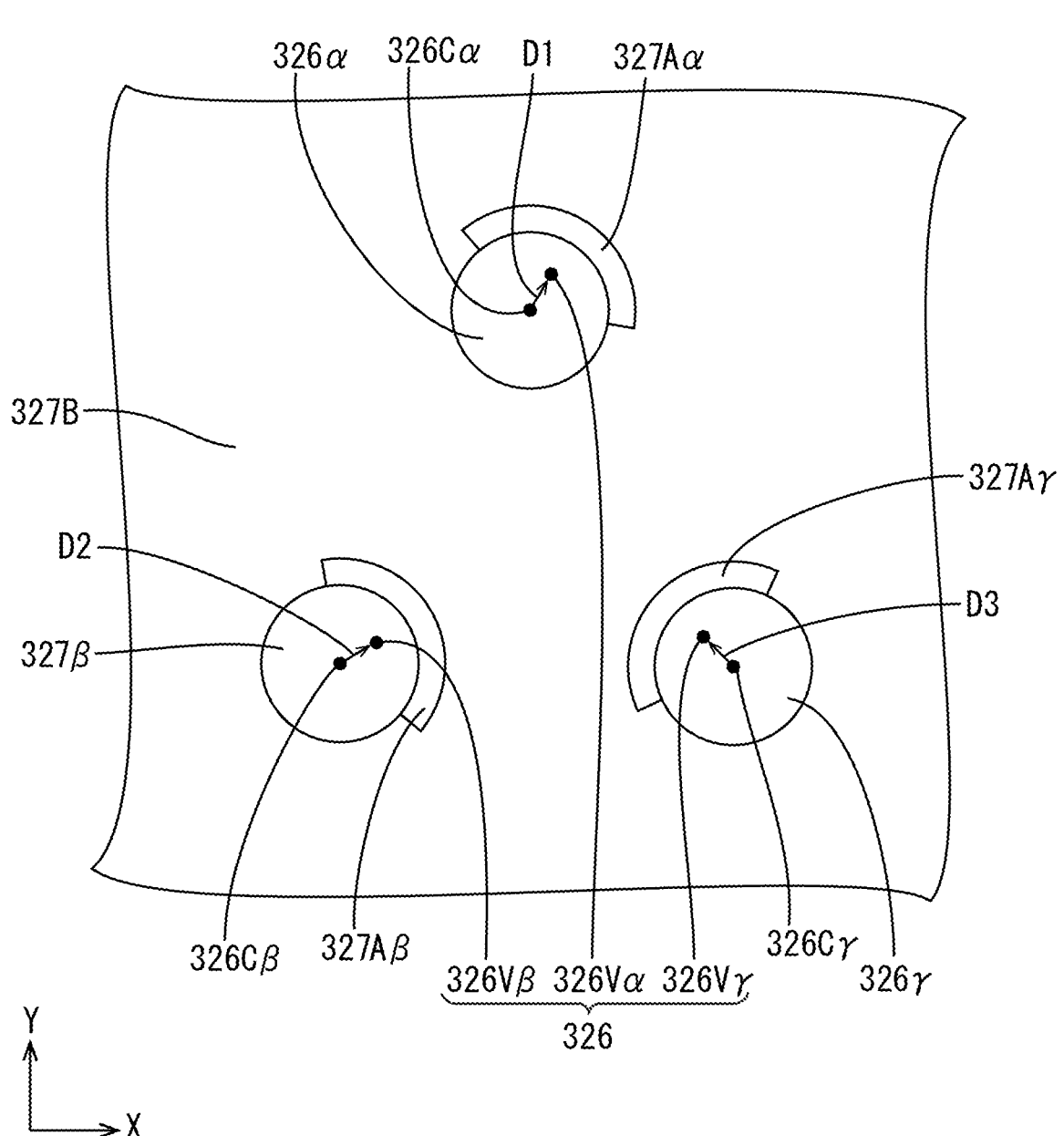
FIG. 22 is a plan view illustrating the projection portions.

The transmitting sections 70T and the third semi-transmitting sections 70HT1 of the second photomask 70 will be described in detail with reference to FIGS. 21 and 22. The transmitting sections 70T, the third semi-transmitting section 70HT1, and the fourth semi-transmitting section 70HT2 are illustrated with different types of shading in FIG. 21. FIG. 22 is a plan view illustrating three projection portions including a first projection portion 326α, a second projection portion 326β, and a third projection portion 326γ, a second recessed portion 327B (recessed portion), and three first recessed portions including a third recessed portion 327Aα (first peripheral recessed portion), a fourth recessed portion 327Aβ (second peripheral recessed portion), and a fifth recessed portion 327Aγ (third peripheral recessed portion).

As illustrated in FIG. 21, the transmitting sections 70T include a first transmitting section 70T1, a second transmitting section 70T2 that is disposed away from the first transmitting section 70T1, and a third transmitting section 70T3 that is away from the first transmitting section 70T1. As illustrated in FIGS. 21 and 22, the first transmitting section 70T1 is disposed to overlap the portion of the first insulation film 318 where the first projection portion 326α is to be formed. The second transmitting section 70T2 is disposed to overlap the portion of the first insulation film 318 where the second projection portion 326β is to be formed. The third transmitting section 70T3 is disposed to overlap the portion of the first insulation film 318 where the third projection portion 326γ is to be formed.

As illustrated in FIG. 21, the third semi-transmitting sections 70HT1 (peripheral semi-transmitting sections) include an eighth semi-transmitting section 70HT3 (first peripheral semi-transmitting section), a ninth semi-transmitting section 70HT4 (second peripheral semi-transmitting section), and a tenth semi-transmitting section 70HT5 (third peripheral semi-transmitting section). The eighth semi-transmitting section 70HT3 is adjacent to a portion of a periphery of the first transmitting section 70T1. The ninth semi-transmitting section 70HT4 is adjacent to a portion of a periphery of the second transmitting section 70T2. The tenth semi-transmitting section 70HT5 is adjacent to a portion of a periphery of the third light blocking section 70T3.

As illustrated in FIGS. 21 and 22, the eighth semi-transmitting section 70HT3 (first peripheral semi-transmitting section) is disposed to overlap the portion of the first insulation film 318 where the third recessed portion 327Aα (first peripheral recessed portion) is to be formed. The ninth semi-transmitting section 70HT4 (second peripheral semi-transmitting section) is disposed to overlap the portion of the first insulation film 318 where the fourth recessed portion 327Aβ (second peripheral recessed portion) is to be formed. The tenth semi-transmitting section 70HT5 (third peripheral semi-transmitting section) is disposed to overlap the portion of the first insulation film 318 where the fifth recessed portion 327Aγ (third peripheral semi-transmitting section) is to be formed. The direction in which the line extends from the center of gravity 70T1C of the outline of the first transmitting section 70T1 toward a middle position of the eighth semi-transmitting section 70HT3 with respect to the circumferential direction, the direction in which the line extends from the center of gravity 70T2C of the outline of the second transmitting section 70T2 toward a middle position of the ninth semi-transmitting section 70HT4 with respect to the circumferential direction, and the direction in which the line extends from the center of gravity 70T3C toward a middle position of the tenth semi-transmitting section 70HT5 with respect to the circumferential direction cross each other.

In the exposing step, as illustrated in FIG. 20, the exposure light emitted by the light source of the exposing device is supplied to the first insulation film 318 through the second photomask 70 having the above configuration. Accordingly, the first insulation film 318 is selectively exposed to light. Specifically, the portions of the first insulation film 318 that overlap the transmitting sections 70T of the second photomask 70 are exposed to light through an entire depth. The portions of the first insulation film 318 that overlap the third semi-transmitting sections 70HT1 are exposed to light with the exposure light amount greater than that of the exposure light supplied to the portions of the first insulation film 318 overlapping the light blocking sections but smaller than that of the exposure light supplied to the portions of the first insulation film 318 overlapping the fourth semi-transmitting sections 70HT2. The portions of the first insulation film 318 overlapping the fourth semi-transmitting sections 70HT2 are exposed to light with the exposure light amount smaller than that of the exposure light supplied to the portions of the first insulation film 318 overlapping the transmitting sections 70T but greater than that of the exposure light supplied to the portions of the first insulation film 318 overlapping the third semi-transmitting sections 70HT1. The portions of the first insulation film 318 overlapping the light blocking sections of the second photomask 70 are not exposed to light.

Figure 23:
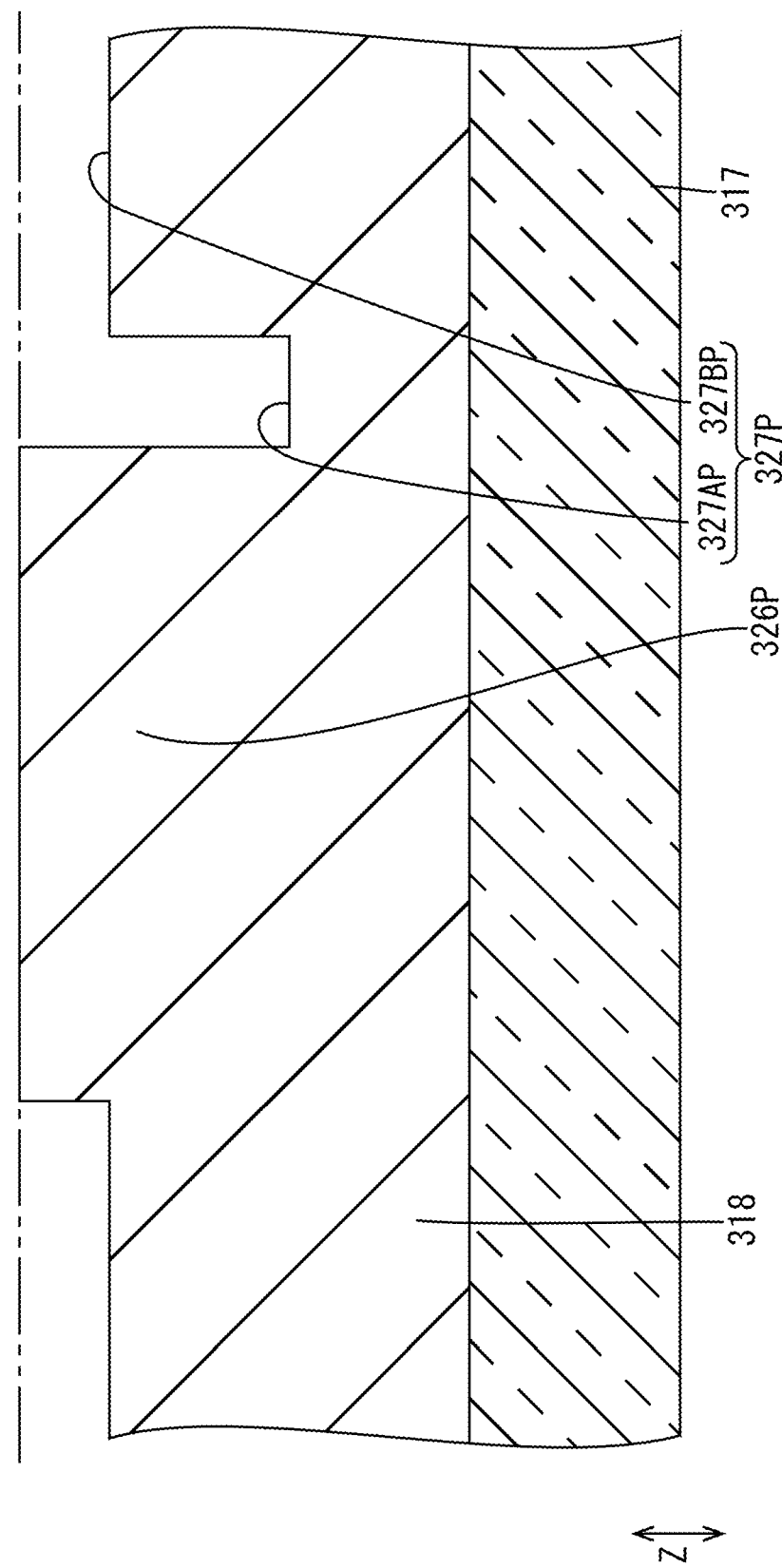
FIG. 23 is a cross-sectional view taken along a line same as that in FIG. 5 and illustrates the first insulation film that is developed in the developing step.

In the developing step, the first insulation film 318 that is selectively exposed to light in the exposing step is developed with developing solution. As illustrated in FIG. 23, the portions of the first insulation film 318 are removed with a greater depth as the amount of exposure light decreases. The portions of the first insulation film 318 that are exposed to light with the predefined amount of exposure light or greater are not removed and remain. FIG. 23 illustrates the first insulation film 318 that is developed in the developing step and is a cross-sectional view taken along a line same as that in FIG. 5.

Specifically, through the developing, the portions of the first insulation film 318 overlapping the transmitting sections 70T of the second photomask 70 remain with the entire thickness and are configured as pre-projection portions 326P that are to be the projection portions including the first projection portion 326α, the second projection portion 326β, and the third projection portion 326γ. Upper portions of the portions of the first insulation film 318 overlapping the third semi-transmitting sections 70HT1 and the fourth semi-transmitting sections 70HT2 are removed and lower portions thereof remain.

The upper portions of the portions of the first insulation film 318 overlapping the third semi-transmitting sections 70HT1 are removed with a greater depth than those of the portions of the first insulation film 318 overlapping the fourth semi-transmitting sections 70HT2. Accordingly, pre-first recessed portions 327AP (pre-peripheral recessed portion) that are to be the first recessed portions (peripheral recessed portions), which include the third recessed portion 327Aα, the fourth recessed portion 327Aβ, and the fifth recessed portion 327Aγ, are formed. The upper portions of the portions of the first insulation film 318 overlapping the fourth semi-transmitting sections 70HT2 are removed with a smaller depth than those of the portions of the first insulation film 318 overlapping the third semi-transmitting sections 70HT1. Accordingly, pre-second recessed portions 327BP (pre-recessed portions) that are to be the second recessed portions 327B (recessed portions) are formed. As illustrated in FIG. 23, the pre-first recessed portions 327AP are deeper than the pre-second recessed portions 327BP. The portions of the first insulation film 318 overlapping the light blocking sections of the second photomask 70 are removed with the entire thickness and the first contact holes are formed.

More in detail, the portion of the first insulation film 318 overlapping the first transmitting section 70T1 is configured as a pre-first projection portion to be the first projection portion 326α (refer to FIGS. 21 and 22). The portion of the first insulation film 318 overlapping the second transmitting section 70T2 is configured as a pre-second projection portion to be the second projection portion 326β. The portion of the first insulation film 318 overlapping the third transmitting section 70T3 is configured as a pre-third projection portion to be the third projection portion 326γ. The portion of the first insulation film 318 overlapping the eighth semi-transmitting section 70HT3 is to be configured as a pre-third recessed portion to be the third recessed portion 327Aα. The portion of the first insulation film 318 overlapping the ninth semi-transmitting section 70HT4 is configured as a pre-fourth recessed portion to be the fourth recessed portion 327Aβ. The portion of the first insulation film 318 overlapping the tenth semi-transmitting section 70HT5 is configured as a pre-fifth recessed portion to be the fifth recessed portion 327Aγ.

Before the heat treatment step, the directions in which the lines extend from the centers of gravity of the outlines of the pre-first projection portion, the pre-second projection portion, and the pre-third projection portion toward middle positions of the pre-first recessed portion, the pre-second recessed portion, and the pre-third recessed portion with respect to the circumferential direction, respectively, cross each other (refer to FIG. 22). The relation of the directions is similar to that in the above embodiments.

As illustrated in FIG. 23, after the developing step, the portions of the first insulation film 318 that are the pre-projection portions 326P and to be configured as the projection portions have a circular columnar shape having a constant diameter in a height direction. The portions of the first insulation film 318 that are the pre-projection portions 326P and to be configured as the projection portions have flat top surfaces and peripheral surfaces (side surfaces) that extend in the Z-axis direction. The portions of the first insulation film 318 that are the pre-recessed portions 327P and to be configured as the recessed portions have flat bottom surfaces and side surfaces that extend in the Z-axis direction.

Then, with the heat treatment step being performed, the first insulation film 318 is deformed and heat sagging occurs in the first insulation film 318. The portions (the pre-projection portions 326P) of the first insulation film 318 that are to be configured as the projection portions are deformed such that the top surfaces and the side surfaces of the portions (the pre-projection portions 326P) have round shapes. Thus, the mountain shaped projection portions are obtained (refer to FIG. 10). Similarly, the portions (the pre-recessed portions 327P) of the first insulation film 318 that are to be configured as the recessed portions are deformed such that the bottom surfaces and the side surfaces of the portions (the pre-recessed portions 327P) have round shapes. Thus, the recessed portions are obtained. After the third step and the fourth step are performed subsequent to the second step, the electrically conductive layer and the reflection film are formed. The reflection film has an uneven surface that conforms to an uneven surface of the first insulation film 318 that is disposed in a lower layer than the reflection film.

In the method of producing the array substrate 312 according to this embodiment, the first insulation film 318 made of negative-type photosensitive resin material is deposited on the substrate 317 and exposed to light via the second photomask 70 and developed. The developed first insulation film 318 is subjected to the heat treatment and the reflection film is deposited on the first insulation film 318. The second photomask 70 includes the transmitting sections 70T that transmit light, the third semi-transmitting sections 70HT1 that are adjacent to portions of peripheries of the transmitting sections 70T, respectively, and transmit the light and have light transmittance lower than that of the transmitting sections 70T, and the fourth semi-transmitting sections 70HT2 that surround the transmitting sections 70T and the third semi-transmitting sections 70HT1, respectively, and have light transmittance lower than that of the transmitting sections 70T and higher than that of the third semi-transmitting sections 70HT1.

By developing the first insulation film 318, the portions of the first insulation film 318 overlapping the transmitting sections 70T are deformed and configured as the pre-projection portions 326P, the portions of the first insulation film 318 overlapping the third semi-transmitting sections 70HT1 are deformed and configured as the pre-first recessed portions 327AP, and the portions of the first insulation film 318 overlapping the fourth semi-transmitting sections 70HT2 are deformed and configured as the pre-second recessed portions 327BP that are shallower than the pre-first recessed portions 327AP and thus, the uneven surface is formed on the surface of the first insulation film 318.

By performing the heat treatment to the first insulation film 318 that is developed, the pre-projection portions 326P are deformed to be inclined with respect to the normal direction of the surface of the substrate 317 and the tops 326V of the inclined projection portions are positioned closer to the pre-first recessed portions 327AP. Thus, the projection portions and the recessed portions are formed on the surface of the first insulation film 318. The reflection film that reflects light is disposed in an upper layer than the first insulation film 318.

After forming the first insulation film 318, which is made of negative-type photosensitive insulating material, on the substrate 317, the first insulation film 318 is exposed to light via the second photomask 70. With the first insulation film 318 made of negative-type photosensitive insulating material being exposed to light via the second photomask 70, the portions of the first insulation film 318 that overlap the third semi-transmitting sections 70HT1 are exposed to light with the light amount smaller than that of the exposure light supplied to the portions of the first insulation film 318 overlapping the fourth semi-transmitting sections 70HT2, and the light amount supplied to the portions of the first insulation film 318 overlapping the transmitting sections 70T is greatest.

With the first insulation film 318 being developed, the uneven surface is formed on the surface of the first insulation film 318. The portions of the first insulation film 318 overlapping the transmitting sections 70T are configured as the pre-projection portions 326P on the surface of the first insulation film 318. The portions of the first insulation film 318 overlapping the third semi-transmitting sections 70HT1 are configured as the pre-first recessed portions 327AP on the surface of the first insulation film 318. The pre-first recessed portion 327AP is adjacent to a portion of the periphery of the pre-projection portion 326P. The portions of the first insulation film 318 overlapping the fourth semi-transmitting sections 70HT2 are configured as the pre-second recessed portions 327BP on the surface of the first insulation film 318. The pre-second recessed portion 327BP surrounds the pre-projection portion 326P and the pre-first recessed portion 327AP.

With the developed first insulation film 318 being subjected to the heat treatment, the first insulation film 318 is deformed and heat sagging occurs in the first insulation film 318. The pre-first recessed portion 327AP that is adjacent to the portion of the periphery of the pre-projection portion 326P is deeper than the pre-second recessed portion 327BP that surrounds the pre-projection portion 326P and the pre-first recessed portion 327AP. Therefore, according to the performance of the heat treatment, the pre-projection portion 326P is deformed to be inclined with respect to the normal direction of the surface of the substrate 317 such that the top 326V is positioned closer to the pre-first recessed portion 327AP. Thus, the uneven surface is formed on the surface of the first insulation film 318. The uneven surface of the first insulation film 318 has a similar shape as that of the uneven surface 18A of the first embodiment. The reflection film is disposed in an upper layer than the first insulation film 318 that is subjected to the heat treatment. The light reflection occurs at the surface of the reflection film that conforms to the uneven surface of the first insulation film 318. With the projection portions inclined as described above being included on the uneven surface after the heat treatment, the light rays reflecting off the reflection film travel in the directions that are different from the regular reflecting direction.

As described before, with using the second photomask 70 in exposing the first insulation film 318 to light, the projection portions (326α, 326β, 326γ) that are inclined as described above are formed on the first insulation film 318. Therefore, a special exposing device and a special substrate support device need not be prepared. The array substrate 312 can be produced with using a generally used producing device in the exposing step and the heat treatment step. Furthermore, the inclination of the projection portions (326α, 326β, 326γ) can be freely determined based on the pattern design of the second photomask 70. This increases variation in the design of the projection portions. According to this embodiment, the array substrate 312 can be produced with using a generally used producing device.

The first insulation film 318 is exposed to light via the second photomask 70. The second photomask 70 includes the transmitting sections 70T including the first transmitting section 70T1, the second transmitting section 70T2 and the third transmitting section 70T3 that are adjacent to and away from the first transmitting section 70T1, and the third semi-transmitting sections 70HT1 including the eighth semi-transmitting section 70HT3 that is adjacent to a portion of the periphery of the first transmitting section 70T1, the ninth semi-transmitting sections 70HT4 that is adjacent to a portion of the periphery of the second transmitting section 70T2, and the tenth semi-transmitting section 70HT5 that is adjacent to a portion of the periphery of the third transmitting section 70T3. In the second photomask 70, the direction in which the line extends from the center of gravity 70T1C of the outline of the first transmitting section 70T1 toward a middle position of the eighth semi-transmitting section 70HT3 with respect to the circumferential direction extends, the direction in which the line extends from the center of gravity 70T2C of the outline of the second transmitting section 70T2 toward a middle position of the ninth semi-transmitting section 70HT4 with respect to the circumferential direction extends, and the direction in which the line extends from the center of gravity 70T3C of the outline of the third transmitting section 70T3 toward a middle position of the tenth semi-transmitting section 70HT5 with respect to the circumferential direction cross each other.

By developing the first insulation film 318 that is exposed to light, the uneven surface is formed on the surface of the first insulation film 318. Through the developing of the first insulation film 318, the portion of the first insulation film 318 overlapping the first transmitting section 70T1 is configured as a pre-first projection portion to be the first projection portion 326α, the portion of the first insulation film 318 overlapping the second transmitting section 70T2 is configured as a pre-second projection portion to be the second projection portion 326β that is adjacent to and away from the first projection portion 326α, the portion of the first insulation film 318 overlapping the third transmitting section 70T3 is configured as a pre-third projection portion to be the third projection portion 326γ that is adjacent to and away from the first projection portion 326α, the portion of the first insulation film 318 overlapping the eighth semi-transmitting section 70HT3 is configured as a pre-third recessed portion (pre-first peripheral recessed portion) to be the third recessed portion 327Aα, the portion of the first insulation film 318 overlapping the ninth semi-transmitting section 70HT4 is configured as a pre-fourth recessed portion (pre-second peripheral recessed portion) to be the fourth recessed portion 327Aβ, the portion of the first insulation film 318 overlapping the tenth semi-transmitting section 70HT5 is configured as a pre-fifth recessed portion (a pre third peripheral recessed portion) to be the fifth recessed portion 327Aγ, and the portion of the first insulation film 318 overlapping the fourth semi-transmitting sections 70HT2 is configured as the pre-second recessed portion 327BP (prerecessed portion) that is shallower than the pre-third recessed portion, the pre-fourth recessed portion, and the pre-fifth recessed portion.

By performing the heat treatment to the first insulation film 318 that is through the developing step, the pre-first projection portion is deformed to be inclined with respect to the normal direction of the surface of the substrate 317 and the first top of the inclined pre-first projection portion is positioned closer to the pre-third recessed portion, the pre-second projection portion is deformed to be inclined with respect to the normal direction of the substrate 317 and the second top of the inclined pre-second projection portion is positioned closer to the pre-fourth recessed portion, and the pre-third projection portion is deformed to be inclined with respect to the normal direction of the substrate 317 and the third top of the inclined pre-third projection portion is positioned closer to the pre-fifth recessed portion.

With the first insulation film 318 that is made of the negative-type photosensitive insulating material being exposed to light via the second photomask 70, the portions of the first insulation film 318 that overlap the eighth semi-transmitting section 70HT3, the ninth semi-transmitting section 70HT4, and the tenth semi-transmitting sections 70HT5, which are included in the third semi-transmitting sections 70HT1, are exposed to light with the exposure light amount smaller than that of the exposure light supplied to the portions of the first insulation film 318 overlapping the fourth semi-transmitting sections 70HT2. The exposure light amount supplied to the portions of the first insulation film 318 that overlap the first transmitting section 70T1, the second transmitting section 70T2, and the third transmitting section 70T3, which are included in the transmitting sections 70T, is greatest.

With the first insulation film 318 being developed, the portion of the first insulation film 318 overlapping the first transmitting section 70T1 is configured as the pre-first projection portion to be the first projection portion 326α, the portion of the first insulation film 318 overlapping the second transmitting section 70T2 is configured as the pre-second projection portion to be the second projection portion 326β, and the portion of the first insulation film 318 overlapping the third transmitting section 70T3 is configured as the pre-third projection portion to be the third projection portion 326γ. The pre-second projection portion and the pre-third projection portion are away from the pre-first projection portion. The portion of the first insulation film 318 overlapping the eighth semi-transmitting section 70HT3 is configured as the pre-third recessed portion to be the third recessed portion 327Aα, the portion of the first insulation film 318 overlapping the ninth semi-transmitting section 70HT4 is configured as the pre-fourth recessed portion to be the fourth recessed portion 327Aβ, and the portion of the first insulation film 318 overlapping the tenth semi-transmitting section 70HT5 is configured as the pre-fifth recessed portion to be the fifth recessed portion 327Aγ. After the developing step, the direction in which the line extends from the center of gravity of the outline of the pre-first projection portion toward a middle position of the pre-third recessed portion with respect to the circumferential direction, the direction in which the line extends from the center of gravity of the outline of the pre-second projection portion toward a middle position of the pre-fourth recessed portion with respect to the circumferential direction, and the direction in which the line extends from the center of gravity of the outline of the pre-third projection portion toward a middle position of the pre-fifth recessed portion with respect to the circumferential direction cross each other.

With the heat treatment being performed to the first insulation film 318 that is developed, the pre-first projection portion, the pre-second projection, and the pre-third projection are deformed to be inclined with respect to the normal direction of the surface of the substrate 317. After the heat treatment, the tops 326Vα, 326Vβ, 326Vγ of the first projection portion 326α, the second projection portion 326β, and the third projection portion 326γ are positioned closer to the third recessed portion 327Aα, the pre-fourth recessed portion 327Aβ, and the pre-fifth recessed portion 327Aγ, respectively. Accordingly, the first projection portion 326α, the second projection portion 326β, and the third projection portion 326γ are inclined in different directions.

The reflection film disposed on the first insulation film 318 that is subjected to the heat treatment has an uneven surface that follows the uneven surface of the first insulation film 318. The light reflection occurs at the uneven surface of the reflection film. Since the first projection portion 326α, the second projection portion 326β, and the third projection portion 326γ that are inclined in the different directions are included on the uneven surface of the first insulation film 318, the light rays reflecting off the reflection film can travel effectively in various directions.

The second photomask 70 includes the transmitting sections 70T that have a circular plan view shape and the third semi-transmitting sections 70HT1 that are adjacent to the transmitting sections 70T, respectively. The third semi-transmitting section 70HT1 extends in an area corresponding to a half or less of the periphery of the transmitting section 70T. The first insulation film 318 is exposed to light via such a second photomask 70.

After the exposing, with the first insulation film 318 being developed, the pre-projection portions 326P, the pre-first recessed portions 327AP each of which extends adjacent to the pre-projection portion 326P and extends in an area corresponding to a half or less of the periphery of the pre-projection portion 326P, and the pre-second recessed portions 327BP that surround the pre-projection portions 326P and the pre-first recessed portions 327AP are formed.

With the developed first insulation film 318 being subjected to the heat treatment, the first recessed portions (327Aα, 327Aβ, 327Aγ) that are deeper than the second recessed portions (327Bα, 327Bβ, 327Bγ) are formed adjacent to the projection portions 326 (326α, 326β, 326γ), respectively, to extend in an area corresponding to a half or less of the periphery of the projection portion (326α, 326β, 326γ). Therefore, the projection portions 326 are inclined with respect to the normal direction of the surface of the substrate 317 with high reliability such that the tops 326V are positioned closer to the first recessed portions (327Aα, 327Aβ, 327Aγ), respectively. The inclination direction of the projection portions (326α, 326β, 326γ) can be easily controlled.

Fifth Embodiment

A fifth embodiment will be described with reference to FIGS. 24 and 25. In the fifth embodiment, projection portions 426 have an outline that differs from that of the third embodiment. Configuration, functions, and effects similar to those of the third embodiment may not be described.

Figure 24:
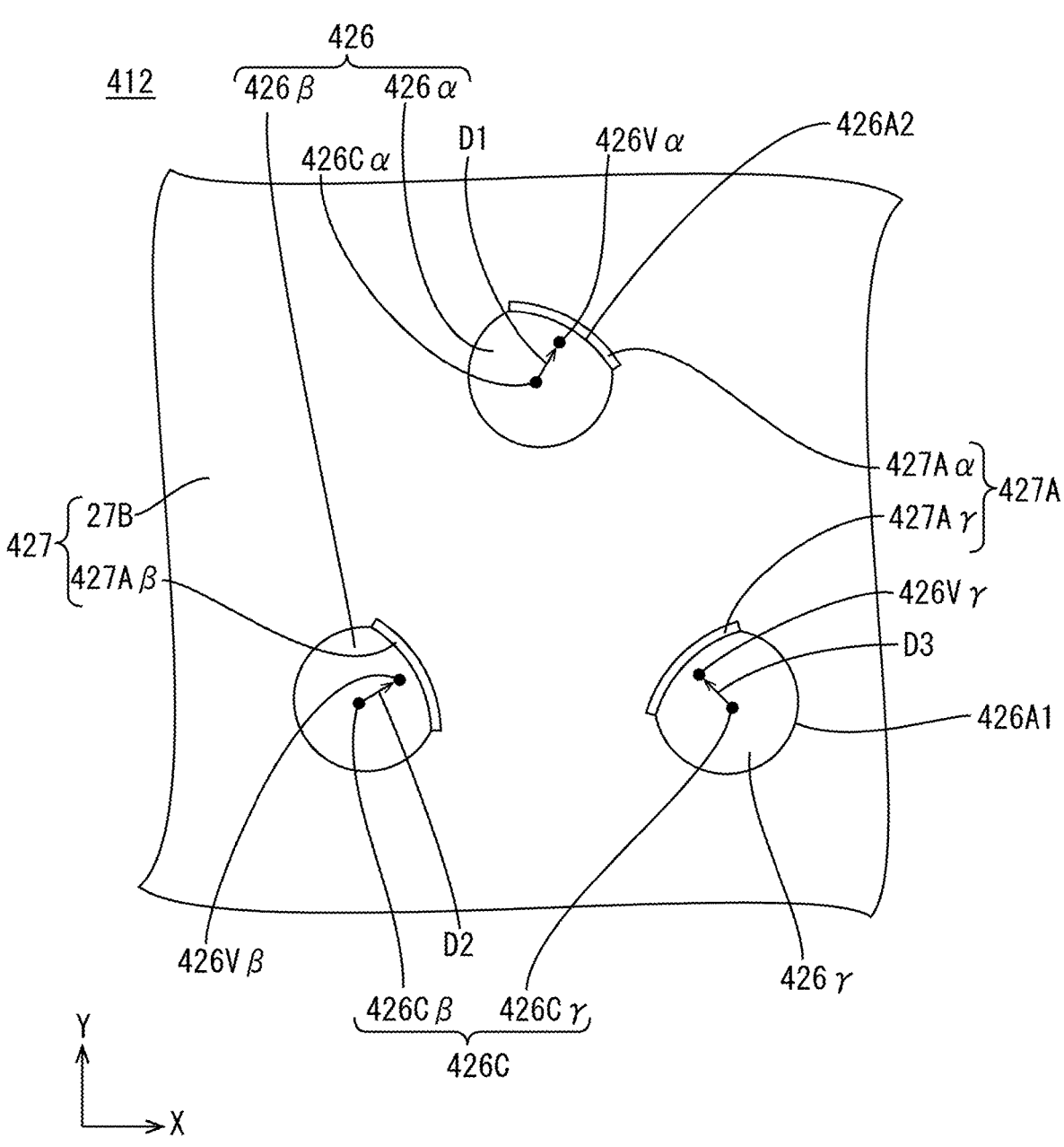
FIG. 24 is a plan view illustrating projection portions according to a fifth embodiment.

FIG. 24 is a plan view illustrating projection portions 426 of a first insulation film included in an array substrate 412 according to this embodiment. As illustrated in FIG. 24, the projection portions 426 have an outline shape that is defined by two arched portions 426A1, 426A2 having different curvature radius. The plan view outline shape of the projection portions 426 is defined by a first arched portion 426A1 and a second arched portion 426A2. The first arched portion 426A1 has a center angle of 180° or more. The second arched portion 426A2 extends between the two ends of the first arched portion 426A1. The second arched portion 526A2 that is a part of the outline of the projection portion 426 has a curvature radius that is greater than that of the first arched portion 426A1. The projection portion 426 includes the second arched portion 426A2, which has a large curvature radius, in a portion of the outline thereof. Therefore, as illustrated in FIG. 24, the center of gravity 426C of the outline is farther away from the second arched portion 426A2 toward the center of the first arched portion 426A1. First recessed portions 427A of recessed portions 427 in the first insulation film are provided adjacent to the respective second arched portions 426A2 that are portions of the outlines of the projection portions 426. The first recessed portions 427A extend along the second arched portions 426A2 and have an arched plan view shape having a predefined width.

A gray tone mask 460 that is used in the exposing step included in the second step of the method of producing the array substrate 412 will be described in with reference to FIG. 25. FIG. 25 is a plan view of the gray tone mask 460 that is used in the exposing step. As illustrated in FIG. 25, the gray tone mask 460 includes light blocking sections 460LS that blocks the exposure light, transmitting sections that transmit the exposure light, first semi-transmitting sections 460HT1 (peripheral semi-transmitting section) that transmit some of the exposure light rays, and second semi-transmitting sections 460HT2 (semi-transmitting section) that transmit some of the exposure light rays at transmittance lower than that of the first semi-transmitting sections 460HT1. The light blocking section 460LS, the first semi-transmitting section 460HT1, and the second semi-transmitting section 460HT2 are illustrated with different types of shading in FIG. 25. The light blocking sections 460LS have a plan view shape that is same as that of the projection portions 426. The first semi-transmitting sections 460HT1 are adjacent to portions of outer peripheries of the light blocking sections 460LS, respectively. The first semi-transmitting sections 460HT1 have an arched plan view shape that has a predefined width and corresponds to the plan view shape of the first recessed portions 427A.

Figure 25:
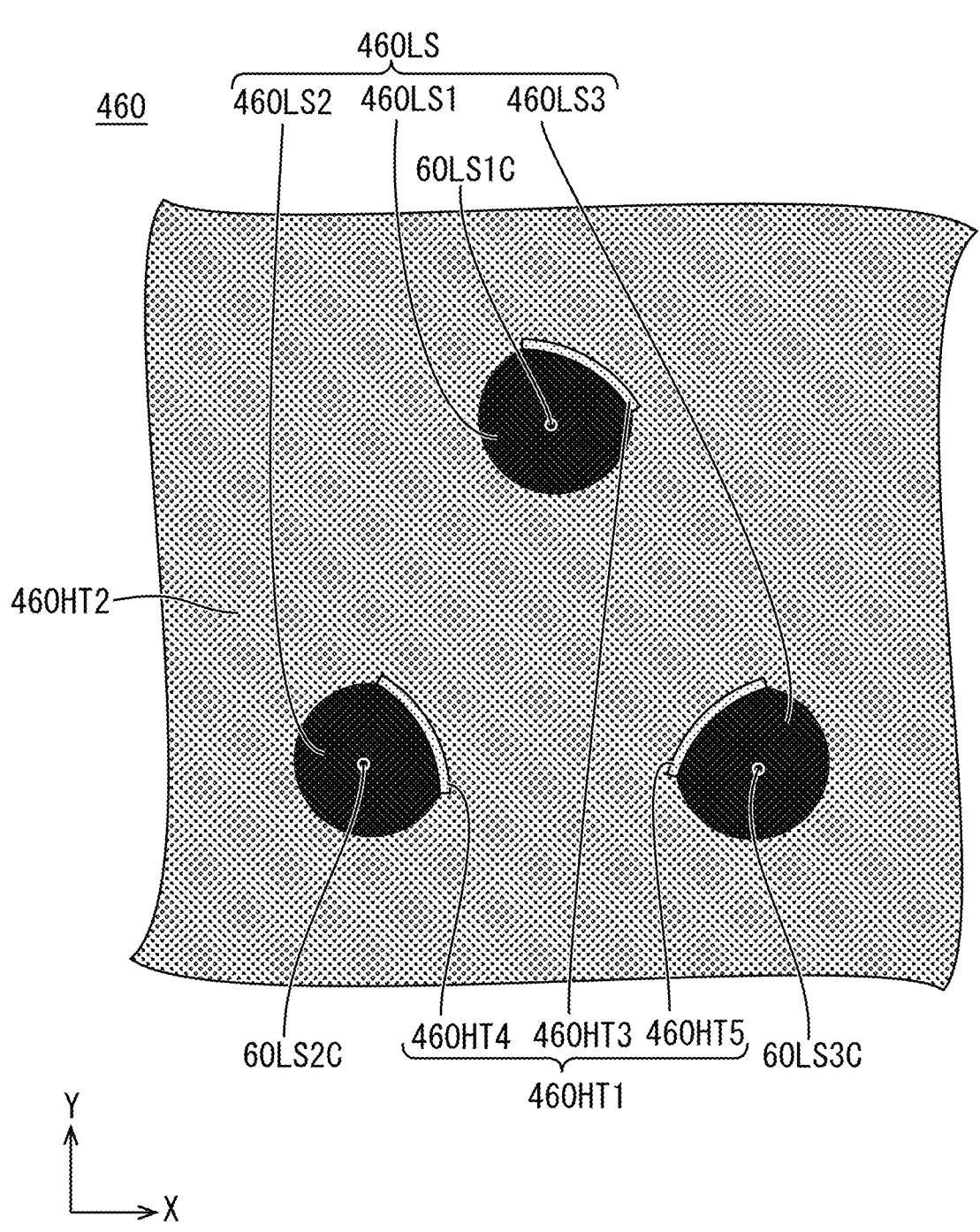
FIG. 25 is a plan view of a gray tone mask that is used in the exposing process.

As illustrated in FIG. 25, the light blocking sections 460LS include a first light blocking section 460LS1, a second light blocking section 460LS2, and a third light blocking section 460LS3. The first light blocking section 460LS1 is disposed to overlap the portion of the first insulation film where a first projection portion 426α is to be formed. The second light blocking section 460LS2 is disposed to overlap the portion of the first insulation film where a second projection portion 426β is to be formed. The third light blocking section 460LS3 is disposed to overlap the portion of the first insulation film where the third projection portion 426γ is to be formed.

The first semi-transmitting sections 460HT1 include a fifth semi-transmitting section 460HT3 (first peripheral semi-transmitting section), a sixth semi-transmitting section 460HT4 (second peripheral semi-transmitting section), and a seventh semi-transmitting section 460HT5 (third peripheral semi-transmitting section). The fifth semi-transmitting section 460HT3 is disposed to overlap the portion of the first insulation film where a third recessed portion 427Aα(first peripheral recessed portion) is to be formed. The sixth semi-transmitting section 460HT4 is disposed to overlap the portion of the first insulation film where a fourth recessed portion 427Aβ (second peripheral recessed portion) is to be formed. The seventh semi-transmitting section 460HT5 is disposed to overlap the portion of the first insulation film where the fifth recessed portion 427Aγ (third peripheral recessed portion) is to be formed.

Sixth Embodiment

A sixth embodiment will be described with reference to FIGS. 26 to 36. In the sixth embodiment, the arrangement of projection portions 526 differs from that of the first embodiment. Configuration, functions, and effects similar to those of the first embodiment may not be described. The X-axis direction and the Z-axis direction correspond to the horizontal direction and the Y-axis direction corresponds to the vertical direction.

Figure 26:
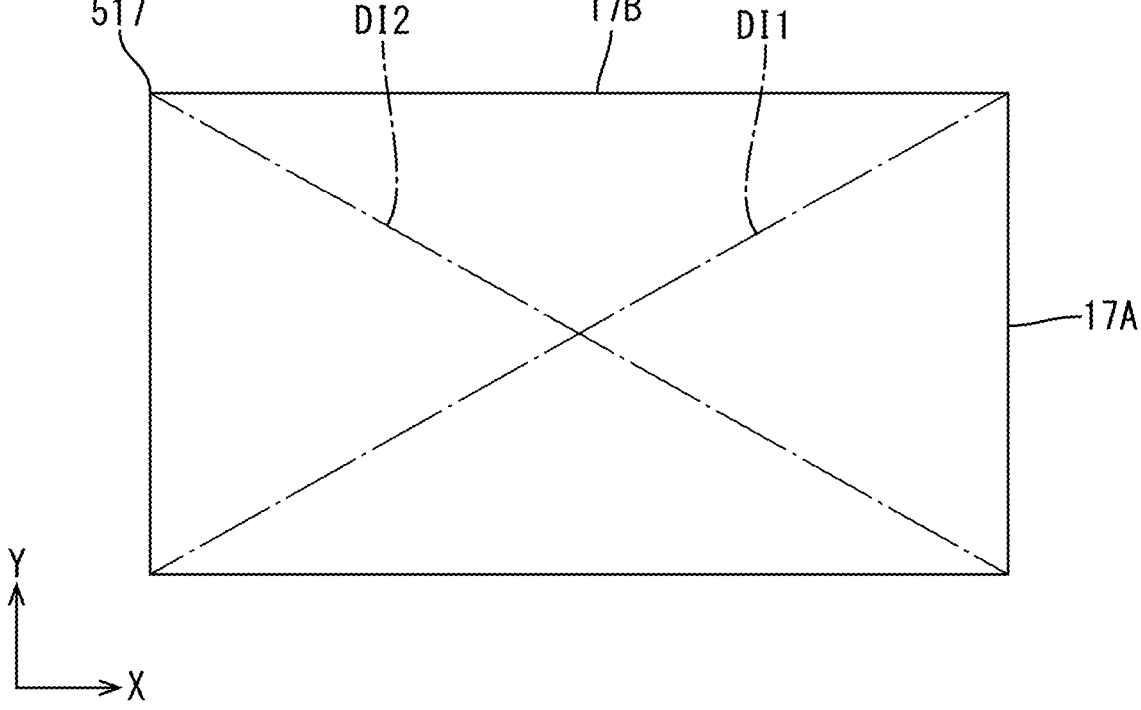
FIG. 26 is a plan view illustrating a substrate included in an array substrate according to a sixth embodiment.

As illustrated in FIG. 26, an array substrate 512 according to this embodiment includes a substrate 517 that has a laterally-elongated rectangular plan view shape. The substrate 517 has a first side 17A as a short side and a second side 17B as a long side. The first side 17A extends in the Y-axis direction, which is the vertical direction, and the second side 17B extends in the X-axis direction, which is the horizontal direction. When the liquid crystal display device 10 is used, the substrate 517 is disposed in a lateral position. The ratio of the first side 17A, which is the short side, and the second side 17B, which is the long side, in their lengths is 9:16.

Figure 27:
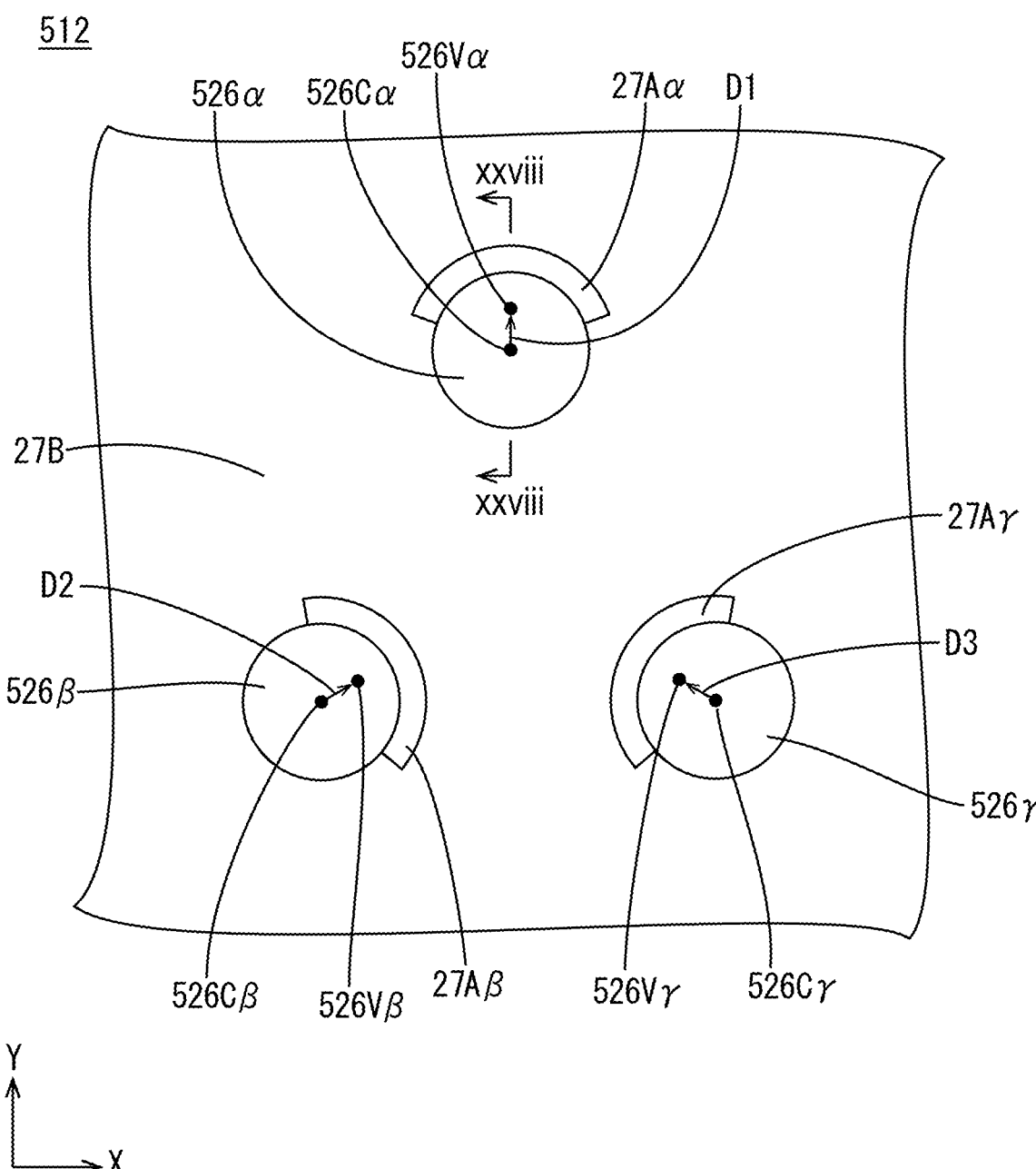
FIG. 27 is a plan view illustrating projection portions.
Figure 28:
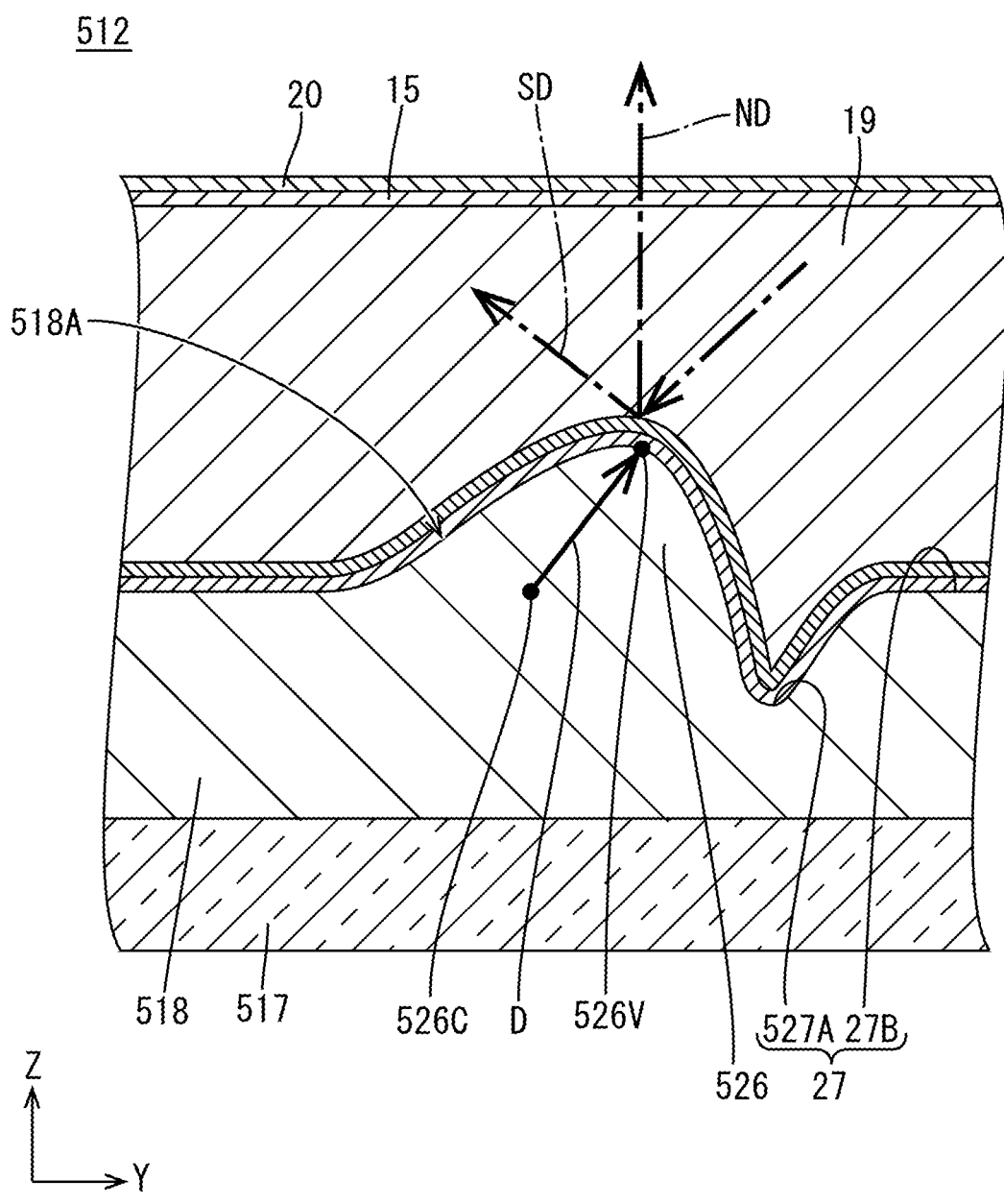
FIG. 28 is a cross-sectional view of the array substrate along line xxviii-xxviii in FIG. 27.

As illustrated in FIG. 27, the projection portions 526 are regularly arranged within the surface area of the substrate 517 of the array substrate 512. The projection portions 526 includes three projection portions 526α, 526β, 526γ that are illustrated in FIG. 27. As illustrated in FIG. 28, the directions D in which the lines extend from centers of gravity 526C of the plan view outline of the projection portions 526 toward the tops 526V, which are projecting ends, include upward vector component along the Y-axis direction or the vertical direction in a plan view (seen in the normal direction of the surface of the substrate 517). An upper side in FIG. 27 and a right side in FIG. 28 correspond to the upper direction in the vertical direction.

As illustrated in FIG. 27, the first projection portion 526α, the second projection portion 526β, and the third projection portion 526γ, which are included in the projection portions 526, are configured such that the first direction D1, in which the line extends from the first center of gravity 526Cα toward the first top 526Vα, the second direction D2, in which the line extends the second center of gravity 526Cβ toward the second top 526Vβ, and the third direction D3, in which the line extends from the third center of gravity 526Cγ toward the third top 526Vγ, include the upward vector component along the Y-axis direction or the vertical direction in a plan view.

Figure 29:
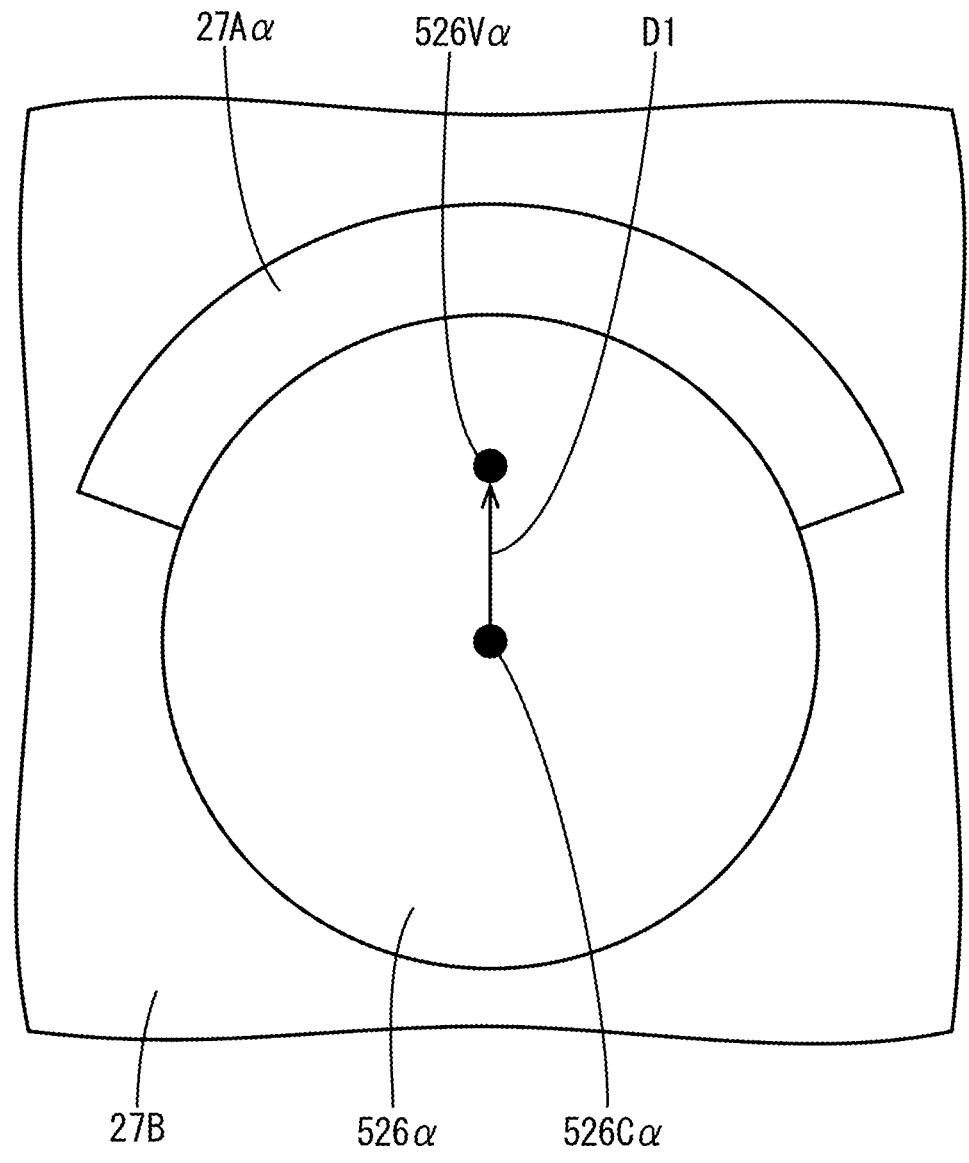
FIG. 29 is a magnified plan view of a first projection portion.
Figure 29:
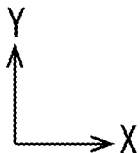
Figure 30:
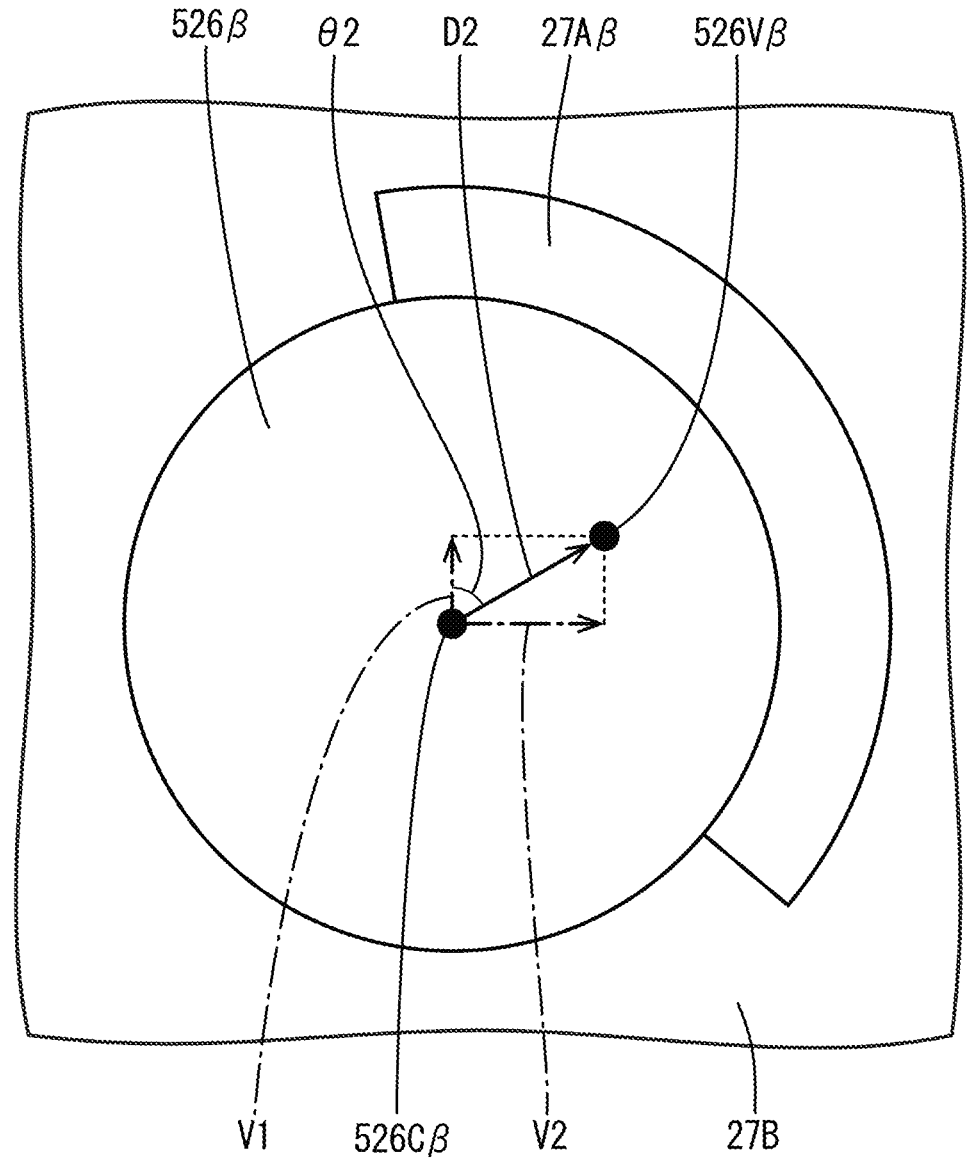
FIG. 30 is a magnified plan view of a second projection portion.
Figure 30:
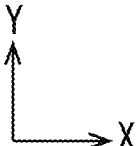
Figure 31:
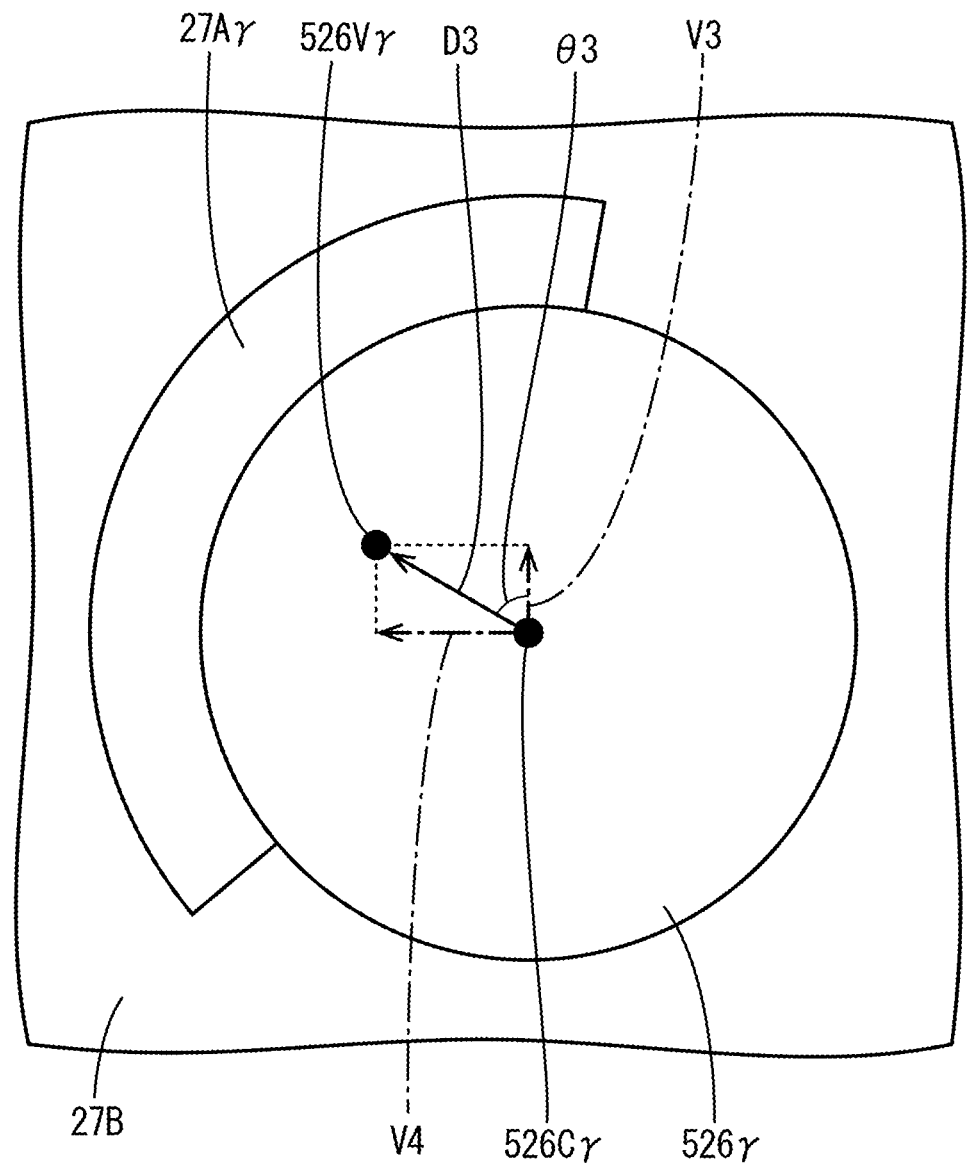
FIG. 31 is a magnified plan view of a third projection portion.
Figure 31:
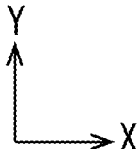

As illustrated in FIGS. 28 and 29, the first direction D1 corresponds to the upward direction with respect to the vertical direction in a plan view. Therefore, the first projection portion 526α is configured such that the first direction D1 includes only the upward vector component with respect to the vertical direction in a plan view and does not include vector component of other directions. Namely, in the first projection portion 526α, an angle θ1 of 0° is created by the first direction D1 and the upward direction with respect to the vertical direction in a plan view. As illustrated in FIG. 30, the second projection portion 526β is configured such that an angle θ2 of about 60° is created by the second direction D2 and the upward direction with respect to the vertical direction in a plan view. In the second projection portion 526β, the second direction D2 includes an upward vector component V1 with respect to the vertical direction in a plan view and a rightward vector component V2 with respect to the horizontal direction. As illustrated in FIG. 31, the third projection portion 526γ is configured such that an angle θ3 of about 60° is created by the third direction D3 and the upward direction with respect to the vertical direction in a plan view. In the third projection portion 526γ, the third direction D3 includes an upward vector component V3 with respect to the vertical direction in a plan view and a leftward vector component V4 with respect to the horizontal direction. Other projection portions 526 may be configured such that angles created by the directions in which the lines extend from the centers of gravity 526C toward the tops 526V, respectively, and the upward direction with respect to the vertical direction in a plan view are other than 0° and 60° (for example, the angles within the range of ±60° with respect to the upward direction of the vertical direction).

As illustrated in FIG. 28, a reflection film 516 has reflection anisotropy because the projection portions 526 are configured such that the directions D in which lines extend from the centers of gravity 526C toward the tops 526V are inclined with respect to the normal direction of the surface of the substrate 517. According to the reflection anisotropy, which is optical properties, of the reflection film 516, incident light with a certain direction reflects off the reflection film 516 and effectively travels in a direction ND that is closer to the normal direction of the substrate 517 than the regular reflecting direction SD.

Specifically, the incident light that travels in the opposite direction (leftward in FIG. 28) from the direction D, which is from the center of gravity 526C toward the top 526V, reflects off the reflection film 516 that is disposed on the projection portion 526 and the reflected light effectively travels in the direction ND that is closer to the normal direction of the substrate 517 than the regular reflecting direction SD. More specifically, the projection portion 526 includes a fan-shaped portion adjacent to the first recessed portion 527A in a plan view, and the fan-shaped portion is inclined at a greater angle with respect to the surface of the substrate 517 than other portions. The incident light that travels in the opposite direction from the direction D reflects off the portion of the reflection film 516 overlapping the fan-shaped portion of the projection portion 526 that is inclined at a great inclination angle. Then, the reflected light can be effectively directed to travel in the direction ND that is closer to the normal direction of the substrate 517 than the regular reflecting direction SD. The direction ND may match the normal direction of the surface of the substrate 517 but may be inclined with respect to the normal direction of the surface of the substrate 517.

Verification Experiment 1 is performed to verify the reflection anisotropy that is added to the reflection film 516 by the projection portion 526. In Verification Experiment 1, the substrate 517 having the first insulation film 518 thereon is prepared such that all the projections 526 included in the first insulation film 518 are configured such that the directions D from the centers of gravity 526C toward the tops 526V are same. Specifically, all the projections 526 are configured such that the directions D match the upward direction with respect to the vertical direction in a plan view (seen in the normal direction of the surface of the substrate 517).

In a predefined area including the projection portions 526 within the surface of the substrate 517, an uneven surface 518A of the first insulation film 518 is defined into small unit sections. Angles created by the normal directions in each of the unit sections and a reference direction in a plan view were obtained by measurement or calculation. The reference direction is one direction along the horizontal direction (for example, the rightward direction).

Figure 32:
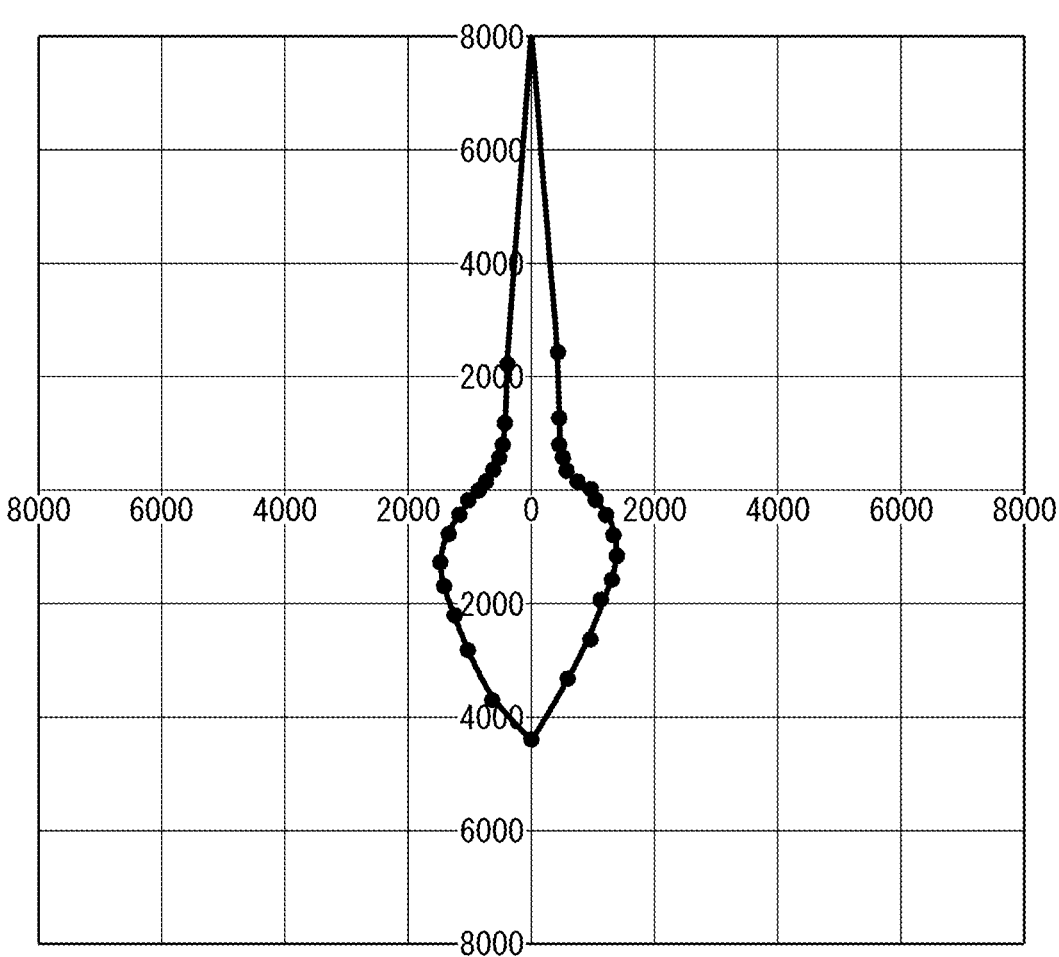
FIG. 32 illustrates polar coordinates related to verification results of Verification Experiment 1.

The experiment results of Verification Experiment 1 are described in FIG. 32. FIG. 32 illustrates polar coordinates. In the polar coordinates in FIG. 32, the radius vector represents the number of the unit sections and the argument represents an angle created by the normal direction of the unit section and the reference direction. In the polar coordinates in FIG. 32, the axis (initial line) extending rightward from the pole represents the reference direction. In the polar coordinates in FIG. 32, the axis extending upward from the pole represents the upward direction with respect to the vertical direction. In the polar coordinates in FIG. 32, the axis extending leftward from the pole represents the opposite direction from the reference direction. In the polar coordinates in FIG. 32, the axis extending downward from the pole represents the downward direction with respect to the vertical direction. The number values in FIG. 32 represent the number of the unit sections.

Verification results of Verification Experiment 1 will be described with reference to FIG. 32. The distribution related to the number of unit sections is ununiform as is obvious from FIG. 32. In the polar coordinates in FIG. 32, the number of unit sections that are near the upward axis extending from the pole is much greater than the number of unit sections that are near other three axes. Namely, each of the projection portions 526 includes the greatest number of unit sections that have normal directions that match the upward direction with respect to the vertical direction.

As previously described, all the projection portions 526 included in the first insulation film 518 on the substrate 517 of Verification Experiment 1 are configured such that the directions D of all the projection portions 526 match the upward direction with respect to the vertical direction in a plan view. Therefore, the projection portions 526 tend to include the greatest number of unit sections that have normal directions that match the direction D in a plan view. Therefore, according to Snell's law, the incident light that enters the projection portion 526 of the first insulation film 518 on the substrate 517 of Verification Experiment 1 from an upper side in the vertical direction (an opposite from the direction D in a plan view) tends to be reflected effectively by the reflection film 516, which is disposed on the projection portion 526, and travels in the direction ND that is closer to the normal direction of the substrate 517 than the regular reflecting direction SD.

Verification Experiment 2 was performed to verify how the distribution of brightness of the light rays reflected by the reflection film 516 with the directions D of the projection portions 526 being varied. In Verification Experiment 2, the substrate 517 having the first insulation film 518 of Verification Experiment 1 (all the directions D from the centers of gravity 526C toward the tops 526V are same) thereon is prepared as Comparative Example 1. In Verification Experiment 2, the substrate 517 having thereon the first insulation film 518 including the projection portions 526 that are configured such that the directions D from the centers of gravity 526C toward the tops 526V are varied within the angle range of ±90° with respect to the upward direction of the vertical direction in a plan view is prepared as Comparative Example 2. In Verification Experiment 2, the substrate 517 having thereon the first insulation film 518 including the projection portions 526 that are configured such that the directions D from the centers of gravity 526C toward the tops 526V are varied within the angle range of ±60° with respect to the upward direction of the vertical direction in a plan view is prepared as Example 1. In the description of Comparative Example 2 and Example 1, as to the symbol of "±", "+" represents one side (right side in FIG. 27) in the horizontal direction with respect to the upward direction of the vertical direction and "−" represents another side (left side in FIG. 27) in the horizontal direction with respect to the upward direction of the vertical direction.

In Comparative Example 2, the projection portions 526 at least include the projection portion 526 that is configured such that the angle of +90° is created by the direction D and the upward direction of the vertical direction and the projection portion 526 that is configured such that the angle of −90° is created between the direction D and the upward direction of the vertical direction. In Comparative Example 2, other projecting portions 526 are configured such that the angles between the directions D and the upward direction of the vertical direction are other than +90° and −90° and within ±90°. In Comparative Example 2, the inclination of the projection portions 526 are adjusted such that the average of the angles between the directions D and the upward direction of the vertical direction is about 0°.

In Example 1, the projection portions 526 at least include the projection portion 526 that is configured such that the angle of +60° is created by the direction D and the upward direction of the vertical direction and the projection portion 526 that is configured such that the angle of −60° is created by the direction D and the upward direction of the vertical direction. In Example 1, other projecting portions 526 are configured such that the angles between the directions D and the upward direction of the vertical direction are other than +60° and −60° and within ±60°. In Example 1, the inclination of the projection portions 526 are adjusted such that the average of the angles between the directions D and the upward direction of the vertical direction is about 0°.

Figure 33:
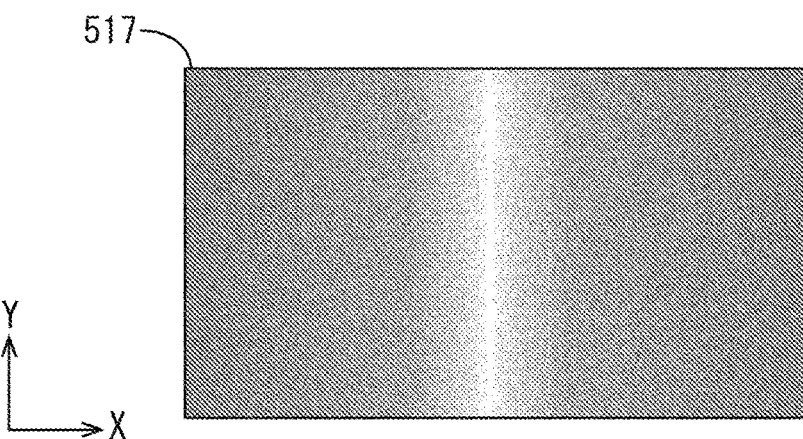
FIG. 33 illustrates a brightness distribution of reflected light within a surface area of the substrate according to Comparative Example 1 of Verification Experiment 2.
Figure 34:
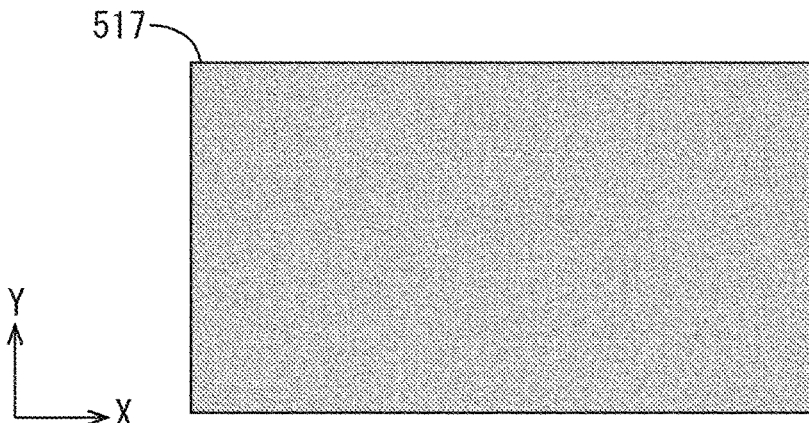
FIG. 34 illustrates a brightness distribution of reflected light within a surface area of the substrate according to Comparative Example 2 of Verification Experiment 2.
Figure 35:
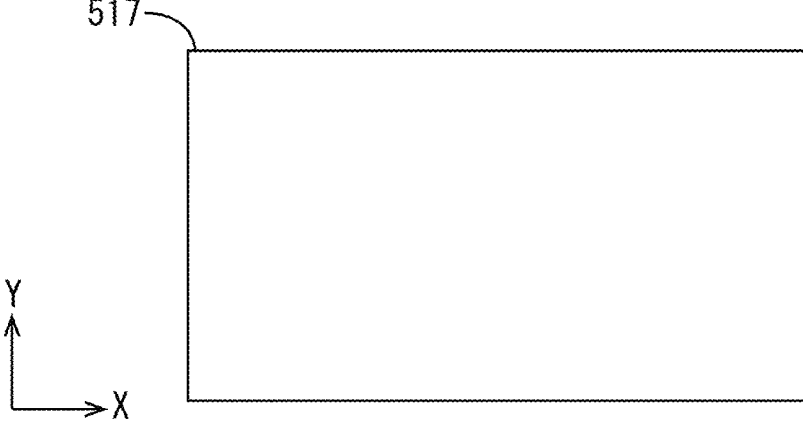
FIG. 35 illustrates a brightness distribution of reflected light within a surface area of the substrate according to Example 1 of Verification Experiment 2.

In Verification Experiment 2, a point light source is disposed corresponding to an upper middle section of each of the substrates 517 of Comparative Examples 1, 2, and Example 1. Light from the point light source reflects off the reflection film 516 on each substrate 517 and brightness of the reflected light is measured or calculated. Verification results of Verification Experiment 2 are illustrated in FIGS. 33 to 35. FIG. 33 illustrates a brightness distribution of reflected light within a surface area of the substrate 517 according to Comparative Example 1. FIG. 34 illustrates a brightness distribution of reflected light within a surface area of the substrate 517 according to Comparative Example 2. FIG. 35 illustrates a brightness distribution of reflected light within a surface area of the substrate 517 according to Example 1. In FIGS. 33 to 35, the level of brightness of the reflected light is described with gradation of the gray scale. The gradation of the gray scale becomes lighter as the brightness increases and the gradation of the gray scale becomes darker as the brightness decreases.

Experimental results of Verification Experiment 2 will be described with reference to FIGS. 33 to 35. From FIG. 33, in Comparative Example 1, brightness is high in the middle section with respect to the horizontal direction and brightness decreases from the middle section toward the two edge sections. Therefore, brightness uniformity is low. In Comparative Example 1, the directions D of all the projection portions 526 match the upward direction of the vertical direction in a plan view. Therefore, the portions of the reflection film 516 overlapping the projection portions 526 that are in the middle section with respect to the horizontal direction effectively reflect the light from the point light source; however, other sections are quite low in the reflection efficiency. This may lead to the verification results of Comparative Example 1.

From FIG. 34, in Comparative Example 2, brightness uniformity is high but brightness is low as a whole. In Comparative Example 2, the angle range (±90°) of the directions D of the projection portions 526 is greater than the angle range (±60°) of the directions D of the projection portions 526 of Example 1. Therefore, the portions of the reflection film 516 of Comparative Example 2 that overlap the projection portions 526 having extremely large absolute angle value of the directions D do not effectively reflect the light from the point light source, which is disposed corresponding to the middle section of the substrate 517 with respect to the horizontal direction, and this may decrease the brightness.

From FIG. 35, in Example 1, brightness uniformity is high and brightness is high as a whole. In Example 1, the angle range (±60°) of the directions D of the projection portions 526 is smaller than the angle range (±90°) of the directions D of the projection portions 526 of Comparative Example 2. Therefore, the entire area of the reflection film 516 of Example 1 effectively reflects the light from the point light source, which is disposed corresponding to the middle section of the substrate 517 with respect to the horizontal direction, and this achieves high brightness uniformity and high brightness.

Figure 36:
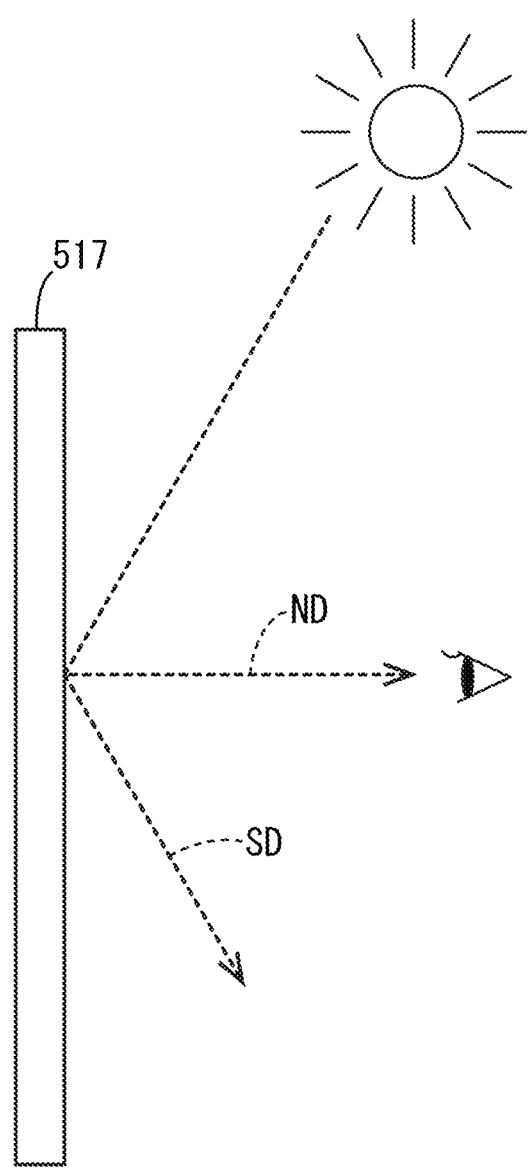
FIG. 36 is a side view of the substrate that has the first insulation film thereon and is disposed outside.
Figure 36:
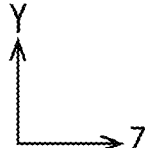

As described above, the directions D of the projection portions 526 (including the first projection portion 526α, the second projection portion 526β, and the third projection portion 526γ) of this embodiment include the upward vector component with respect to the vertical direction. Therefore, as illustrated in FIG. 36, the reflection film 516 on the projection portions 526 reflects light (such as sunlight and light from a room lamp) that is supplied to the reflection film 516 from above in the vertical direction and the reflected light effectively travels in the direction ND that is closer to the normal direction of the surface of the substrate 517 than the regular reflecting direction SD. Brightness of the reflected light is preferably increased because the sunlight and the light from a room lamp can be effectively used. In FIG. 36, the substrate 517 having the first insulation film 518 thereon is disposed outside and sunlight is used as a light source. Furthermore, with the substrate 517 having the first insulation film 518 being disposed inside, a room lamp may be used as the light source.

In this embodiment, similar to Example 1 of Verification Experiment 2, the directions D of the projection portions 526 are varied within the angle range of ±60° with respect to the upward direction of the vertical direction in a plan view. The angle range is determined based on the lengths of the first side 17A and the second side 17B of the substrate 517. Specifically, the length of the first side 17A is defined as A, the length of the second side 17B is defined as B, and the angle between the direction D and the upward direction of the vertical direction in a plan view is defined as θ. The projection portions 526 of this embodiment are configured such that the angle θ1 satisfies the following formula (2). In the formula (2), "+" and "−" are defined as previously described.

$$-\arctan(B/A) \leq \theta \leq \arctan(B/A) \qquad (2)$$

The formula (2) will be described in detail. The angle between the upward direction of the vertical direction and each of the diagonal lines DI1, DI2 of the rectangular substrate 517 is obtained by "±arctan(B/A)". The ratio of the length of the first side 17A, which is a short side, and the length of the second side 17B, which is a long side, is 9:16. Therefore, "9" is substituted in A of the formula (2) and "16" is substituted in B. Then, the angle range of the angle θ1 of the projection portions 526 is about ±60° (from −60° to +60°). The amount of light rays that are supplied to the reflection film 516 from above in the vertical direction at an angle of (along) one of the diagonal lines DI1, DI2 of the substrate 517 or at an angle (along a line) closer to the vertical direction than the diagonal lines DI1, DI2 is greater than the amount of light rays that are supplied to the reflection film 516 from above in the vertical direction at an angle (along a line) closer to the horizontal direction than the diagonal lines DI1, DI2 of the substrate 517. With the angle θ1 satisfying the formula (2), the reflection film 516 on the projection portions 526 can reflect the light rays that are supplied to the reflection film 516 from above in the vertical direction at an angle of (along) one of the diagonal lines DI1, DI2 of the substrate 517 or at an angle (along a line) closer to the vertical direction than the diagonal lines DI1, DI2 and the reflected light rays can be effectively directed to travel in the direction ND that is closer to the normal line of the surface of the substrate 517 than the regular reflecting direction SD. This improves light use efficiency and brightness of the reflected light is preferably increased.

The angles θ of some of the projection portions 526 satisfy "arctan(B/A)" and the angles θ of some of the projection portions 526 satisfy "−arctan(B/A)". Specifically, as illustrated in FIG. 30, the angle 62 of the second projection portion 526β is about 60° on the right side in FIG. 30 and satisfies "arctan(B/A)". As illustrated in FIG. 31, the angle 63 of the third projection portion 526γ is about 60° on the left side in FIG. 31 and satisfies "−arctan(B/A)". Accordingly, the reflection film 516 on the second projection portion 526β can reflect the light rays that are supplied to the reflection film 516 from above in the vertical direction at an angle of (along) the diagonal line DI' of the substrate 517 and the reflected light rays can be effectively directed to travel in the direction ND that is closer to the normal line of the surface of the substrate 517 than the regular reflecting direction SD. Similarly, the reflection film 516 on the third projection portion 526γ can reflect the light rays that are supplied to the reflection film 516 from above in the vertical direction at an angle of (along) the diagonal line DI2 of the substrate 517 and the reflected light rays can be effectively directed to travel in the direction ND that is closer to the normal line of the surface of the substrate 517 than the regular reflecting direction SD.

Therefore, for example, if the light is supplied to a upper middle section of the substrate 517, which is on an upper section with respect to the vertical direction and a middle section with respect to the horizontal direction, the supplied light can be effectively reflected by the reflection film 516 on the second projection portions 526β and the third projection portions 526γ that are disposed in the middle of the right and left sections of the substrate 517, which are on the middle with respect to the vertical direction of the end sections with respect to the horizontal direction. Accordingly, a dark portion is less likely to be created locally near the end sections of the substrate 517 with respect to the horizontal direction. Therefore, brightness of the reflection light can be uniformed within the surface area of the substrate 517.

As described above, according to this embodiment, the first projection portion 526α, the second projection portion 526β, and the third projection portion 526γ are configured such that the first direction D1, in which the line extends from the first center of gravity 526Cα toward the first top 526Vα in a plan view, the second direction D2, in which the line extends the second center of gravity 526Cβ toward the second top 526Vβ in a plan view, and the third direction D3, in which the line extends from the third center of gravity 526Cγ toward the third top 526Vγ in a plan view, include the upward vector component with respect to the vertical direction. With the first projection portion 526α, the second projection portion 526β, and the third projection portion 526γ, the reflection film 516 has reflection anisotropy. With the reflection anisotropy, incident light with a certain direction reflects off the reflection film 516 and the reflected light is effectively directed to travel in the direction ND that is closer to the normal direction of the substrate 517 than the regular reflecting direction SD.

Specifically, with the first projection portion 526α, the second projection portion 526β, and the third projection portion 526γ, the incident light that travels in the directions, which are opposite from the first direction D1, the second direction D2, the third direction D3, respectively, reflects off the reflection film 516 and is effectively directed to travel in the direction ND that is closer to the normal direction of the substrate 517 than the regular reflecting direction SD. As described above, with the first direction D1, the second direction D2, and the third direction D3 including the upward vector component with respect to the vertical direction, the reflection films 516 on the first projection portion 526α, the second projection portion 526β, and the third projection portion 526γ reflect light (such as sunlight and light from a room lamp) that is supplied to the reflection film 516 from above in the vertical direction such that the reflected light effectively travels in the direction ND that is closer to the normal direction of the surface of the substrate 517 than the regular reflecting direction SD. Brightness of the reflected light is preferably increased because the sunlight and the light from a room lamp can be effectively used.

The substrate 517 has a rectangular plan view shape and includes the first side 17A extending along the vertical direction and the second side 17B extending along the horizontal direction. The length of the first side 17A is defined as A, the length of the second side 17B is defined as B, the angle between the first direction D1 and the upward direction of the vertical direction is defined as θ1, the angle between the second direction D2 and the upward direction of the vertical direction is defined as θ2, and the angle between the third direction D3 and the upward direction of the vertical direction is defined as θ3. The first projection portion 526α, the second projection portion 526β, and the third projection portion 526γ are configured such that the angles θ1, θ2, θ3 satisfy the following formula (3).

$$-\arctan(B/A) \le \theta1, \theta2, \theta3 \le \arctan(B/A) \tag{3}$$

The angle between the upward direction of the vertical direction and each of the diagonal lines DI1, DI2 of the rectangular substrate 517 is obtained by "±arctan(B/A)". The amount of light rays that are supplied to the reflection film 516 from above in the vertical direction at an angle of (along) one of the diagonal lines DI1, DI2 of the substrate 517 or at an angle (along a line) closer to the vertical direction than the diagonal lines DI1, DI2 is greater than the amount of light rays that are supplied to the reflection film 516 from above in the vertical direction at an angle (along a line) closer to the horizontal direction than the diagonal lines DI1, DI2 of the substrate 517. With the angles 81, 82, 83 satisfying the formula (3), the reflection film 516 on the first projection portion 526α, the second projection portion 526β, and the third projection portion 526γ can reflect the light rays that are supplied to the reflection film 516 from above in the vertical direction at an angle of (along) one of the diagonal lines DI1, DI2 of the substrate 517 or at an angle (along a line) closer to the vertical direction than the diagonal lines DI1, DI2 and the reflected light rays can be effectively directed to travel in the direction ND that is closer to the normal line of the surface of the substrate 517 than the regular reflecting direction SD. This improves light use efficiency and brightness of the reflected light is preferably increased. In the formula (3), "−" represents the opposite side from "+" in the horizontal direction with respect to the upward direction of the vertical direction.

At least one of the angles 81, 82, 83 of the first projection portion 526α, the second projection portion 526β, and the third projection portion 526γ satisfies at least one of "arctan (B/A)" and "−arctan(B/A)".

Accordingly, the reflection film 516 on one of the first projection portion 526α, the second projection portion 526β, and the third projection portion 526γ can reflect the light rays that are supplied to the reflection film 516 from above in the vertical direction at an angle of (along) one of the diagonal lines DI1, DI2 of the substrate 517 and the reflected light rays can be effectively directed to travel in the direction ND that is closer to the normal direction of the surface of the substrate 517 than the regular reflecting direction SD. Therefore, for example, if the light is supplied to an upper middle section of the substrate 517, which is located on an upper section with respect to the vertical direction and a middle section with respect to the horizontal direction, the supplied light can be effectively reflected by the reflection film 516 on one of the first projection portion 526α, the second projection portions 526β, and the third projection portions 526γ that are disposed in the middle of the right and left sections of the substrate 517, which are located on the middle with respect to the vertical direction of the end sections with respect to the horizontal direction. Accordingly, a dark portion is less likely to be created locally near the end sections of the substrate 517 with respect to the horizontal direction. Therefore, brightness of the reflection light can be uniformed within the surface area of the substrate 517.

Seventh Embodiment

A seventh embodiment will be described with reference to FIGS. 37 to 40. In the seventh embodiment, the orientation of a substrate 617 differs from that of the sixth embodiment. Configuration, functions, and effects similar to those of the sixth embodiment may not be described.

Figure 37:
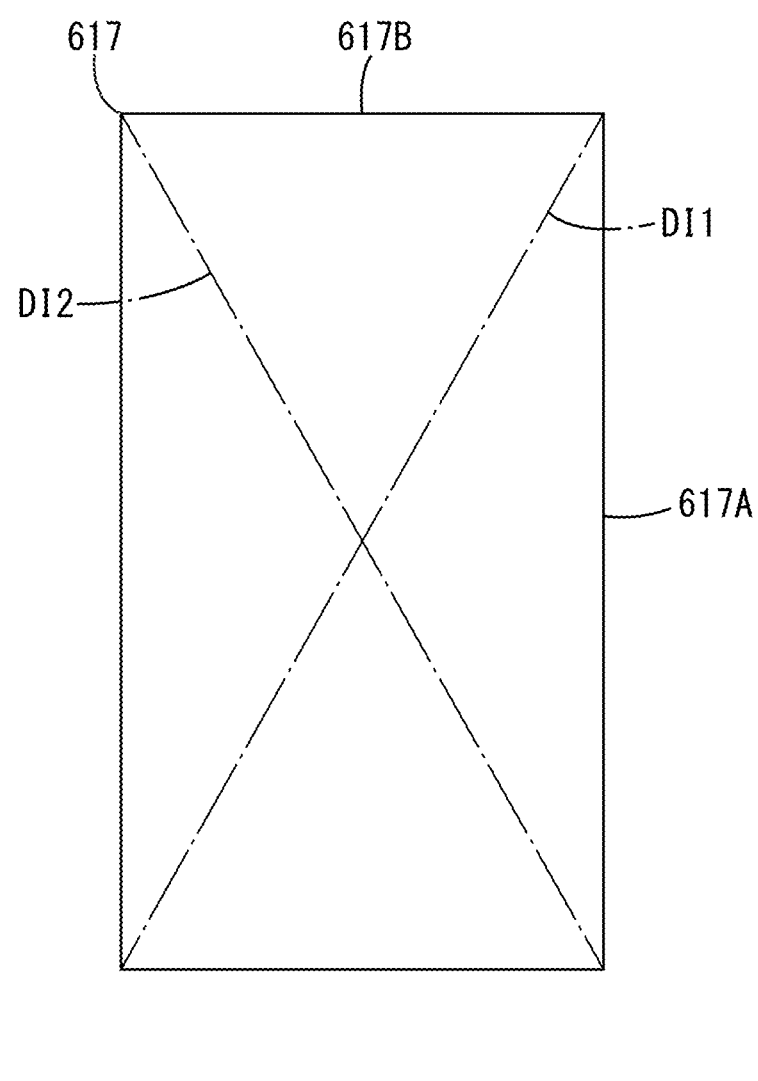
FIG. 37 is a plan view of a substrate included in an array substrate according to seventh embodiment.

As illustrated in FIG. 37, the substrate 617 has a vertically-elongated rectangular plan view shape. The substrate 617 has a first side 617A as a long side and a second side 617B as a short side. The first side 617A extends in the Y-axis direction, which is the vertical direction, and the second side 617B extends in the X-axis direction, which is the horizontal direction. The substrate 617 is disposed in a vertical position. The ratio of the first side 617A, which is the long side, and the second side 617B, which is the short side, in their lengths is 16:9.

Figure 38:
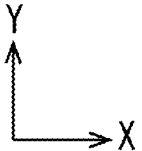
FIG. 38 is a plan view illustrating projection portions.
Figure 39:
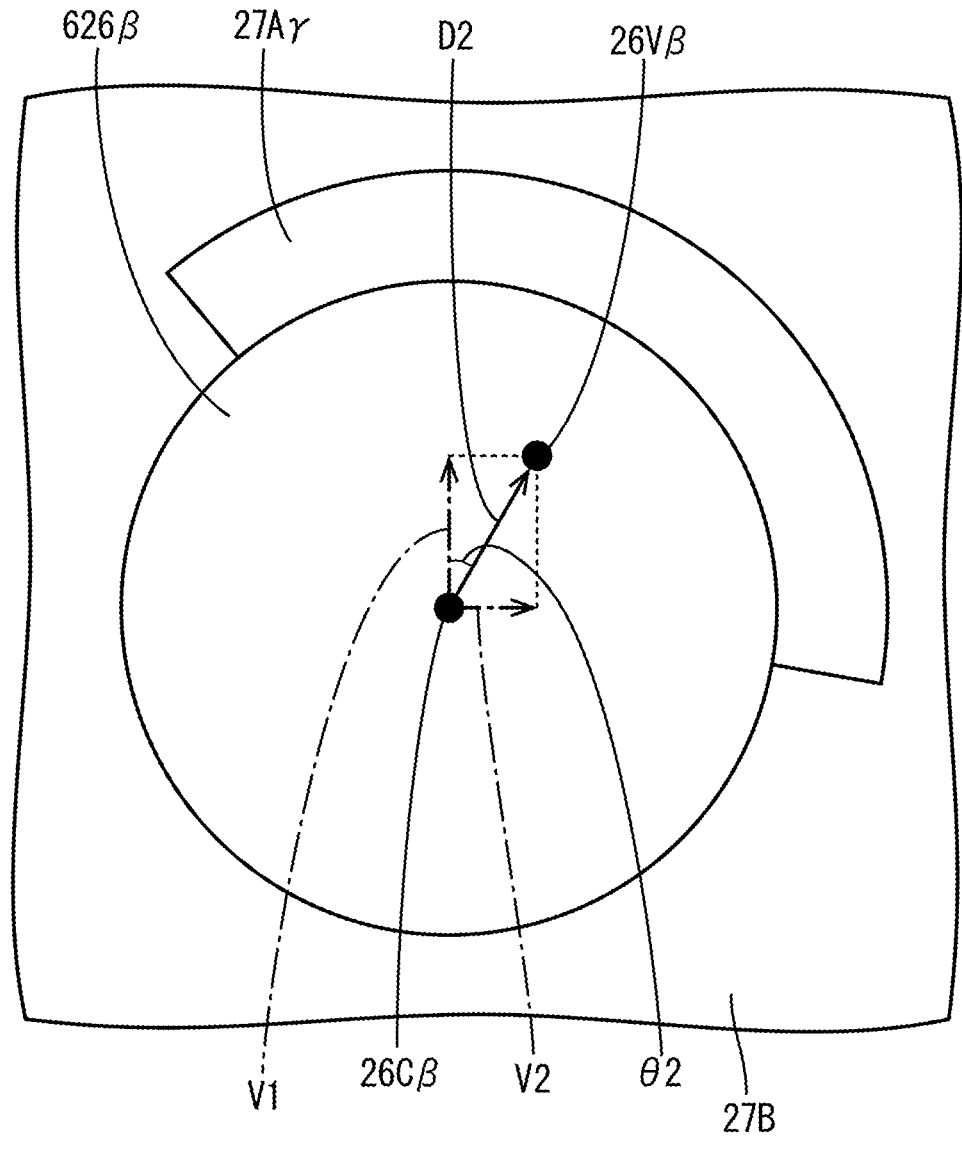
FIG. 39 is a magnified plan view of a second projection portion.
Figure 39:
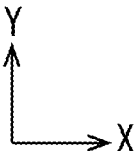
Figure 40:
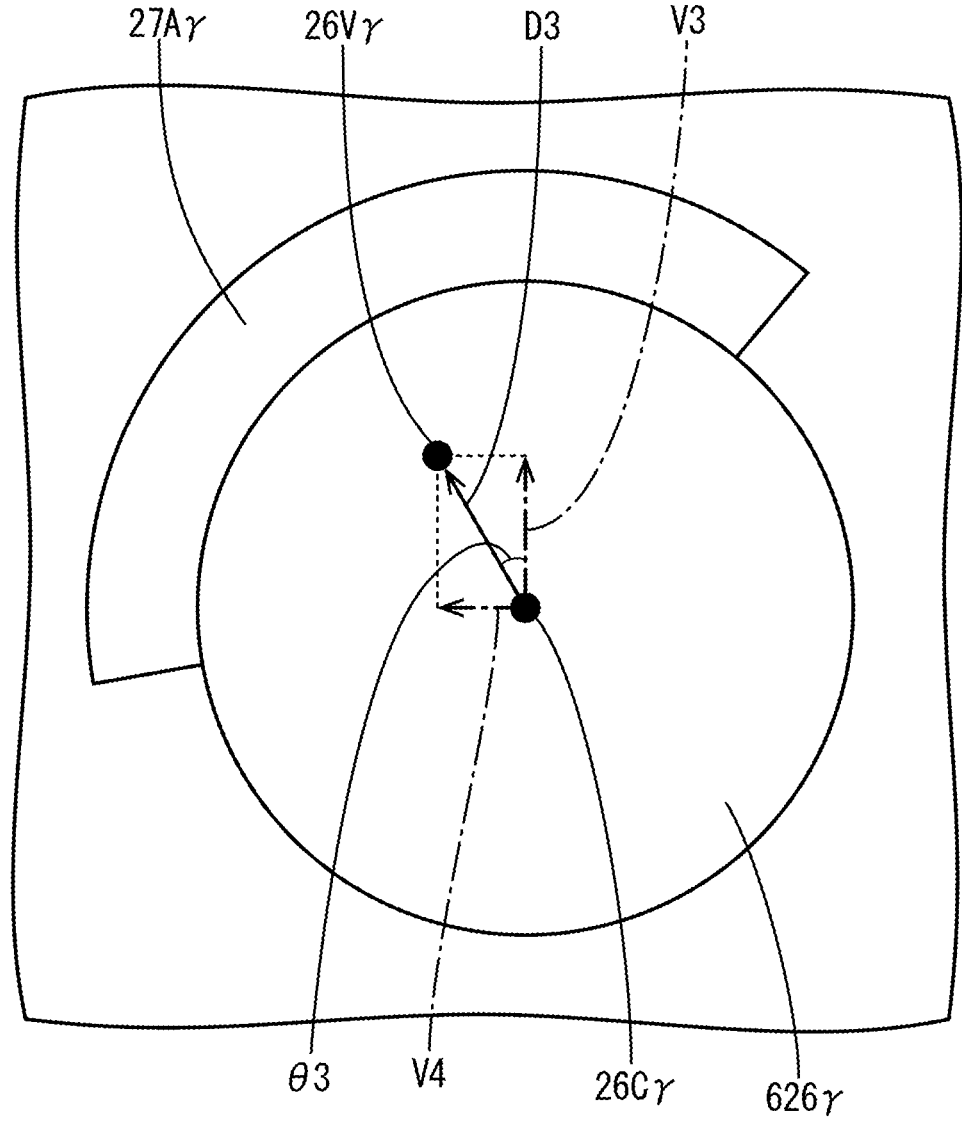
FIG. 40 is a magnified plan view of a third projection portion.
Figure 40:
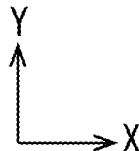

In the substrate 617 according to this embodiment, the ratio of the length of the first side 617A, which is a long side, and the length of the second side 617B, which is a short side, is 16:9. Therefore, "16" is substituted in A of the formula (2) in the sixth embodiment and "9" is substituted in B. Then, the angle range of the angle θ1 of the projection portions 626 is about ±30° (from −30° to +30°). Accordingly, as illustrated in FIG. 38, the directions D of the projection portions 626 are varied within the angle range of ±30° with respect to the upward direction of the vertical direction in a plan view. The first direction D1 of the first projection portion 626α matches the upward direction of the vertical direction. As illustrated in FIG. 39, the angle θ2 of the second projection portion 626β is about 30° on the right side in FIG. 39 and equal to the value obtained from "arctan(B/A)" of the formulae (2) and (3). As illustrated in FIG. 40, the angle θ3 of the third projection portion 626γ is about 30° on the left side in FIG. 40 and equal to the value obtained from "−arctan(B/A)" of the formulae (2) and (3). According to this embodiment, operations and effects similar to those of the sixth embodiment can be obtained.

Eighth Embodiment

An eighth embodiment will be described with reference to FIGS. 41 to 44. In the eighth embodiment, projection portions 726 having the same configuration as that of the third embodiment are arranged in the configuration of the sixth embodiment. Configuration, functions, and effects similar to those of the third embodiment and the sixth embodiment may not be described.

Figure 41:
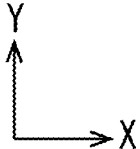
FIG. 41 is a plan view illustrating projections included in an array substrate according to an eighth embodiment.
Figure 42:
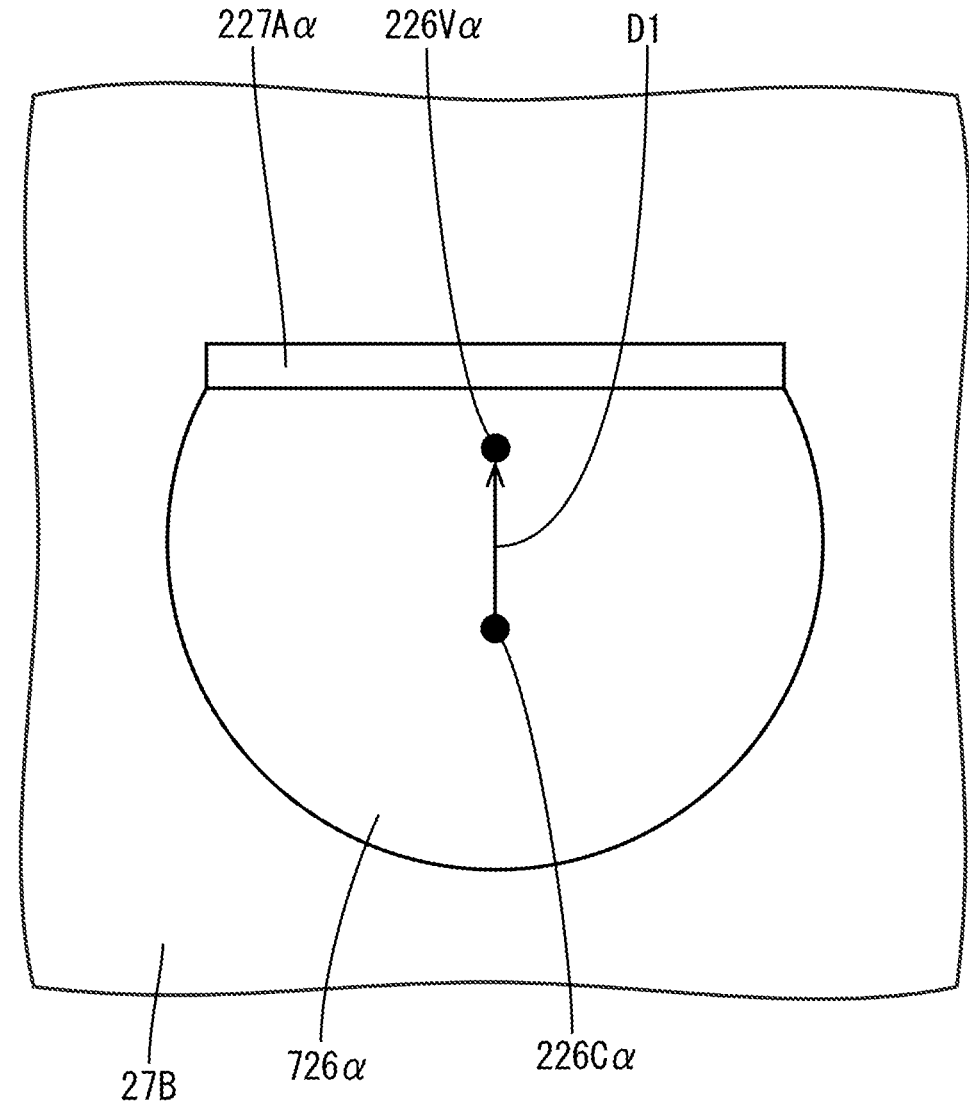
FIG. 42 is a magnified plan view of a first projection portion.
Figure 42:
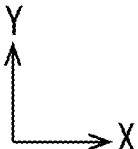
Figure 43:
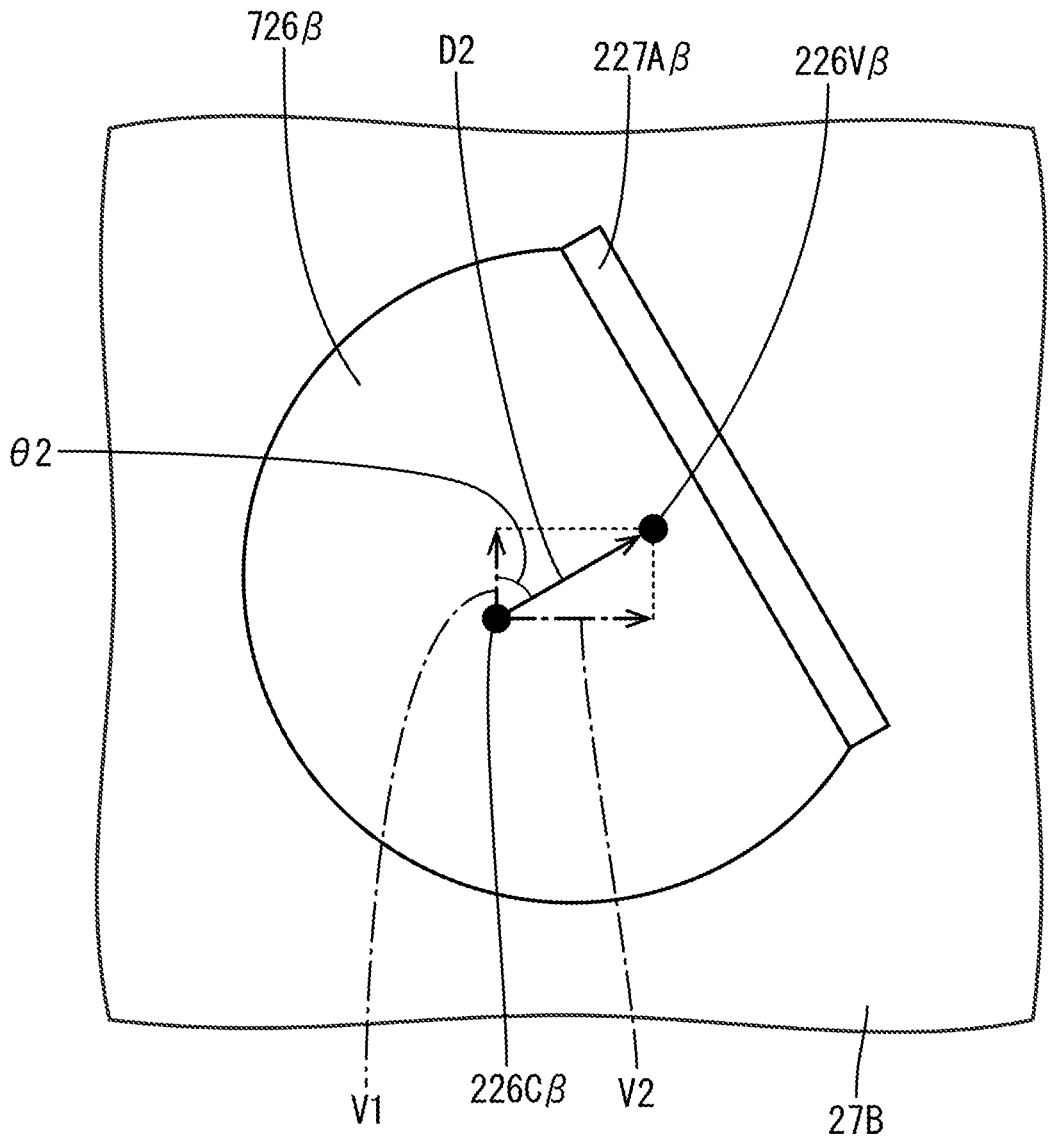
FIG. 43 is a magnified plan view of a second projection portion.
Figure 43:
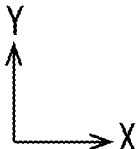
Figure 44:
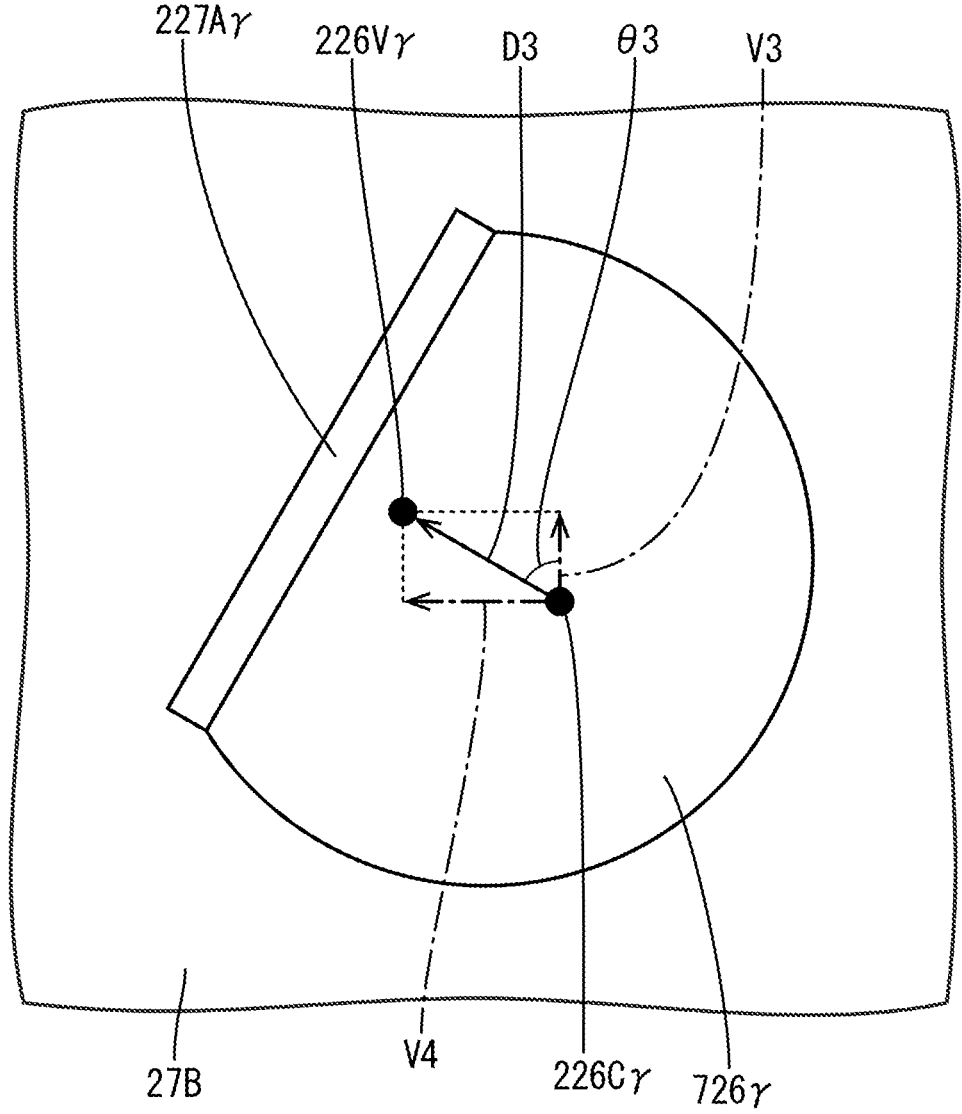
FIG. 44 is a magnified plan view of a third projection portion.
Figure 44:
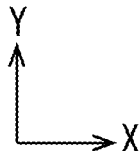

As illustrated in FIG. 41, the projection portions 726 have about a semicircular plan view shape. The plan view shape of the projection portions 726 is similar to the plan view shape of the projection portions 226 of the third embodiment (refer to FIG. 17). With such a plan view shape, the directions D of the projection portions 726 are varied within the angle range of ±60° with respect to the upward direction of the vertical direction in a plan view. The first direction D1 of a first projection portion 726α matches the upward direction of the vertical direction as illustrated in FIG. 42. As illustrated in FIG. 43, the angle θ2 of a second projection portion 7261 is about 60° on the right side in FIG. 43 and equal to a value obtained from "arctan(B/A)" of the formulae (2) and (3). As illustrated in FIG. 44, the angle θ3 of a third projection portion 726γ is about 60° on the left side in FIG. 44 and equal to a value obtained from "−arctan(B/A)" of the formulae (2) and (3). According to this embodiment, operations and effects similar to those of the third embodiment and the sixth embodiment can be obtained.

OTHER EMBODIMENTS

The technology described herein is not limited to the embodiments described above and illustrated by the drawings. For example, the following embodiments will be included in the technical scope of the present technology.

(1) The first photomask 50 of the first embodiment and the second photomask 70 of the fourth embodiment may include a single semi-transmitting film. In such a configuration, the thickness of the semi-transmitting film may be varied according to the positions within the surface area of the base 51, 71. For example, in the first photomask 50, the portions of the semi-transmitting film corresponding to the first semi-transmitting sections 50HT1 may be thinner than those corresponding to the second semi-transmitting sections 50HT2. For example, in the second photomask 70, the portions of the semi-transmitting film corresponding to the first semi-transmitting sections 50HT1 may be thicker than those corresponding to the second semi-transmitting sections 50HT2.

(2) The first insulation films 118, 218 of the second, third, and fifth embodiments may be subjected to patterning with using the first photomask 50 of the first embodiment, which is a half tone mask.

(3) The first insulation film 318 of the fourth embodiment, which are made of negative-type photosensitive resin material may be subjected to patterning with using the gray tone mask 60, 260 of the second, third, fifth embodiment.

(4) The first insulation film 118, 218 according to the second, third, fifth embodiment may be made of negative-photosensitive resin material.

(5) The cross-sectional shapes of the projection portions 26, 126, 226, 326, 426, 526, 626, 726 and the recessed portions 27, 127, 227, 327, 427 of the above embodiments may be altered as appropriate.

(6) The position relation of the center of gravity 26C, 226C, 426C, 526C and the top 26V, 126V, 326V, 526V of the projection portion 26, 126, 226, 326, 426, 526, 626, 726 according to each of the above embodiments may be altered.

(7) The specific dimensions in the diameter of the projection portions 26, 126, 226, 326, 426, 526, 626, 726 of the above embodiments, the depth of the first recessed portions 27A, 127A, 227A, 327A, 427A, 527A of the above embodiments, and the depth of the second recessed portions 27B, 327B of the above embodiments may be altered as appropriate. The specific values in the inclination angle of the projection portions 26, 126, 226, 326, 426, 526, 626, 726 of the above embodiments may be altered as appropriate. The specific values in the refractive index of the substrate 23 of the opposed substrate 13 may be altered as appropriate.

(8) The patterns of the inclination of the projection portions 26, 126, 226, 326, 426, 526, 626, 726 of the above embodiments may include four or more patterns other than the three patterns described in the above embodiments.

(9) All the projection portions 26, 126, 226, 326, 426, 526, 626, 726 of the above embodiments that are adjacent to each other at intervals may not be inclined in different directions. For example, every adjacent two of the projection portions 26, 126, 226, 326, 426, 526, 626, 726 of the above embodiments may be inclined in the same direction.

(10) The projection portions 26, 126, 226, 326, 426, 526, 626, 726 of the above embodiments may be inclined regularly.

(11) The electrically conductive layer 21 and the electrically conductive film may not be included.

(12) The second insulation film 19 and the transparent electrode film that is disposed in an upper layer than the second insulation film 19 may not be included. In such a configuration, the reflection film 16, 516 may include the plan view pattern of the pixel electrodes 15 according to the above embodiments. The reflection film 16, 516 including the pattern includes physically divided sections and each of the divided sections is connected to the backplane circuit. The sections of the reflection film 16, 516 that are connected to the backplane circuit are configured as the pixel electrodes 15.

(13) The liquid crystal panel 11 included in the liquid crystal display device 10 may not be a reflective type panel but may be a transflective type panel. With the transflective type liquid crystal panel being used, a backlight device is disposed behind the liquid crystal panel. LEDs or organic ELs are used as the light source of the backlight device. The backlight device may include an optical member including quantum dot phosphors. The quantum dot phosphors convert wavelength of primary light from the light source and emit secondary light that is good in color purity.

(14) The display device may not be the liquid crystal display device 10 but may be a transflective organic EL display device.

(15) In the configurations of the sixth to eighth embodiments, the projection portions 526, 626, 726 (the first projection portions 526α, 626α, 726α, the second projection portions 526β, 626β, 726β, the third projection portions 526γ, 626γ, 726γ) may be configured such that one of the angles θ (81, 82, 83) may match only one of "arctan(B/A)" and "−arctan(B/A)" in the formulae (2), (3) and may not match another one of "arctan(B/A)" and "−arctan(B/A)". The projection portions 526, 626, 726 (the first projection portions 526α, 626α, 726α, the second projection portions 526β, 6261, 7261, the third projection portions 526γ, 626γ, 726γ) may be configured such that one of the angles θ (θ1, θ2, θ3) may not match "arctan(B/A)" and "−arctan (B/A)" in the formulae (2), (3). In such configurations, the angles θ (θ1, θ2, θ3) may be set so as to satisfy the formulae (2), (3).

(16) In the configurations of the sixth to eight embodiments, the ratio of the first side 17A, 617A and the second side 17B, 617B of the substrate 17, 617 in length may be set as appropriate other than 9:16 and 16:9. According to the change in the ratio of the first side 17A, 617A and the second side 17B, 617B, the angle range of the angle θ between each direction D of the projection portions 526, 626, 726 and the upward direction with respect to the vertical direction in a plan view can be altered as appropriate. In changing the angle range, the angle range can be determined based on the formulae (2), (3) but may not be limited thereto.

(17) In the configurations of the sixth to eighth embodiments, the plan view shape of the substrate 517, 617 may be a square, a trapezoid, a diamond, a circle, or an ellipse other than the rectangle. According to the change in the plan view shape of the substrate 517, 617, the angle range of the angle θ1 between each direction D of the projection portions 526, 626, 726 and the upward direction with respect to the vertical direction in a plan view can be altered as appropriate. In changing the angle range, the angle range can be determined based on the formulae (2), (3) but may not be limited thereto.

(18) The configuration of each of the sixth to eighth embodiments may be combined with the configuration of each of the second, fourth, and fifth embodiments.

The invention claimed is:

1. A reflection plate comprising:

a substrate;

an insulation film disposed on the substrate and having an uneven surface; and a reflection film disposed in an upper layer above the insulation film and having a surface that conforms to the uneven surface, the reflection film reflecting light, wherein:

the insulation film includes projection portions and recesses on the uneven surface, the recesses are between the projection portions that are adjacent to each other, the projection portions are arranged at intervals, the projection portions include a first projection portion, a second projection portion that is adjacent to and spaced apart from the first projection portion, and a third projection portion that is adjacent to and spaced apart from the first projection portion, the first projection portion has a first center of gravity of a plan view outline of the first projection portion and a first top, the first center of gravity and the first top do not correspond to each other in a plan view, the second projection portion has a second center of gravity of a plan view outline of the second projection portion and a second top, the second center of gravity and the second top do not correspond to each other in the plan view, the third projection portion has a third center of gravity of a plan view outline of the third projection portion and a third top, the third center of gravity and the third top do not correspond to each other in the plan view, in the first projection portion, a line connecting the first center of gravity and the first top extends in a first direction, in the second projection portion, a line connecting the second center of gravity and the second top extends in a second direction, in the third projection portion, a line connecting the third center of gravity and the third top extends in a third direction, the first direction, the second direction, and the third direction cross each other, the recesses include first recessed portions and a second recessed portion, the first recessed portions are adjacent to the plan view outlines of the first projection portion, the second projection portion, and the third projection portion, respectively, the first recessed portions are deeper than the second recessed portion, and the first recessed portions are, respectively, closer to the first top, the second top, and the third top than the first center of gravity, the second center of gravity, and the third center of gravity are.

2. The reflection plate according to claim 1, wherein the first direction, the second direction, and the third direction include an upward vector component with respect to a vertical direction.

3. The reflection plate according to claim 2, wherein:

the substrate has a rectangular plan view shape and includes a first side that extends along the vertical direction and a second side that extends along a horizontal direction, a length of the first side is defined as A, a length of the second side is defined as B, an angle between the first direction and an upward direction, with respect to the vertical direction, is defined as $\theta 1$, an angle between the second direction and the upward direction, with respect to the vertical direction, is defined as $\theta 2$, an angle between the third direction and the upward direction, with respect to the vertical direction, is defined as $\theta 3$, and the first projection portion, the second projection portion, and the third projection portion are configured, such that the angles $\theta 1$, $\theta 2$, and $\theta 3$ satisfy the following formula:

$$-\arctan(B/A) \leq \theta 1, \theta 2, \theta 3 \leq \arctan(B/A).$$

4. The reflection plate according to claim 3, wherein at least one of the angles $\theta 1$, $\theta 2$, or $\theta 3$ is equal to a value obtained from $-\arctan (B/A)$ or $\arctan (B/A)$.

5. A display device comprising:

the reflection plate according to claim 1; and an opposed substrate that is disposed opposite the reflection plate.

6. The display device according to claim 5, further comprising:

a liquid crystal layer that is held between the reflection plate and the opposed substrate.

7. The reflection plate according to claim 6, further comprising:

a backplane circuit disposed on the substrate;

an insulation layer; and a transparent electrode disposed on the insulation layer, wherein:

the insulation film having the uneven surface covers the backplane circuit, and the insulation layer covers the reflection film.

8. The reflection plate according to claim 1, wherein a first one of the first recessed portions is adjacent to a portion of a basal portion of the first projection portion, and the basal portion has the plan view outline of the first projection portion.

9. The reflection plate according to claim 8, wherein:

the plan view outline of the first projection is circular, and the first one of the first recessed portions extends along the portion of the plan view outline of the first projection portion and has an arched plan view shape having a predefined width.

10. The reflection plate according to claim 9, wherein:

the plan view outline of the second projection and the plan view outline of the third projection are circular, a second one of the first recessed portions is adjacent to a portion of the plan view outline of the second projection portion, extends along the portion of the plan view outline of the second projection portion, and has an arched plan view shape having a predefined width, and a third one of the first recessed portions is adjacent to a portion of the plan view outline of the third projection portion, extends along the portion of the plan view outline of the third projection portion, and has an arched plan view shape having a predefined width.

11. The reflection plate according to claim 8, wherein:

a shape of the plan view outline of the first projection portion includes a first arched portion and a first straight portion that extends between two ends of the first arched portion, and the first one of the first recessed portions is adjacent to the first straight portion and has a linear plan view shape having a predefined width.

12. The reflection plate according to claim 11, wherein:

a shape of the plan view outline of the second projection portion includes a second arched portion and a second straight portion that extends between two ends of the second arched portion, a second one of the first recessed portions is adjacent to the second straight portion and has a linear plan view shape having a predefined width, a shape of the plan view outline of the third projection portion includes a third arched portion and a third straight portion that extends between two ends of the third arched portion, and a third one of the first recessed portions is adjacent to the third straight portion and has a linear plan view shape having a predefined width.

13. The reflection plate according to claim 8, wherein:

a shape of the plan view outline of the first projection portion includes two arched portions that have different curvature radiuses, and the first one of the first recessed portions is adjacent to one of the two arched portions and has an arched plan view shape having a predetermined width.

14. The reflection plate according to claim 13, wherein:

a shape of the plan view outline of the second projection portion includes two arched portions that have different curvature radiuses, a second one of the first recessed portions is adjacent to one of the two arched portions of the second projection portion and has an arched plan view shape having a predetermined width, a shape of the plan view outline of the third projection portion includes two arched portions that have different curvature radiuses, and a third one of the first recessed portions is adjacent to one of the two arched portions of the third projection portion and has an arched plan view shape having a predetermined width.

* * * * *